(12) United States Patent
Kurokawa

(10) Patent No.: US 9,900,006 B2
(45) Date of Patent: Feb. 20, 2018

(54) SEMICONDUCTOR DEVICE, COMPUTER, AND ELECTRONIC DEVICE

(71) Applicant: SEMICONDUCTOR ENERGY LABORATORY CO., LTD., Atsugi-shi, Kanagawa-ken (JP)

(72) Inventor: Yoshiyuki Kurokawa, Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 15/387,132

(22) Filed: Dec. 21, 2016

(65) Prior Publication Data
US 2017/0187379 A1  Jun. 29, 2017

(30) Foreign Application Priority Data

Dec. 29, 2015  (JP) ................................ 2015-257549
Jan. 25, 2016  (JP) ................................ 2016-011245

(51) Int. Cl.
*H03K 19/173* (2006.01)
*H01L 25/00* (2006.01)
(Continued)

(52) U.S. Cl.
CPC ..... *H03K 19/0008* (2013.01); *G06F 17/5054* (2013.01); *H03K 19/1776* (2013.01); *H03K 19/17756* (2013.01)

(58) Field of Classification Search
CPC ......... H03K 19/0008; H03K 19/17756; H03K 19/1776; G06F 9/44505; G06F 17/5054
(Continued)

(56) References Cited

U.S. PATENT DOCUMENTS 5,731,856 A  3/1998  Kim et al.
5,744,864 A  4/1998  Cillessen et al.
(Continued)

FOREIGN PATENT DOCUMENTS

EP  1737044 A  12/2006
EP  2226847 A  9/2010
(Continued)

OTHER PUBLICATIONS

Baumann.R, "Radiation-Induced Soft Errors in Advanced Semiconductor Technologies", IEEE Transactions on Device and Materials Reliability, Sep. 1, 2005, vol. 5, No. 3, pp. 305-316.
(Continued)

*Primary Examiner* — Daniel D Chang
(74) *Attorney, Agent, or Firm* — Nixon Peabody LLP; Jeffrey L. Costellia

(57) ABSTRACT

A novel semiconductor device, a semiconductor device having a high computing performance, a semiconductor device capable of reducing power consumption, or a semiconductor device with a small area can be provided. The semiconductor device includes a CPU and a PLD, and an operation of the PLD is controlled by the CPU. Thus, the CPU executes processing which requires a complicated computation, a small amount of data processing, or the like by itself, and makes the PLD process a computation which requires a large amount of data processing, a computation which requires quick processing, or the like. In this way, the load of processing in the CPU is reduced and the frequency of access to a memory is reduced; accordingly, the operation speed and power efficiency of the semiconductor device is increased.

13 Claims, 37 Drawing Sheets

(51) Int. Cl.
*H03K 19/00* (2006.01)
*H03K 19/177* (2006.01)
*G06F 17/50* (2006.01)

(58) Field of Classification Search
USPC .................................. 326/38, 40, 41, 46, 47
See application file for complete search history.

(56) References Cited

U.S. PATENT DOCUMENTS

| | | |
|---|---|---|
| 6,172,521 B1 | 1/2001 | Motomura |
| 6,294,274 B1 | 9/2001 | Kawazoe et al. |
| 6,563,174 B2 | 5/2003 | Kawasaki et al. |
| 6,727,522 B1 | 4/2004 | Kawasaki et al. |
| 7,047,352 B1 * | 5/2006 | Khu ................ H03K 19/17772 |
| | | 711/103 |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,674,650 B2 | 3/2010 | Akimoto et al. |
| 7,732,819 B2 | 6/2010 | Akimoto et al. |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0097499 A1 * | 5/2005 | Sun .................... G06F 15/7867 |
| | | 326/38 |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2014/0159771 A1 | 6/2014 | Ikeda et al. |
| 2016/0380635 A1 * | 12/2016 | Roberts .............. H03K 19/0008 |
| | | 326/38 |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-265818 A | 11/1988 |
| JP | 05-251705 A | 9/1993 |
| JP | 08-264794 A | 10/1996 |
| JP | 63-239117 A | 10/1998 |
| JP | 11-505377 | 5/1999 |
| JP | 2000-044236 A | 2/2000 |
| JP | 2000-150900 A | 5/2000 |
| JP | 3106998 | 11/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| WO | WO-2004/114391 | 12/2004 |

OTHER PUBLICATIONS

Fortunato.E et al., "Wide-Bandgap High-Mobility ZnO Thin-Film Transistors Produced at Room Temperature,", Appl. Phys. Lett. (Applied Physics Letters) , Sep. 27, 2004, vol. 85, No. 13, pp. 2541-2543.

Dembo.H et al., "RFCPUS on Glass and Plastic Substrates Fabricated by TFT Transfer Technology,", IEDM 05: Technical Digest of International Electron Devices Meeting, Dec. 5, 2005, pp. 1067-1069.

Ikeda.T et al., "Full-Functional System Liquid Crystal Display Using Cg-Silicon Technology,", SID Digest '04 : SID International Symposium Digest of Technical Papers, 2004, vol. 35, pp. 860-963.

(56) References Cited

OTHER PUBLICATIONS

Nomura.K et al., "Room-Temperature Fabrication of Transparent Flexible Thin-Film Transistors Using Amorphous Oxide Semiconductors,", Nature, Nov. 25, 2004, vol. 432, pp. 488-492.
Park.J et al., "Improvements in the Device Characteristics of Amorphous Indium Gallium Zinc Oxide Thin-Film Transistors by Ar Plasma Treatment,", Appl. Phys. Lett. (Applied Physics Letters), Jun. 26, 2007, vol. 90, No. 26, pp. 262106-1-262106-3.
Takahashi.M et al., "Theoretical Analysis of IGZO Transparent Amorphous Oxide Semiconductor,", IDW '08 : Proceedings of the 15th International Display Workshops, Dec. 3, 2008, pp. 1637-1640.
Hayashi.R et al., "42.1: Invited Paper: Improved Amorphous In—Ga—Zn—O TFTs,", SID Digest '08 : SID International Symposium Digest of Technical Papers, May 20, 2008, vol. 39, pp. 621-624.
Prins.M et al., "A Ferroelectric Transparent Thin-Film Transistor,", Appl. Phys. Lett. (Applied Physics Letters), Jun. 17, 1996, vol. 68, No. 25, pp. 3650-3652.
Nakamura.M et al., "The phase relation in the In2O3—Ga2ZnO4—ZnO system at 1350° C.,", Journal of Solid State Chemistry, Aug. 1, 1991, vol. 93, No. 2, pp. 298-315.
Kimizuka.N et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System,", Journal of Solid State Chemistry, Apr. 1, 1995, vol. 116, No. 1, pp. 170-178.
Nomura.K et al., "Thin-Film Transistor Fabricated in Single-Crystalline Transparent Oxide Semiconductor,", Science, May 23, 2003, vol. 300, No. 5623, pp. 1269-1272.
Masuda.S et al., "Transparent thin film transistors using ZnO as an active channel layer and their electrical properties,", J. Appl. Phys. (Journal of Applied Physics), Feb. 1, 2003, vol. 93, No. 3, pp. 1624-1630.
Asakuma.N. et al., "Crystallization and Reduction of Sol-Gel-Derived Zinc Oxide Films by Irradiation with Ultraviolet Lamp,", Journal of Sol-Gel Science and Technology, 2003, vol. 26, pp. 181-184.
Osada.T et al., "15.2: Development of Driver-Integrated Panel using Amorphous In—Ga—Zn-Oxide TFT,", SID Digest '09 : SID International Symposium Digest of Technical Papers, May 31, 2009, pp. 184-187.
Nomura.K et al., "Carrier transport in transparent oxide semiconductor with intrinsic structural randomness probed using single-crystalline InGaO3(ZnO)5 films,", Appl. Phys. Lett. (Applied Physics Letters), Sep. 13, 2004, vol. 85, No. 11, pp. 1993-1995.
Li.C et al., "Modulated Structures of Homologous Compounds InMO3(ZnO)m (M=In,Ga; m=Integer) Described by Four-Dimensional Superspace Group,", Journal of Solid State Chemistry, 1998, vol. 139, pp. 347-355.
Son.K et al., "42.4L: Late-News Paper: 4 Inch QVGA AMOLED Driven by the Threshold Voltage Controlled Amorphous GIZO (Ga2O3—In2O3—ZnO) TFT,", SID Digest '08 : SID International Symposium Digest of Technical Papers, May 20, 2008, vol. 39, pp. 633-636.
Lee.J et al., "World's Largest (15-Inch) XGA AMLCD Panel Using IGZO Oxide TFT,", SID Digest '08 : SID International Symposium Digest of Technical Papers, May 20, 2008, vol. 39, pp. 625-628.
Nowatari.H et al., "60.2: Intermediate Connector With Suppressed Voltage Loss for White Tandem OLEDs,", SID Digest '09 : SID International Symposium Digest of Technical Papers, May 31, 2009, vol. 40, pp. 899-902.
Kanno.H et al., "White Stacked Electrophosphorecent Organic Light-Emitting Devices Employing MOO3 as a Charge-Generation Layer,", Adv. Mater. (Advanced Materials), 2006, vol. 18, No. 3, pp. 339-342.
Tsuda.K et al., "Ultra Low Power Consumption Technologies for Mobile TFT-LCDs ,", IDW '02 : Proceedings of the 9th International Display Workshops, Dec. 4, 2002, pp. 295-298.
Van de Walle.C, "Hydrogen as a Cause of Doping in Zinc Oxide,", Phys. Rev. Lett. (Physical Review Letters), Jul. 31, 2000, vol. 85, No. 5, pp. 1012-1015.

Fung.T et al., "2-D Numerical Simulation of High Performance Amorphous In—Ga—Zn—O TFTs for Flat Panel Displays,", AM-FPD '08 Digest of Technical Papers, Jul. 2, 2008, pp. 251-252, The Japan Society of Applied Physics.
Jeong.J et al., "3.1: Distinguished Paper: 12,1-Inch WXGA AMOLED Display Driven by Indium-Gallium-Zinc Oxide TFTs Array,", SID Digest '08 : SID International Symposium Digest of Technical Papers, May 20, 2008, vol. 39, No. 1, pp. 1-4.
Park.J et al., "High performance amorphous oxide thin film transistors with self-aligned top-gate structure,", IEDM 09: Technical Digest of International Electron Devices Meeting, Dec. 7, 2009, pp. 191-194.
Kurokawa.Y et al., "UHF RFCPUS on Flexible and Glass Substrates for Secure RFID Systems,", Journal of Solid-State Circuits, 2008, vol. 43, No. 1, pp. 292-299.
Ohara.H et al., "Amorphous In—Ga—Zn-Oxide TFTs with Suppressed Variation for 4.0 inch QVGA AMOLED Display,", AM-FPD '09 Digest of Technical Papers, Jul. 1, 2009, pp. 227-230, The Japan Society of Applied Physics.
Coates.D et al., "Optical Studies of the Amorphous Liquid-Cholesteric Liquid Crystal Transition:The "Blue Phase", ", Physics Letters, Sep. 10, 1973, vol. 45A, No. 2, pp. 115-116.
Cho.D et al., "21.2:Al and Sn-Doped Zinc Indium Oxide Thin Film Transistors for AMOLED Back-Plane,", SID Digest '09 : SID International Symposium Digest of Technical Papers, May 31, 2009, pp. 280-283.
Lee.M et al., "15.4:Excellent Performance of Indium-Oxide-Based Thin-Film Transistors by DC Sputtering,", SID Digest '09 : SID International Symposium Digest of Technical Papers, May 31, 2009, pp. 191-193.
Jin.D et al., "65.2:Distinguished Paper:World-Largest (6.5") Flexible Full Color Top Emission AMOLED Display on Plastic Film and Its Bending Properties,", SID Digest '09 : SID International Symposium of Technical Papers, May 31, 2009, pp. 983-985.
Sakata.J et al., "Development of 4.0-In. AMOLED Display With Driver Circuit Using Amorphous In—Ga—Zn-Oxide TFTs,", IDW '09 : Proceedings of the 16th International Display Workshops, 2009, pp. 689-692.
Park.J et al., "Amorphous Indium-Gallium-Zinc Oxide TFTs and Their Application for Large Size AMOLED,", AM-FPD '08 Digest of Technical Papers, Jul. 2, 2008, pp. 275-278.
Park.S et al., "Challenge to Future Displays: Transparent AM-OLED Driven by Peald Grown ZnO TFT,", IMID '07 Digest, 2007, pp. 1249-1252.
Godo.H et al., "Temperature Dependence of Characteristics and Electronic Structure for Amorphous In—Ga—Zn-Oxide TFT,", AM-FPD '09 Digest of Technical Papers, Jul. 1, 2009, pp. 41-44.
Osada.T et al., "Development of Driver-Integrated Panel Using Amorphous In—Ga—Zn-Oxide TFT,", AM-FPD '09 Digest of Technical Papers, Jul. 1, 2009, pp. 33-36.
Hirao.T et al., "Novel Top-Gate Zinc Oxide Thin-Film Tansistors (ZnO TFTs) for AMLCDS,", Journal of the SID, 2007, vol. 15, No. 1, pp. 17-22.
Hosono.H, "68.3: Invited Paper: Transparent Amorphous Oxide Semiconductors for High Performance TFT,", SID Digest '07 : SID International Symposium Digest of Technical Papers, 2007, vol. 38, pp. 1830-1833.
Godo.H et al., "P-9: Numerical Analysis on Temperature Dependence of Characteristics of Amorphous In—Ga—Zn-Oxide TFT,", SID Digest '09 : SID International Symposium Digest of Technical Papers, May 31, 2009, pp. 1110-1112.
Ohara.H et al., "21.3:4.0 In. QVGA AMOLED Display Using In—Ga—Zn-Oxide TFTs with a Novel Passivation Layer,", SID Digest '09 : SID International Symposium Digest of Technical Papers, May 31, 2009, pp. 284-287.
Miyasaka.M, "Suftla Flexible Microelectronics on Their Way to Business,", SID Digest '07 : SID International Symposium Digest of Technical Papers, 2007, vol. 38, pp. 1673-1676.
Chern.H et al., "An Analytical Model for the Above-Threshhold Characteristics of Polysilicon Thin-Film Transistors,", IEEE Transactions on Electron Devices, Jul. 1, 1995, vol. 42, No. 7, pp. 1240-1246.

(56) References Cited

OTHER PUBLICATIONS

Kikuchi.H et al., "39.1:Invited Paper:Optically Isotropic Nano-Structured Liquid Crystal Composites for Display Applications,", SID Digest '09 : SID International Symposium Digest of Technical Papers, May 31, 2009, pp. 578-581.

Asaoka.Y et al., "29.1: Polarizer-Free Reflective LCD Combined With Ultra Low-Power Driving Technology,", SID Digest '09 : SID International Symposium Digest of Technical Papers, May 31, 2009, pp. 395-398.

Lee.H et al., "Current Status of, Challenges to, and Perspective View of AM-OLED ,", IDW '06 : Proceedings of the 13th International Display Workshops, Dec. 7, 2006, pp. 663-666.

Kikuchi.H et al., "62.2: Invited Paper: Fast Electro-Optical Switching in Polymer-Stabilized Liquid Crystalline Blue Phases for Display Application,", SID Digest '07 : SID International Symposium Digest of Technical Papers, 2007, vol. 38, pp. 1737-1740.

Nakamura.M, "Synthesis of Homologous Compound with New Long-Period Structure,", NIRIM Newsletter, Mar. 1, 1995, vol. 150, pp. 1-4.

Kikuchi.H et al., "Polymer-Stabilized Liquid Crystal Blue Phases,", Nature Materials, Sep. 2, 2002, vol. 1, pp. 64-68.

Kimizuka.N et al., "Spinel, YbFe2O4, and Yb2Fe3O7 Types of Structures for Compounds in the In2O3 and Sc2O3—A2O3—BO Systems [A; Fe, Ga, or Al; B: Mg, Mn, Fe, Ni, Cu,or Zn] at Temperatures Over 1000° C.,", Journal of Solid State Chemistry, 1985, vol. 60, pp. 382-384.

Kitzerow.H et al., "Observation of Blue Phases in Chiral Networks,", Liquid Crystals, 1993, vol. 14, No. 3, pp. 911-916.

Costello.M et al., "Electron Microscopy of a Cholesteric Liquid Crystal and Its Blue Phase,", Phys. Rev. A (Physical Review. A), May 1, 1984, vol. 29, No. 5, pp. 2957-2959.

Meiboom.S et al., "Theory of the Blue Phase of Cholesteric Liquid Crystals,", Phys. Rev. Lett. (Physical Review Letters), May 4, 1981, vol. 46, No. 18, pp. 1216-1219.

Park.Sang-Hee et al., "42.3: Transparent ZnO Thin Film Transistor for the Application of High Aperture Ratio Bottom Emission AM-OLED Display,", SID Digest '08 : SID International Symposium Digest of Technical Papers, May 20, 2008, vol. 39, pp. 629-632.

Orita.M et al., "Mechanism of Electrical Conductivity of Transparent InGaZnO4,", Phys. Rev. B (Physical Review. B), Jan. 15, 2000, vol. 61, No. 3, pp. 1811-1816.

Nomura.K et al., "Amorphous Oxide Semiconductors for High-Performance Flexible Thin-Film Transistors,", Jpn. J. Appl. Phys. (Japanese Journal of Applied Physics) , 2006, vol. 45, No. 5B, pp. 4303-4308.

Janotti.A et al., "Native Point Defects in ZnO,", Phys. Rev. B (Physical Review. B), Oct. 4, 2007, vol. 76, No. 16, pp. 165202-1-165202-22.

Park.J et al., "Electronic Transport Properties of Amorphous Indium-Gallium-Zinc Oxide Semiconductor Upon Exposure to Water,", Appl. Phys. Lett. (Applied Physics Letters) , 2008, vol. 92, pp. 072104-1-072104-3.

Hsieh.H et al., "P-29:Modeling of Amorphous Oxide Semiconductor Thin Film Transistors and Subgap Density of States,", SID Digest '08 : SID International Symposium Digest of Technical Papers, 2008, vol. 39, pp. 1277-1280.

Janotti.A et al., "Oxygen Vacancies in ZnO,", Appl. Phys. Lett. (Applied Physics Letters) , 2005, vol. 87, pp. 122102-1-122102-3.

Oba.F et al., "Defect energetics in ZnO: A hybrid Hartree-Fock density functional study,", Phys. Rev. B (Physical Review. B), 2008, vol. 77, pp. 245202-1-245202-6.

Orita.M et al., "Amorphous transparent conductive oxide InGaO3(ZnO)m (m <4):a Zn4s conductor,", Philosophical Magazine, 2001, vol. 81, No. 5, pp. 501-515.

Hosono.H et al., "Working hypothesis to explore novel wide band gap electrically conducting amorphous oxides and examples,", J. Non-Cryst. Solids (Journal of Non-Crystalline Solids), 1996, vol. 198-200, pp. 165-169.

Mo.Y et al., "Amorphous Oxide TFT Backplanes for Large Size AMOLED Displays,", IDW '08 : Proceedings of the 6th International Display Workshops, Dec. 3, 2008, pp. 581-584.

Kim.S. et al., "High-Performance oxide thin film transistors passivated by various gas plasmas,", 214th ECS Meeting, 2008, No. 2317, ECS.

Clark.S et al., "First Principles Methods Using CASTEP,", Zeitschrift fur Kristallographie, 2005, vol. 220, pp. 567-570.

Lany.S et al., "Dopability, Intrinsic Conductivity, and Nonstoichiometry of Transparent Conduction Oxides,", Phys. Rev. Lett. (Physical Review Letters), Jan. 26, 2007, vol. 98, pp. 045501-1-045501-4.

Park.K et al., "Dry etching of ZnO films and plasma-induced damage to optical properties,", J. Vac. Sci. Technol. B (Journal of Vacuum Science & Technology B), Mar. 1, 2003, vol. 21, No. 2, pp. 800-803.

Oh.M et al., "Improving the Gate Stability of ZnO Thin-Film Transistors With Aluminum Oxide Dielectric Layers,", J. Electrochem. Soc. (Journal of the Electrochemical Society), 2008, vol. 155, No. 12, pp. H1009-H1014.

Ueno.K et al., "Field-Effect Transistor on SrTiO3 with Sputtered Al2O3 Gate Insulator,", Appl. Phys. Lett. (Applied Physics Letters) , Sep. 1, 2003, vol. 83. No. 9, pp. 1755-1757.

* cited by examiner

FIG. 19A
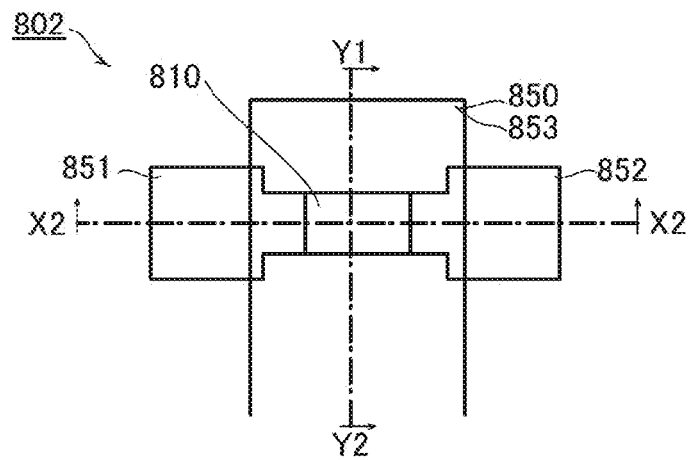
FIG. 19B
FIG. 19C
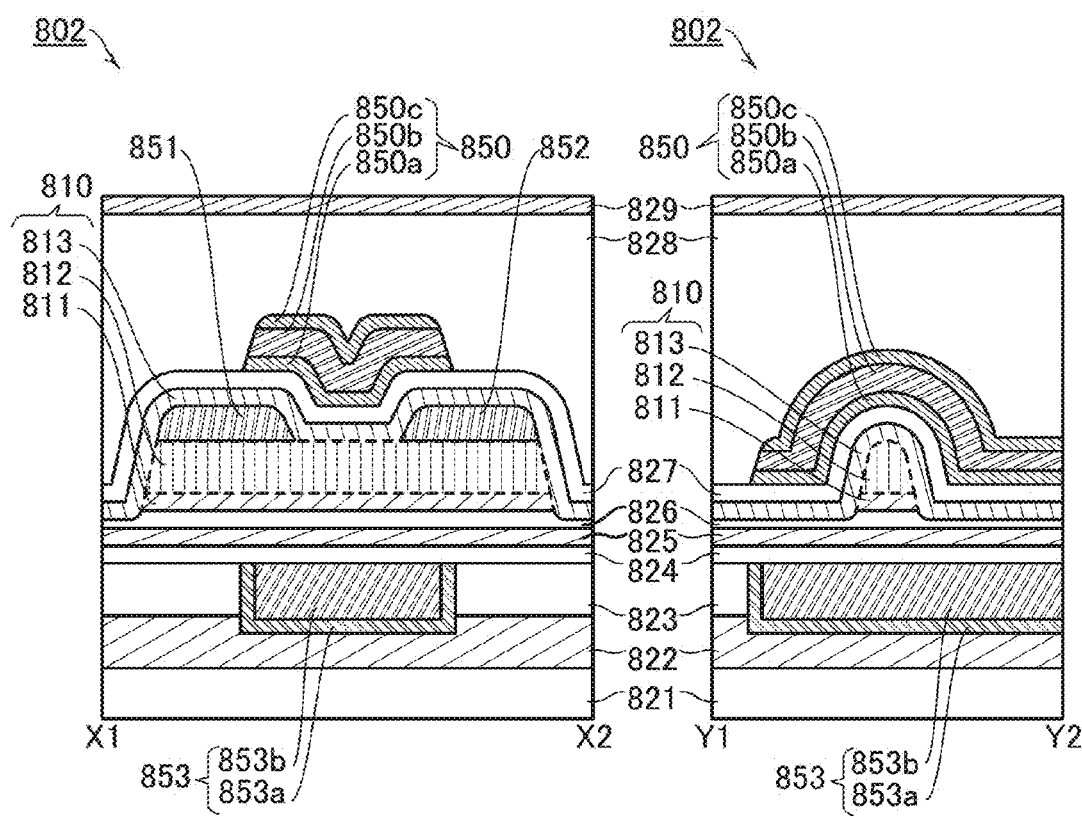

FIG. 21A
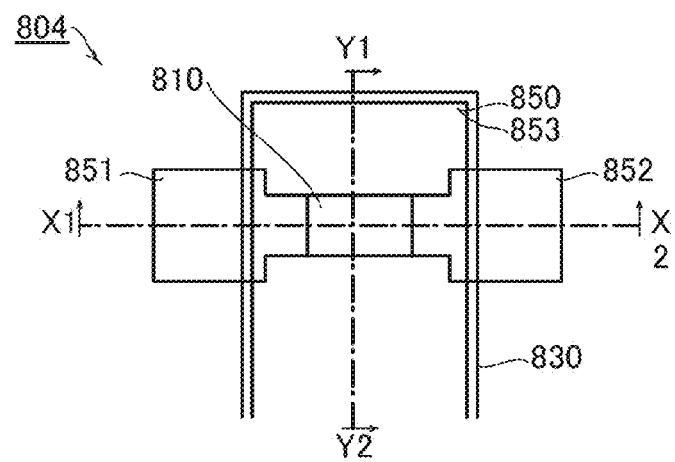
FIG. 21B
FIG. 21C
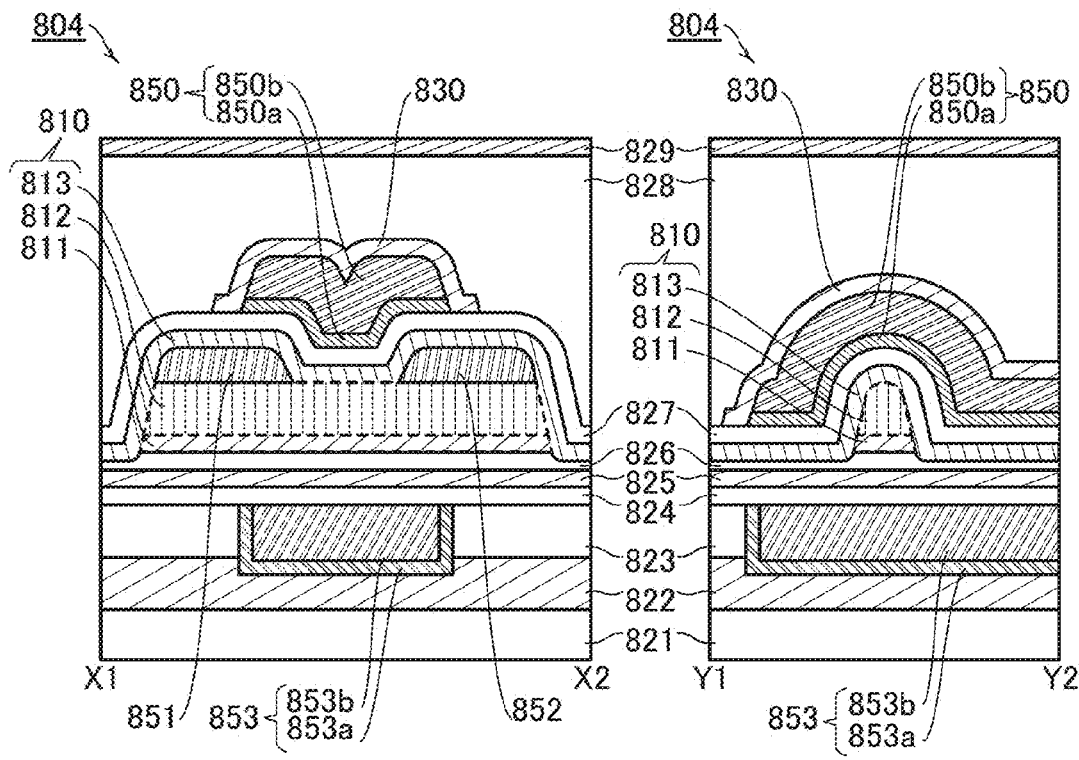

FIG. 22A
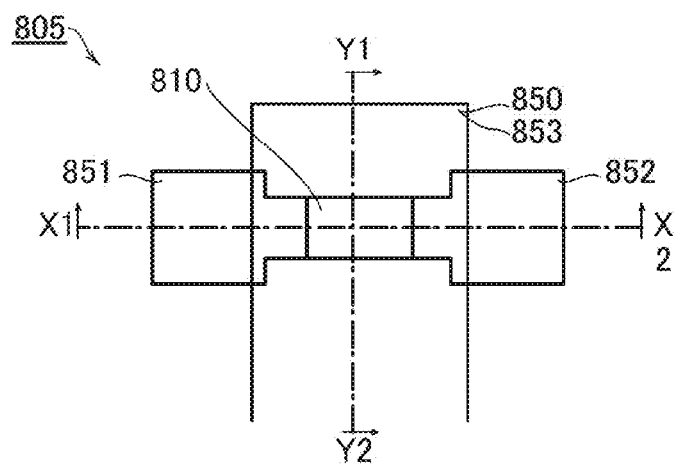
FIG. 22B
FIG. 22C
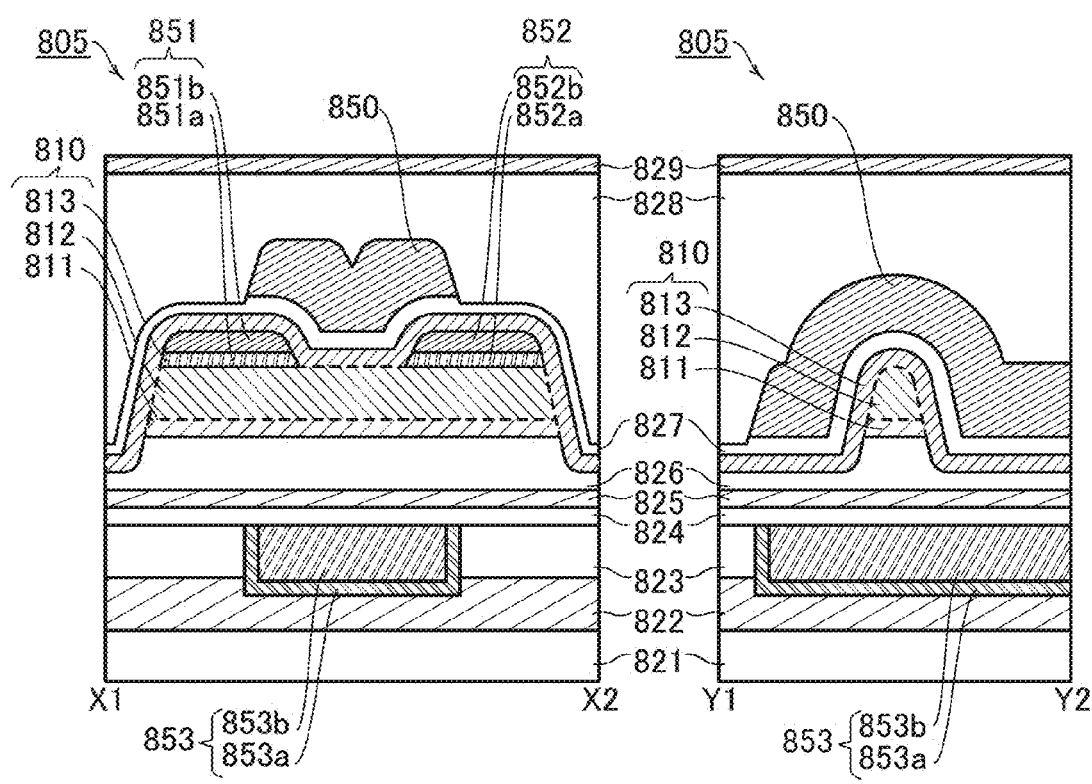

FIG. 23A
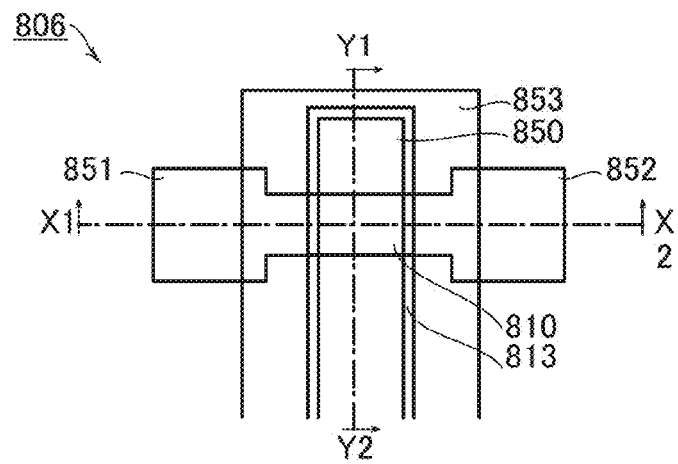
FIG. 23B
FIG. 23C
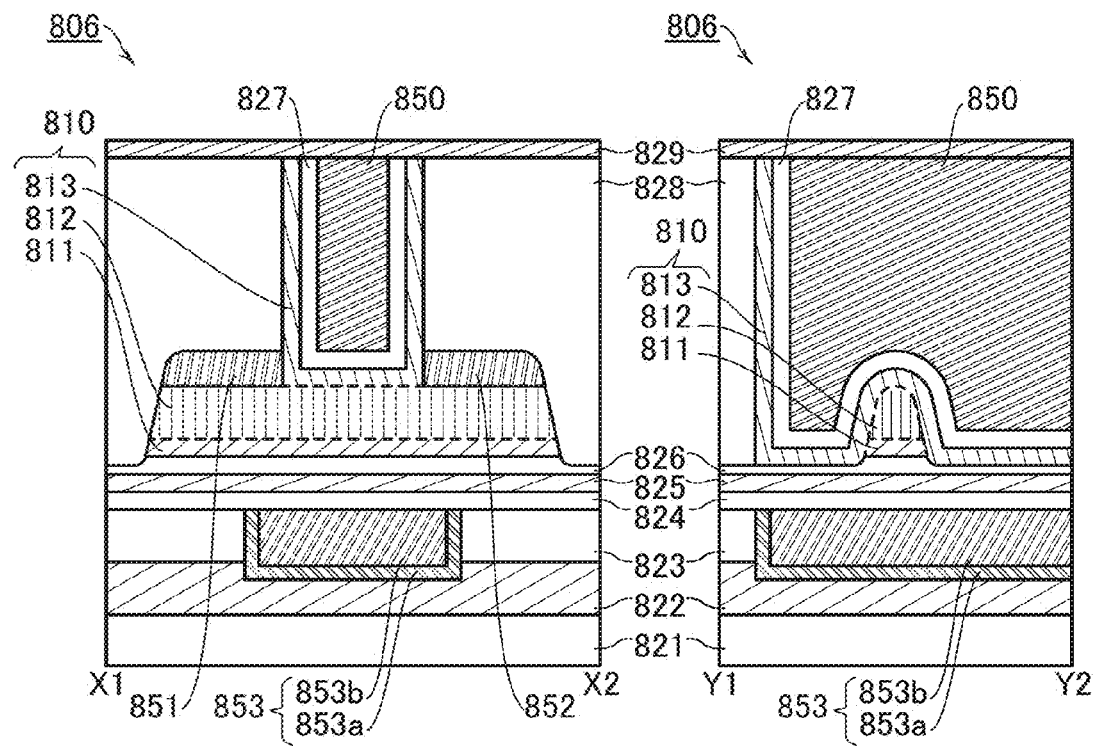

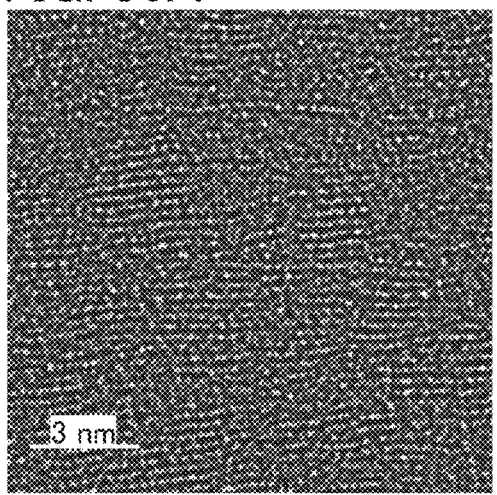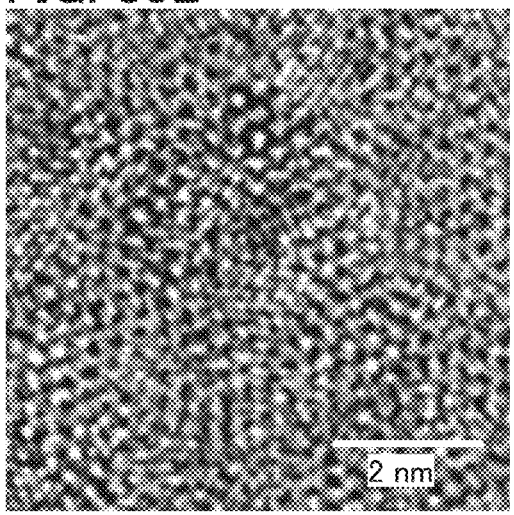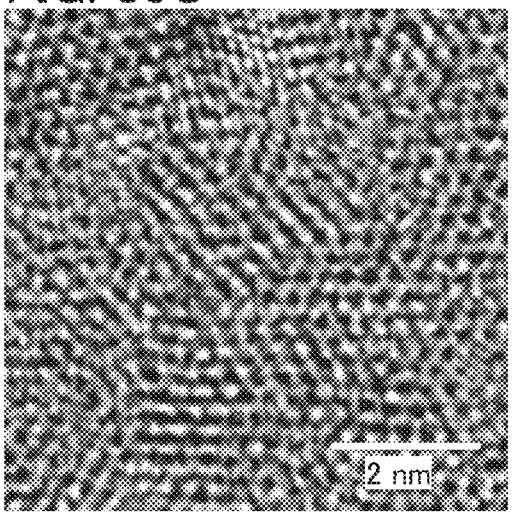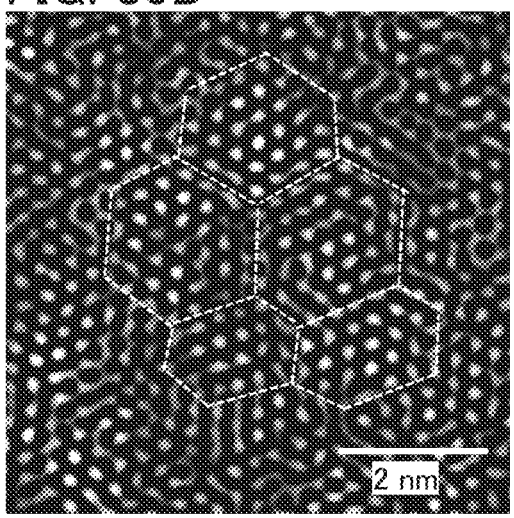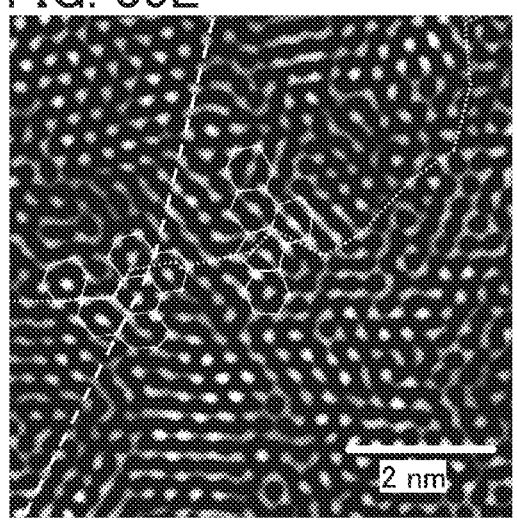

SEMICONDUCTOR DEVICE, COMPUTER, AND ELECTRONIC DEVICE

BACKGROUND OF THE INVENTION

1. Field of the Invention

One embodiment of the present invention relates to a semiconductor device, a computer, and an electronic device.

Note that one embodiment of the present invention is not limited to the above technical field. The technical field of one embodiment of the invention disclosed in this specification and the like relates to an object, a method, or a manufacturing method. Furthermore, one embodiment of the present invention relates to a process, a machine, manufacture, or a composition of matter. One embodiment of the present invention relates to a semiconductor device, a display device, a light-emitting device, a power storage device, a memory device, an imaging device, a driving method thereof, or a manufacturing method thereof.

2. Description of the Related Art

As a device whose circuit configuration can be arbitrarily changed by a user, a programmable logic device (PLD) is widely known.

PLDs are classified by circuit scale into a simple programmable logic device (SPLD), a complex programmable logic device (CPLD), a field programmable gate array (FPGA), and the like. Patent Document 1 discloses an FPGA in which a configuration memory includes a transistor that includes an oxide semiconductor.

REFERENCE

Patent Document

[Patent Document 1] U.S. Patent Application Publication No. 2014/0159771

SUMMARY OF THE INVENTION

An object of one embodiment of the present invention is to provide a novel semiconductor device. Another object of one embodiment of the present invention is to provide a semiconductor device having a high computing performance. Another object of one embodiment of the present invention is to provide a semiconductor device capable of reducing power consumption. Another object of one embodiment of the present invention is to provide a semiconductor device with a small area.

One embodiment of the present invention does not necessarily achieve all the objects listed above and only needs to achieve at least one of the objects. The description of the above objects does not preclude the existence of other objects. Other objects will be apparent from and can be derived from the description of the specification, the claims, the drawings, and the like.

A semiconductor device of one embodiment of the present invention includes a first circuit, a second circuit, and a third circuit. In the semiconductor device, the first circuit is configured to perform a computation. The second circuit is configured to change a circuit configuration by changing configuration data. The third circuit includes a plurality of memory regions. Each of the plurality of memory regions is configured to store a set of configuration data to be stored in the second circuit. The first circuit is configured to make the set of configuration data stored in any of the plurality of memory regions stored in the second circuit.

A semiconductor device of one embodiment of the present invention includes a first circuit, a second circuit, a third circuit, a fourth circuit, and a fifth circuit. In the semiconductor device, the first circuit is configured to perform a computation. The second circuit is configured to change a circuit configuration by changing configuration data. The third circuit includes a plurality of memory regions. Each of the plurality of memory regions is configured to store a set of configuration data to be stored in the second circuit. The fourth circuit is configured to store data used for processing in the first circuit. The fifth circuit is configured to store first data for selecting a context of the second circuit that executes a task and second data for selecting any of the plurality of memory regions. The first circuit is configured to make the set of configuration data stored in any of the plurality of memory regions stored in the second circuit when the second data is stored in the fifth circuit.

Furthermore, in the semiconductor device of one embodiment of the present invention, the second circuit may include a first context and a second context, and the first circuit may be configured to reconfigure the second context in a period when the first context executes a task.

Furthermore, the semiconductor device of one embodiment of the present invention may include a plurality of first circuits and a plurality of second circuits, the plurality of first circuits may be electrically connected to each other through a first link, the plurality of second circuits may be electrically connected to each other through a second link, and the plurality of second circuits may form a pipeline through the second link.

Furthermore, in the semiconductor device of one embodiment of the present invention, the second circuit may include a first transistor, a second transistor, and a capacitor, one of a source and a drain of the first transistor may be electrically connected to a gate of the second transistor and the capacitor, the first transistor may be located over the second transistor, and the first transistor may include an oxide semiconductor in its channel formation region.

Moreover, a computer of one embodiment of the present invention includes the above-described semiconductor device, an input device, and an output device.

Moreover, an electronic device of one embodiment of the present invention includes the above-described semiconductor device; and a display portion, a microphone, a speaker, or an operation key.

One embodiment of the present invention can provide a novel semiconductor device. One embodiment of the present invention can provide a semiconductor device having a high computing performance. One embodiment of the present invention can provide a semiconductor device capable of reducing power consumption. One embodiment of the present invention can provide a semiconductor device with a small area.

Note that the description of these effects does not preclude the existence of other effects. One embodiment of the present invention does not necessarily have all the effects listed above. Other effects will be apparent from and can be derived from the description of the specification, the claims, the drawings, and the like.

BRIEF DESCRIPTION OF THE DRAWINGS

In the accompanying drawings:

FIGS. 19A to 19C illustrate a structure example of a transistor;

FIGS. 21A to 21C illustrate a structure example of a transistor;

FIGS. 22A to 22C illustrate a structure example of a transistor;

FIGS. 23A to 23C illustrate a structure example of a transistor;

FIGS. 30A to 30E show a cross-sectional TEM image and plan-view TEM images of a CAAC-OS and images obtained through analysis thereof;

DETAILED DESCRIPTION OF THE INVENTION

Figure 1A:
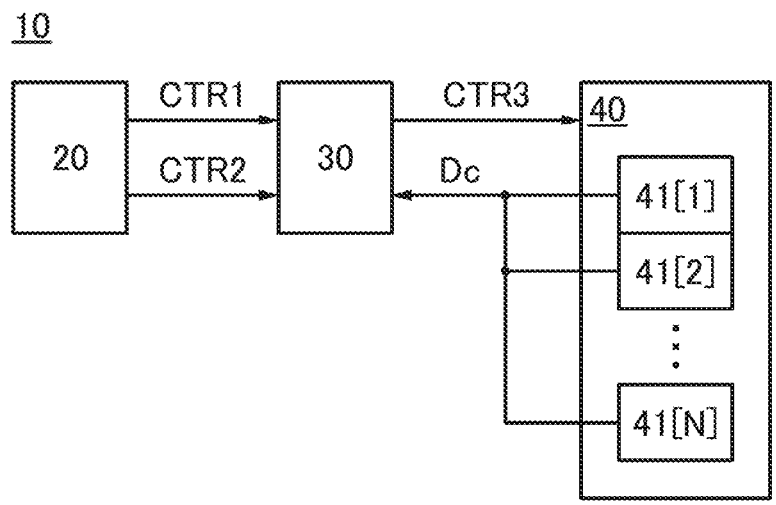
FIGS. 1A and 1B illustrate structure examples of a semiconductor device.

Embodiments of the present invention will be described below in detail with reference to the accompanying drawings. Note that the present invention is not limited to the following description of the embodiments and it is easily understood by those skilled in the art that the mode and details can be variously changed without departing from the scope and spirit of the present invention. Therefore, the present invention should not be interpreted as being limited to the description of the embodiments below.

One embodiment of the present invention includes, in its category, devices such as a semiconductor device, a computer, an electronic device, a display device, a memory device, an imaging device, and a radio frequency (RF) tag. Furthermore, the display device includes, in its category, a liquid crystal display device, a light-emitting device having pixels each provided with a light-emitting element typified by an organic light-emitting element, electronic paper, a digital micromirror device (DMD), a plasma display panel (PDP), a field emission display (FED), and the like.

Furthermore, in this specification and the like, an explicit description "X and Y are connected" means that X and Y are electrically connected, X and Y are functionally connected, and X and Y are directly connected. Accordingly, without being limited to a predetermined connection relationship, for example, a connection relationship shown in drawings or texts, another connection relationship is included in the drawings or the texts. Here, X and Y each denote an object (e.g., a device, an element, a circuit, a wiring, an electrode, a terminal, a conductive film, or a layer).

Examples of the case where X and Y are directly connected include the case where an element that allows an electrical connection between X and Y (e.g., a switch, a transistor, a capacitor, an inductor, a resistor, a diode, a display element, a light-emitting element, or a load) is not connected between X and Y, and the case where X and Y are connected without the element that allows the electrical connection between X and Y provided therebetween.

For example, in the case where X and Y are electrically connected, one or more elements that enable an electrical connection between X and Y (e.g., a switch, a transistor, a capacitor, an inductor, a resistor, a diode, a display element, a light-emitting element, or a load) can be connected between X and Y. Note that the switch is controlled to be turned on or off. That is, the switch is conducting or not conducting (is turned on or off) to determine whether current flows therethrough or not. Alternatively, the switch has a function of selecting and changing a current path. Note that the case where X and Y are electrically connected includes the case where X and Y are directly connected.

For example, in the case where X and Y are functionally connected, one or more circuits that enable a functional connection between X and Y (e.g., a logic circuit such as an inverter, a NAND circuit, or a NOR circuit; a signal converter circuit such as a D/A converter circuit, an A/D converter circuit, or a gamma correction circuit; a potential level converter circuit such as a power supply circuit (e.g., a step-up circuit or a step-down circuit) or a level shifter circuit for changing the potential level of a signal; a voltage source; a current source; a switching circuit; an amplifier circuit such as a circuit that can increase signal amplitude, the amount of current, or the like, an operational amplifier, a differential amplifier circuit, a source follower circuit, and a buffer circuit; a signal generation circuit; a memory circuit; or a control circuit) can be connected between X and Y. For example, even when another circuit is interposed between X and Y, X and Y are functionally connected if a signal output from X is transmitted to Y. Note that the case where X and Y are functionally connected includes the case where X and Y are directly connected and the case where X and Y are electrically connected.

Note that in this specification and the like, an explicit description "X and Y are electrically connected" means that X and Y are electrically connected (i.e., the case where X and Y are connected with another element or another circuit provided therebetween), X and Y are functionally connected (i.e., the case where X and Y are functionally connected with another circuit provided therebetween), and X and Y are directly connected (i.e., the case where X and Y are connected without another element or another circuit provided therebetween). That is, in this specification and the like, the explicit description "X and Y are electrically connected" is the same as the description "X and Y are connected".

In describing structures of the invention with reference to the drawings, common reference numerals are used for the same portions in different drawings in some cases.

Even when independent components are electrically connected to each other in a drawing, one component has functions of a plurality of components in some cases. For example, when part of a wiring also functions as an electrode, one conductive film functions as the wiring and the electrode. Thus, "electrical connection" in this specification includes in its category such a case where one conductive film has functions of a plurality of components.

Embodiment 1

In this embodiment, a semiconductor device of one embodiment of the present invention is described.

<Structure Example 1 of Semiconductor Device>

FIG. 1A illustrates a structure example of a semiconductor device 10. The semiconductor device 10 includes a circuit 20, a circuit 30, and a memory circuit 40.

The circuit 20 is a circuit having a function of performing a variety of computations or the like. Specifically, the circuit 20 has a function of a central processing unit (CPU). The circuit 20 is also referred to as a CPU 20 below. The circuit 20 can include a logic circuit such as a sequential circuit and a combinational circuit.

The circuit 30 is a circuit having a function of performing a variety of computations or the like. Specifically, the circuit 30 has a function of a programmable logic device (PLD) which can change its circuit configuration. The circuit 30 is also referred to as a PLD 30 below. As the PLD 30, an SPLD, a CPLD, an FPGA, or the like can be used. An example of using an FPGA as the PLD 30 is described below.

Figure 2A:
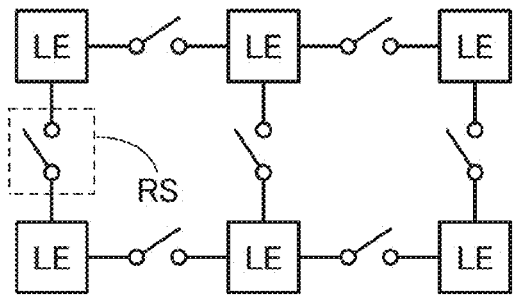
FIGS. 2A to 2C illustrate structure examples of a PLD, a LUT, and an RS.

An overview of the structure of the PLD 30 is illustrated in FIG. 2A. The PLD 30 includes a plurality of programmable logic elements (LEs) and programmable switches (RSs) provided between the LEs. By changing data stored in memory elements in the LEs, the function of the LEs can be changed. Furthermore, by changing data stored in memory elements in the RSs, the connection among the LEs can be changed.

In this specification and the like, data that controls the function of an LE or data that controls the connection between LEs is referred to as configuration data, and a memory element that stores the configuration data is referred to as a configuration memory. Moreover, updating configuration data stored in a configuration memory is referred to as reconfiguration. By storing generated predetermined configuration data in a configuration memory, the circuit configuration of the PLD 30 can be freely changed.

Figure 2B:
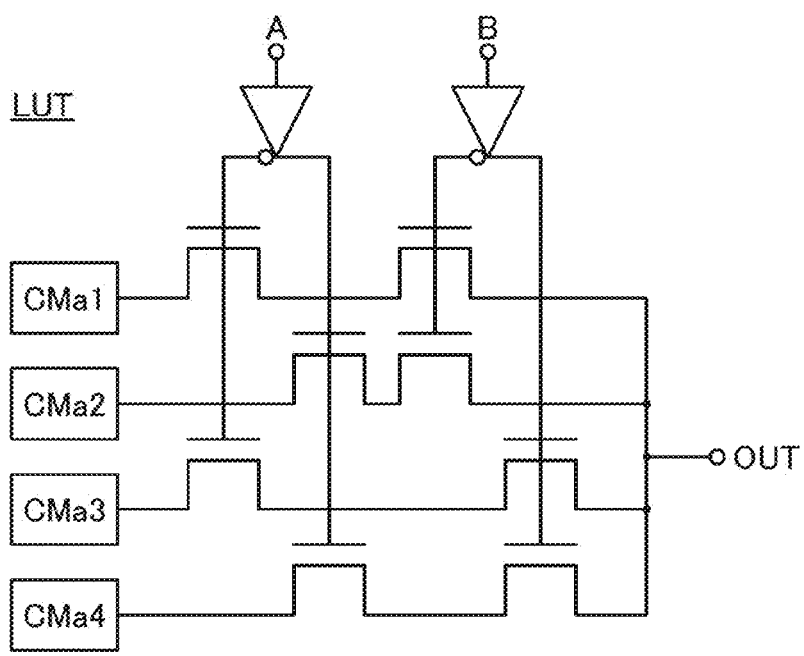

The LEs can be formed of a lookup table (LUT), a multiplexer (MUX), or the like. FIG. 2B illustrates a structure example of a LUT that can be used as an LE. The LUT illustrated in FIG. 2B can change the content of a logical operation by changing configuration data stored in configuration memories CMa1 to CMa4. For example, data "1" is stored in the configuration memories CMa1 to CMa3, and data "0" is stored in the configuration memory CMa4, in which case a NAND gate in which terminals A and B are input terminals can be formed. Furthermore, when data "1" is stored in the configuration memory CMa1 and data "0" is stored in the configuration memories CMa2 to CMa4, a NOR gate in which the terminals A and B are input terminals can be formed.

Figure 2C:
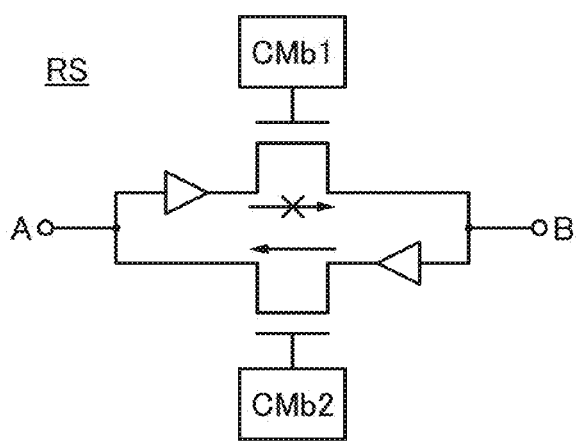

The RSs can be formed of transistors or the like. FIG. 2C illustrates a structure example of the RS. The RS illustrated in FIG. 2C can change the connection between a terminal A and a terminal B when configuration data stored in configuration memories CMb1 and CMb2 is changed. For example, when data "0" is stored in the configuration memory CMb1, a path from the terminal A to the terminal B can be blocked, and when data "1" is stored in the configuration memory CMb2, a path from the terminal B to the terminal A can be unblocked.

In this manner, controlling the data stored in a configuration memory included in an LE or an RS enables the control of the LE's function and the connection between LEs; accordingly, the function of the PLD 30 can be set freely. Note that specific structure examples of the configuration memories are described in Embodiment 2 and the like.

Figure 3A:
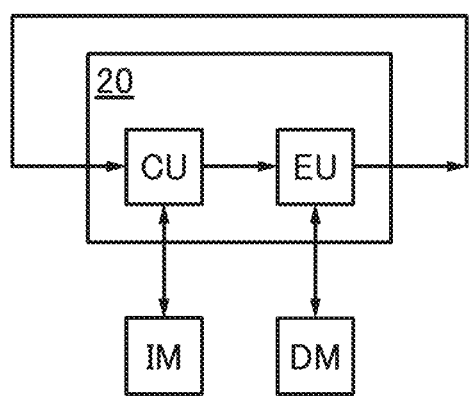
FIGS. 3A and 3B illustrate operations of a CPU and a PLD.
Figure 3B:
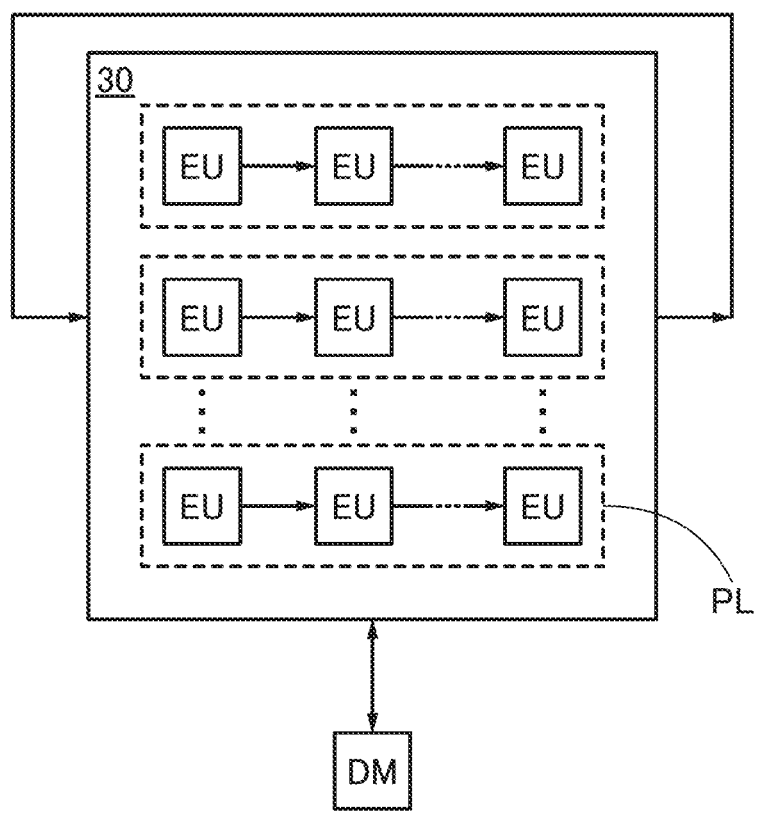

The PLD 30 executes processing in accordance with a control signal input from the CPU 20. FIGS. 3A and 3B illustrate a typical procedure of processing in the CPU 20 and the PLD 30. The processing in the CPU 20 is, as illustrated in FIG. 3A, performed by sequential repetition of the followings: readout of an instruction from an instruction memory IM by a control unit CU, decoding of the instruction by the control unit CU, readout of computation data from a data memory DM by an execution unit EU, computation in the execution unit EU, and writing of a result of the computation by the execution unit EU to the data memory DM.

Because the instruction stored in the instruction memory IM has great versatility, the CPU 20 combined with the instruction can achieve various functions. However, every time the instruction is executed, access to the data memory DM is required. The frequent access lowers the processing speed of the CPU 20.

The PLD 30 can flexibly change the circuit configuration by changing the configuration data. By forming and connecting a plurality of execution units EU as illustrated in FIG. 3B, a pipeline (PL) where a series of computation processing is performed can be formed. The number of pipelines can be determined in accordance with the amount of processed data.

When computation data read from the data memory DM is input to the first execution unit of a pipeline, a series of computation processing is performed in each pipeline. When the computation processing is finished, a computation result is stored in the data memory DM. Thus, in the case where a series of processing performed by a plurality of execution units EU is replaced by pipeline processing, access to the data memory DM is only necessary at the first and the last of the pipeline processing. Therefore, the PLD 30 requires less frequent access to a memory than the CPU 20, and allows high-speed processing. Moreover, power consumed by the access to a memory can be drastically reduced, leading to extremely power-efficient computation processing.

The semiconductor device 10 illustrated in FIG. 1A includes the CPU 20 and the PLD 30, where an operation of the PLD 30 can be controlled by the CPU 20. Thus, the CPU 20 executes processing which requires a complicated computation, a small amount of data processing, or the like by itself, and makes the PLD 30 process a computation which requires a large amount of data processing, a computation which requires quick processing, or the like. In this way, the load of processing in the CPU 20 can be reduced and the frequency of access to a memory can be reduced; accordingly, the operation speed and power efficiency of the semiconductor device 10 can be increased.

The memory circuit 40 is a circuit having a function of storing data that is to be stored in the PLD 30. Specifically, the memory circuit 40 includes N (N is an integer of 2 or more) memory regions 41 (memory regions 41[1] to 41[N]).

Data Dc used in processing in the PLD 30 is stored in the memory regions 41. The data Dc is a set of configuration data stored in the PLD 30 and corresponds to data for reconfiguring the PLD 30 so that a predetermined task can be executed.

Here, as a method of reconfiguring the PLD 30, there are static reconfiguration in which reconfiguration is performed in a state in which the operation of the PLD 30 is stopped, and dynamic reconfiguration in which reconfiguration is performed during the operation of the PLD 30. The dynamic reconfiguration is preferable in terms of higher operation speed of the PLD 30 because the execution of a task in the PLD 30 and the reconfiguration of the PLD 30 can be performed in parallel.

Figure 4A:
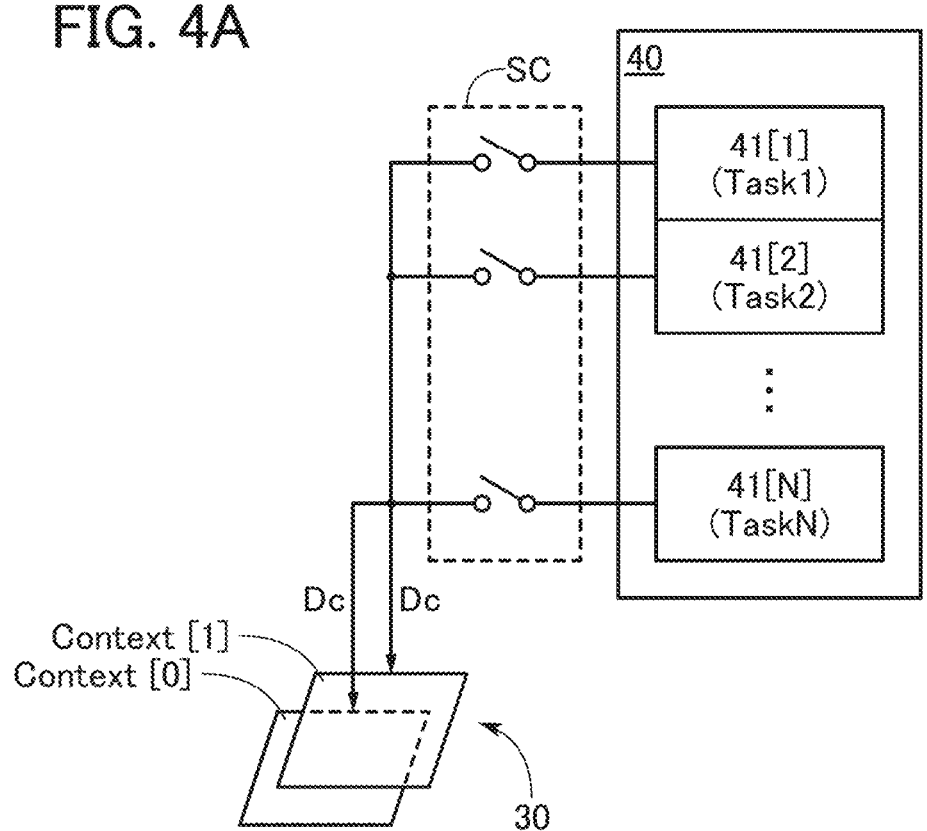
FIGS. 4A and 4B are drawings for explaining a multi-context PLD.

Here, a multi-context PLD can be used as the PLD 30. The multi-context method is a method for quickly changing the circuit configuration of the PLD 30 by storing a plurality of sets of configuration data corresponding to predetermined circuit configurations in advance and selecting a set of configuration data to be stored in the PLD 30. FIG. 4A is a conceptual drawing of the PLD 30 employing the multi-context method.

The PLD 30 includes a plurality of contexts. A structure example in which the PLD 30 has two contexts (contexts [0], [1]) is illustrated in FIG. 4A. A memory region 41[$k$] (k is an integer of more than or equal to 1 and less than or equal to N) stores the data Dc corresponding to the circuit configuration capable of executing a task k. Although the case where the number of contexts is two is described below, the number of contexts in the PLD 30 can be set arbitrarily.

The memory regions 41[1] to 41[N] are each connected to the PLD 30 through a selection circuit SC. Any of the data Dc stored in the memory regions 41[1] to 41[N] is selected and input to the PLD 30 to reconfigure the PLD 30. In this way, reconfiguration of the PLD 30 can be performed at high speed in accordance with the task executed in the PLD 30.

Figure 4B:
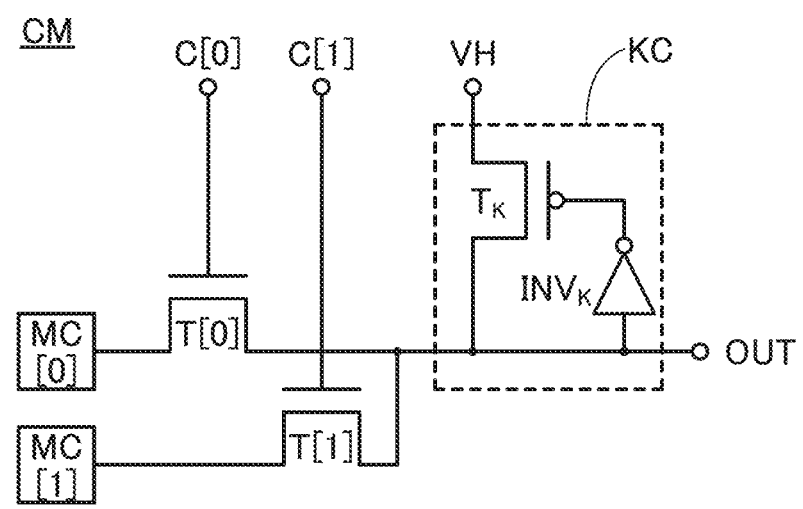

Furthermore, the PLD 30 has the context [0] and the context [1], each of which can be reconfigured using the data Dc stored in the memory region 41. Specifically, as illustrated in FIG. 4B, a configuration memory CM included in the PLD 30 includes memory regions MC[0] and MC[1] corresponding to the context [0] and the context [1].

In the case where the context [0] is selected, a potential which turns on a transistor T[0] is supplied to a terminal C[0], and a potential which turns off a transistor T[1] is supplied to a terminal C[1]. Thus, the data retained in the memory region MC[0] is output to a terminal OUT as configuration data. In the case where the context [1] is selected, a potential which turns off the transistor T[0] is supplied to the terminal C[0], and a potential which turns on the transistor T[1] is supplied to the terminal C[1]. Thus, the data retained in the memory region MC[1] is output to the terminal OUT as configuration data. In this manner, any of the contexts in the PLD 30 is selected, and the circuit configuration of the PLD 30 can be changed in accordance with the selected context.

Any of the data stored in the memory regions 41[1] to 41[N] can be selected and stored in the memory regions MC[0] and MC[1]. In other words, configuration data corresponding to the context [0] can be stored in the memory region MC[0], and configuration data corresponding to the context [1] can be stored in the memory region MC[1]. This allows independent reconfiguration of the context [0] and the context [1].

The context used in processing in the PLD 30 can be switched between the context [0] and the context [1]. In this case, reconfiguration of the context [1] can be performed in a period when a task of the context [0] is performed, and reconfiguration of the context [0] can be performed in a period when a task of the context [1] is performed. Specifically, the configuration data stored in the memory region MC[1] can be updated in the period when the task of the context [0] is performed, and the configuration data stored in the memory region MC[0] can be updated in the period when the task of the context [1] is performed. This enables dynamic reconfiguration, in which the execution of a task and the reconfiguration are performed in parallel, so that an extremely long pipeline can be formed in the PLD 30.

As illustrated in FIG. 4B, a circuit KC may be provided in the configuration memory CM. The circuit KC includes a transistor $T_K$ and an inverter $INV_K$. When the potential of the terminal OUT is high, a high power supply potential is supplied from a terminal VH to the terminal OUT through the transistor $T_K$. Thus, the potential of the terminal OUT can be kept high.

In FIG. 1A, the PLD 30 performs processing in accordance with a control signal CTR1 and a control signal CTR2 input from the CPU 20. The control signal CTR1 is a signal having a function of selecting a context which executes a task from a plurality of contexts that the PLD 30 has. The control signal CTR2 is a signal having a function of controlling reconfiguration of a context whose task is not being executed.

The CPU 20 outputs the control signal CTR1 to the PLD 30 when the PLD 30 executes a task. The control signal CTR1 contains a signal for changing the context which executes a task and a signal which designates the context to be used after the change of the context. In accordance with the control signal CTR1, a context which executes a task is selected from the plurality of contexts that the PLD 30 has.

Furthermore, the CPU 20 outputs the control signal CTR2 to the PLD 30. The control signal CTR2 contains a signal which requests an update of configuration data of the context whose task is not being executed and a signal which designates the context whose configuration data is to be updated. A particular context whose task is not being executed is selected in accordance with the control signal CTR2, and reconfiguration of the selected context is performed.

Specifically, when the control signal CTR2 is input to the PLD 30, a control signal CTR3 is output from the PLD 30 to the memory circuit 40. On the input of the control signal CTR3 to the memory circuit 40, a set of configuration data (the data Dc) is output from each of the memory regions 41[1] to 41[N]. One of the data Dc for reconfiguring the context selected in accordance with the control signal CTR2 is input to the PLD 30, and the PLD 30 is reconfigured. Thus, reconfiguration of the context whose task is not being executed can be performed.

Figure 1B:
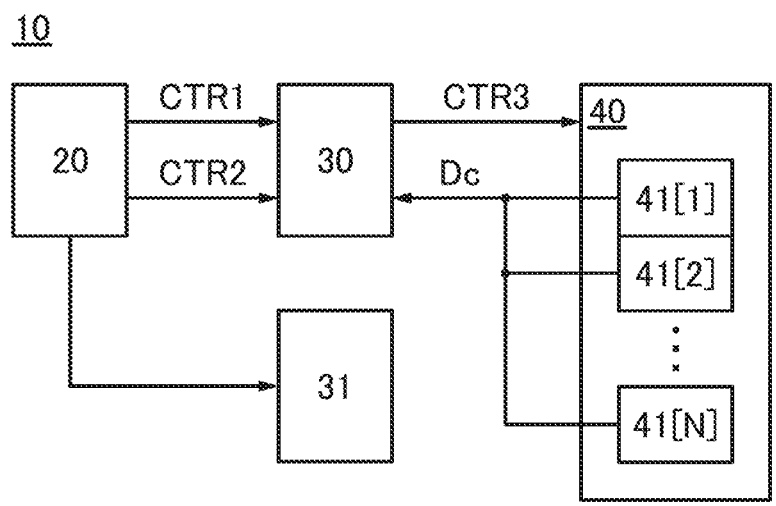

Note that the semiconductor device 10 may be configured so that a computation can be performed in an integrating circuit as well as in the CPU 20 or the PLD 30. FIG. 1B illustrates a structure example in which the semiconductor device 10 includes a circuit 31 which performs a computation in accordance with an instruction from the CPU 20. As the circuit 31, a graphics processing unit (GPU) can be used. In this case, the semiconductor device 10 capable of performing a computation using a CPU, a GPU, and a PLD can be formed. The circuit 31 is also referred to as a GPU 31 below.

In the above-described manner, the semiconductor device 10 can perform a computation using the CPU 20 and the PLD 30 which is controlled by the CPU 20. Moreover, the CPU 20 can make dynamic reconfiguration of the PLD 30 happen in synchronization with the switching of the task executed in the PLD 30. Thus, a semiconductor device with a high computing performance can be provided.

<Structure Example 2 of Semiconductor Device>

Figure 5:
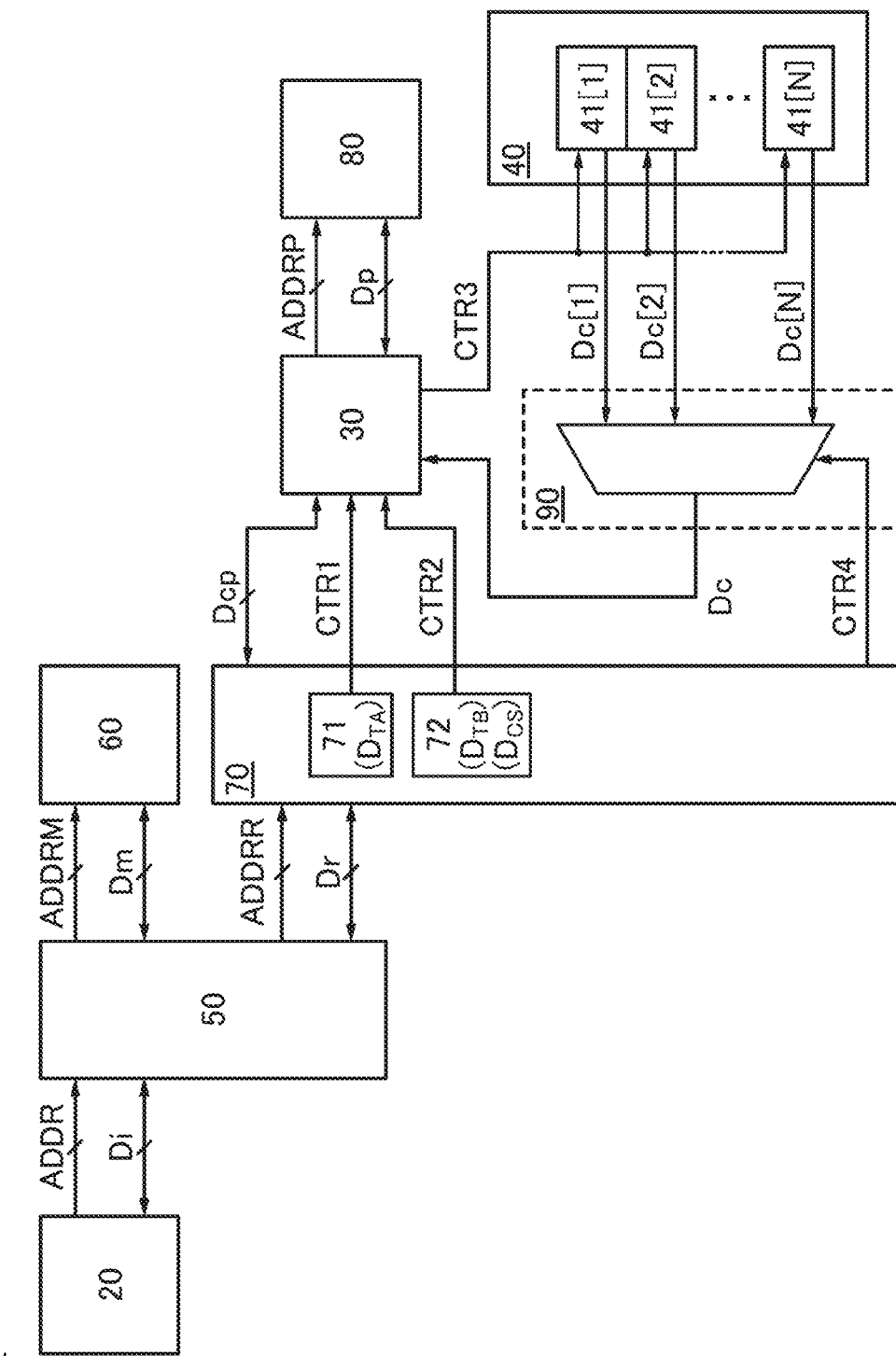
FIG. 5 illustrates a structure example of a semiconductor device.

Next, a specific structure example of the semiconductor device 10 is described. FIG. 5 illustrates a structure example of the semiconductor device 10. The semiconductor device 10 illustrated in FIG. 5 includes the circuit 20 (the CPU 20), the circuit (the PLD 30), the memory circuit 40, an interface (IF) 50, a memory circuit 60, a memory circuit 70, a memory circuit 80, and a selection circuit 90. The structures and functions of the circuit 20, the circuit 30, and the memory circuit 40 are similar to those described with reference to FIGS. 1A and 1B.

The IF 50 is a circuit having a function of controlling transmission and reception of data between the CPU 20 and the memory circuit 60 and transmission and reception of data between the CPU 20 and the memory circuit 70. When an access request from the CPU 20 to the memory circuit 60 or the memory circuit 70 arises, the CPU 20 outputs an address signal (signal ADDR) to the IF 50. Here, the CPU 20 recognizes the memory circuit 60 and the memory circuit 70 to be memory circuits assigned in particular logic address areas. The signal ADDR, which corresponds to a logic address, is converted into a signal ADDRM or a signal ADDRR, which corresponds to a physical address, by the IF 50. The signal ADDRM is a signal corresponding to the physical address of the memory circuit 60, and the signal ADDRR is a signal corresponding to the physical address of the memory circuit 70. Note that an access signal which selects the memory circuit 60 may be input to the memory circuit 60, together with the signal ADDRM. Furthermore, an access signal which selects the memory circuit 70 may be input to the memory circuit 70, together with the signal ADDRR.

The memory circuit 60 is a circuit having a function of storing data which is used for processing in the CPU 20. Examples of the data used for processing in the CPU 20 include a program corresponding to an instruction executed in the CPU 20, data subjected to a computation that the CPU 20 executes, and data corresponding to a result of the computation by the CPU 20. In accordance with a firmware, the CPU 20 performs processing using the memory circuit 60 as a working memory.

On the input of the signal ADDRM from the IF 50, data writing or reading is performed in the memory circuit 60. Writing of data is performed in the following manner: data Di which is input from the CPU 20 to the IF 50 is output to the memory circuit 60 as data Dm, and the data Dm is stored in an address of the memory circuit 60 designated by the signal ADDRM. Reading of data is performed in the following manner: the data Dm is read from the address of the memory circuit 60 designated by the signal ADDRM and output from the IF 50 to the CPU 20 as the data Di.

The memory circuit 70 has a function of storing data used for processing in the CPU 20. The memory circuit 70 has a function of storing data used for controlling the operation of the PLD 30. The memory circuit 70 can be formed of a register, for example.

When the signal ADDRR is input from the IF 50, data writing or reading is performed in the memory circuit 70. Writing of data is performed in the following manner: the data Di input from the CPU 20 to the IF 50 is output to the memory circuit 70 as data Dr, and the data Dr is stored in an address of the memory circuit 70 designated by the signal ADDRR. Reading of data is performed in the following manner: the data Dr is read from the address of the memory circuit 70 designated by the signal ADDRR and output from the IF 50 to the CPU 20 as the data Di.

Moreover, the memory circuit 70 includes a memory region 71 and a memory region 72. The memory region 71 has a function of storing data ($D_{TA}$) for selecting the context which executes a task A, or the like. The memory region 72 has a function of storing data ($D_{TB}$) for selecting the context which executes a task B, data ($D_{CS}$) for selecting the memory region 41 in which a set of configuration data corresponding to the task B is stored, and the like. The memory region 71 and the memory region 72 can each be formed of a register or the like. The CPU 20 appropriately performs data writing to the memory circuit 70 in accordance with a firmware.

When the data stored in the memory region 71 is changed by the CPU 20, the control signal CTR1 is output from the memory region 71 to the PLD 30, and the selection of the context which executes a task is performed. Moreover, when the data stored in the memory region 72 is changed by the CPU 20, the control signal CTR2 is output from the memory region 72 to the PLD 30, and a particular context whose task is not being executed is reconfigured.

Specifically, when receiving the control signal CTR2 from the memory region 72, the PLD 30 outputs the control signal CTR3 to the memory regions 41[1] to 41[N]. The control signal CTR3 is a signal for making the memory regions 41[1] to 41[N] output data and corresponds to an access signal such as a chip select signal or the like. On the input of the control signal CTR3 to the memory regions 41[1] to 41[N], the data Dc[1] to DC[N] corresponding to the sets of configuration data is output from the memory circuit 40 to the selection circuit 90.

Serial data output is preferably employed for the output of the data Dc from the memory regions 41 to the selection circuit 90. In this case, the structure of a memory interface which controls transmission and reception of data between the memory circuit 40 and the selection circuit 90 can be simplified. Furthermore, a clock signal which synchronizes with the data Dc is preferably output from the memory regions 41 to the selection circuit 90. This enables clock synchronized serial communication between the memory circuit 40 and the selection circuit 90. Note that this communication can also be carried out using non return zero (NRZ), phase modulation, or the like. In this case, by providing a clock data recovery (CDR) circuit, the data Dc and the clock signal can be separated.

The memory circuit 70 may have a function of storing data Dcp used for processing in the PLD 30. Examples of the data used for processing in the PLD 30 include data subjected to a computation that the PLD 30 executes and data corresponding to a result of the computation by the PLD 30. The data Dcp can be stored in a register or the like inside the memory circuit 70.

The memory circuit 80 is a circuit having a function of storing data used for processing in the PLD 30. On the input of a signal ADDRP corresponding to the address signal from the PLD 30 to the memory circuit 80, data writing or reading is performed in the memory circuit 80. Writing of data is performed in the following manner: data Dp is output from the PLD 30 to the memory circuit 80 and stored in an address of the memory circuit 80 designated by the signal ADDRP. Reading of data is performed in the following manner: the data Dp is read from the address of the memory circuit 80 designated by the signal ADDRP and output to the PLD 30.

The PLD 30 executes a task using the context designated by the control signal CTR1 and using the memory circuit 80 as a working memory. Furthermore, the PLD 30 can also execute a task using the data Dcp stored in the memory circuit 70. Note that the PLD 30 may have a function of storing data notifying the task in progress (completion of a check point), data notifying the completion of the task, data generated by the execution of the task, or the like in the memory circuit 70 or the memory circuit 80. The CPU 20 can perform processing such as updates of a task schedule of the PLD 30, by storing predetermined data in the memory circuit 70.

The selection circuit 90 is a circuit having a function of selecting any one of the sets of configuration data (the data Dc[1] to Dc[/V]) output from the memory regions 41[1] to 41[N] and outputting the selected set to the PLD 30. The selection of the data Dc is performed in accordance with a control signal CTR4 input from the memory circuit 70 to the selection circuit 90. When the data stored in the memory region 72 is changed by the CPU 20, the control signal CTR4 which selects a set of configuration data corresponding to the task B is generated and output to the selection circuit 90. The data Dc output from the selection circuit 90 is stored in the configuration memory of the PLD 30. Thus, the context selected by the control signal CTR2 is reconfigured.

Note that the semiconductor device 10 illustrated in FIG. 5 employs not a method in which the PLD 30 selects any of the memory regions 41[1] to 41[N] and generates a control signal corresponding to the selected memory region 41 to selectively extract the data Dc from the memory circuit 40, but a method in which the data Dc[1] to Dc[N] is first output from the memory circuit 40 and then the data Dc to be input to the PLD 30 is selected by the selection circuit 90. By this method, even when the number of memory regions 41 is increased, no substantial change is necessary in the structure of the memory interface for controlling the communication between the PLD 30 and the memory circuit 40, improving the general versatility of the semiconductor device.

The reconfiguration of the PLD 30 is performed in the following manner: the context whose task is not being executed is reconfigured in a period in which another context is executing a task. Thus, dynamic reconfiguration of the PLD 30 can be performed.

Figure 6:
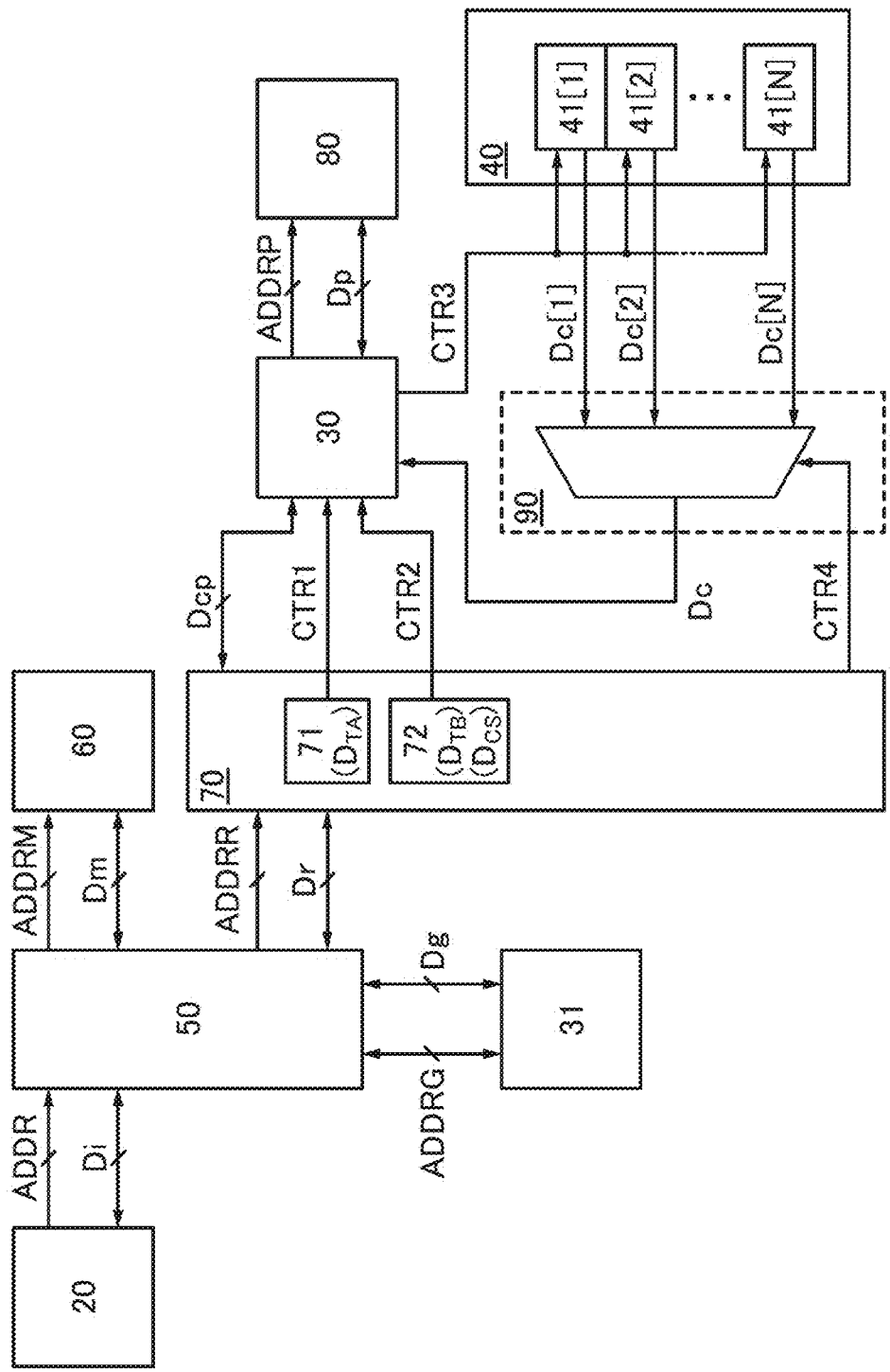
FIG. 6 illustrates a structure example of a semiconductor device.

Note that the semiconductor device 10 illustrated in FIG. 5 may include the GPU 31 illustrated in FIG. 1B. A structure of the semiconductor device 10 illustrated in FIG. 5 to which the GPU 31 is added is illustrated in FIG. 6.

Data is delivered and received between the CPU 20 and the GPU 31 through the IF 50. A signal ADDRG is an address signal for the access to the GPU 31, and data Dg is data for writing and reading to/from the GPU 31. This structure enables a computation using the CPU 20, the GPU, and the PLD in the semiconductor device 10.

<Operation Example of Semiconductor Device>

Figure 7:
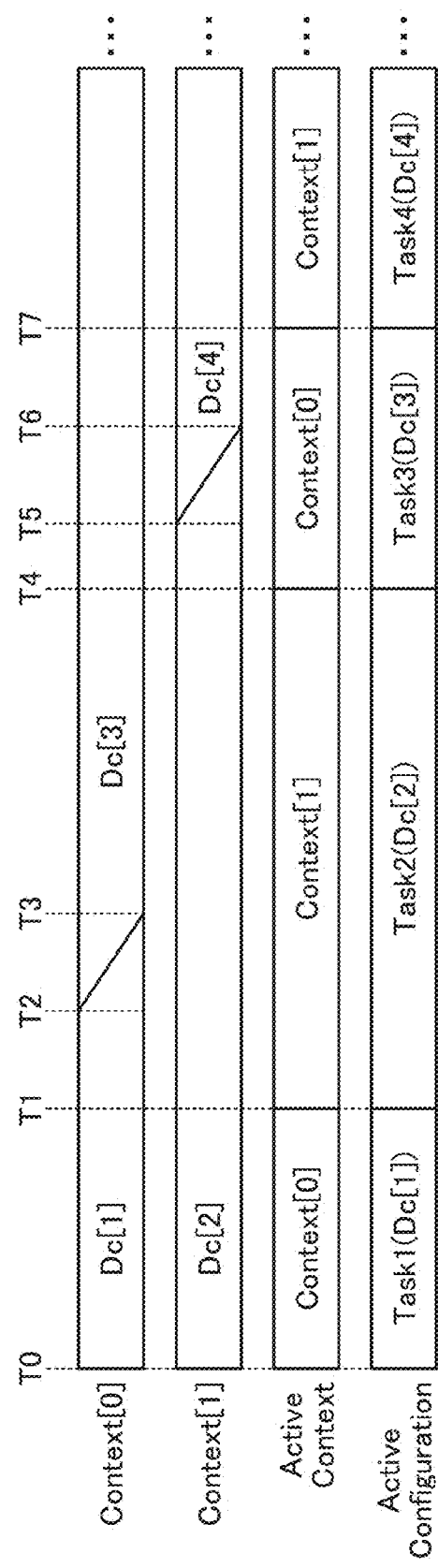
FIG. 7 is a timing chart.

Next, an operation example of the semiconductor device 10 is described. FIG. 7 is a timing chart showing an operation example in the case of using the PLD 30 employing the multi-context method in the semiconductor device 10. Although a case where the PLD 30 has two contexts (contexts [0], [1]) is described here, the number of contexts in the PLD 30 may be an arbitrary number without being limited to two.

First, at time T0, the configuration data of the context [0] is the data Dc[1] corresponding to a task 1, the configuration data of the context [1] is the data Dc[2] corresponding to a task 2, and the context selected by the control signal CTR1 (active context) is the context [0]. In this state, the task executed by the PLD 30 (active configuration) is the task 1 corresponding to the data Dc[1].

Before time T0, data for updating the configuration data of the context [0] to the data Dc[1] stored in the memory region 41[1] and data for updating the configuration data of the context [1] to the data Dc[2] stored in the memory region 41[2] are stored in the memory region 72 by the CPU 20. Furthermore, data which designates the context [0] as the context which executes a task is stored in the memory region 71 by the CPU 20. Thus, the state at time T0 of the PLD 30 can be prepared. This operation can be performed right after the supply of a power supply voltage to the semiconductor device 10 or right after a reset operation of the semiconductor device 10, for example.

Then, at time T1, the active context is set to the context [1], whereby the task executed by the PLD 30 is switched to the task 2 corresponding to the data Dc[2]. Note that this switching can be performed by storing the data which designates the context [1] as the context which executes a task in the memory region 71 by the CPU 20.

Next, from time T2 to time T3, the context [0] whose task is not being executed is reconfigured using the data Dc[3] corresponding to a task 3. This operation can be performed by storing the data for updating the configuration data of the context [0] to the data Dc[3] stored in the memory region 41[3] in the memory region 72 by the CPU 20.

Then, at time T4, the active context is set to the context [0], whereby the task executed by the PLD 30 is switched to the task 3 corresponding to the data Dc[3]. Note that this switching can be performed by storing the data which designates the context [0] as the context which executes a task in the memory region 71 by the CPU 20.

Next, from time T5 to time T6, the context [1] whose task is not being executed is reconfigured using the data Dc[4] corresponding to a task 4. This operation can be performed by storing the data for updating the configuration data of the context [1] to the data Dc[4] stored in the memory region 41[4] in the memory region 72 by the CPU 20.

Next, at time T7, the active context is set to the context [1], whereby the task executed by the PLD 30 is changed to the task 4 corresponding to the data Dc[4].

In the above-described manner, the PLD 30 can alternately use the context [0] and the context [1] for processing, under the control of the CPU 20. Furthermore, the PLD 30 can reconfigure the context whose task is not being executed in a period in which a task of another context is being executed. These operations allow formation of a substantially limitlessly long pipeline in the PLD 30; therefore, a semiconductor device with a high computing performance can be provided.

<Structure Example 3 of Semiconductor Device>

Figure 8:
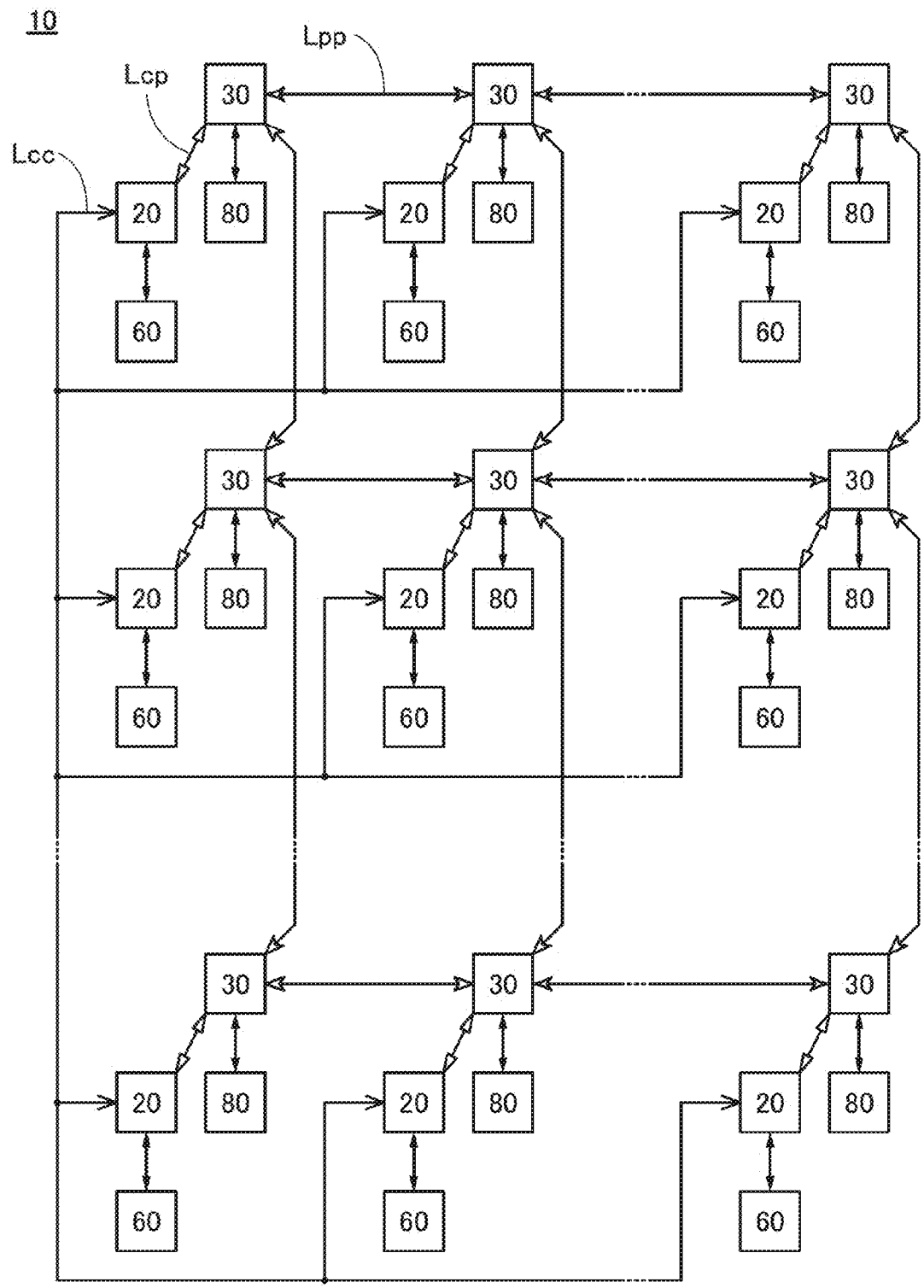
FIG. 8 illustrates a structure example of a semiconductor device.

Next, another structure example of the semiconductor device 10 is described. FIG. 8 illustrates a structure example of the semiconductor device 10. The semiconductor device 10 illustrated in FIG. 8 forms a computing system with a plurality of CPUs 20 and a plurality of PLDs 30.

In FIG. 8, the CPUs 20 are connected to each other through a link Lcc. Thus, the processing can be performed in the plurality of CPUs 20 in a distributed manner. Furthermore, the CPU 20 and the PLD 30 are connected to each other through a link Lcp. Thus, computation processing with a heavy load or the like can be performed in the PLD 30.

The adjacent PLDs 30 are connected to each other through a link Lpp. Thus, one deep pipeline can be formed using the plurality of PLDs 30 to perform computation processing. Alternatively, a plurality of identical pipelines can be formed using the plurality of PLDs 30 to perform a plurality of types of computation processing in parallel. In this way, throughput of the computation processing in the semiconductor device 10 can be increased.

Moreover, since the link Lpp is provided between the plurality of PLDs 30, a PLD 30 can communicate with another PLD 30 not through the CPU 20 or the link Lcc. Accordingly, the processing speed of the PLD 30 can be increased.

In the above-described manner, in one embodiment of the present invention, a computation can be performed using the CPU 20 and the PLD 30. In this way, the load of processing in the CPU 20 can be reduced and the frequency of access to a memory can be reduced; accordingly, the processing speed and power efficiency of the semiconductor device can be increased. Furthermore, in one embodiment of the present invention, the context of the PLD 30 can be switched and dynamic reconfiguration of the PLD 30 can be performed in synchronization with the switching of the task executed in the PLD 30. Thus, a semiconductor device with a high computing performance can be provided.

This embodiment can be combined with any of the other embodiments as appropriate.

Embodiment 2

In this embodiment, a structure example of a PLD that can be used in the semiconductor device described in the above embodiment is described.

<Structure Example of PLD>

Figure 9:
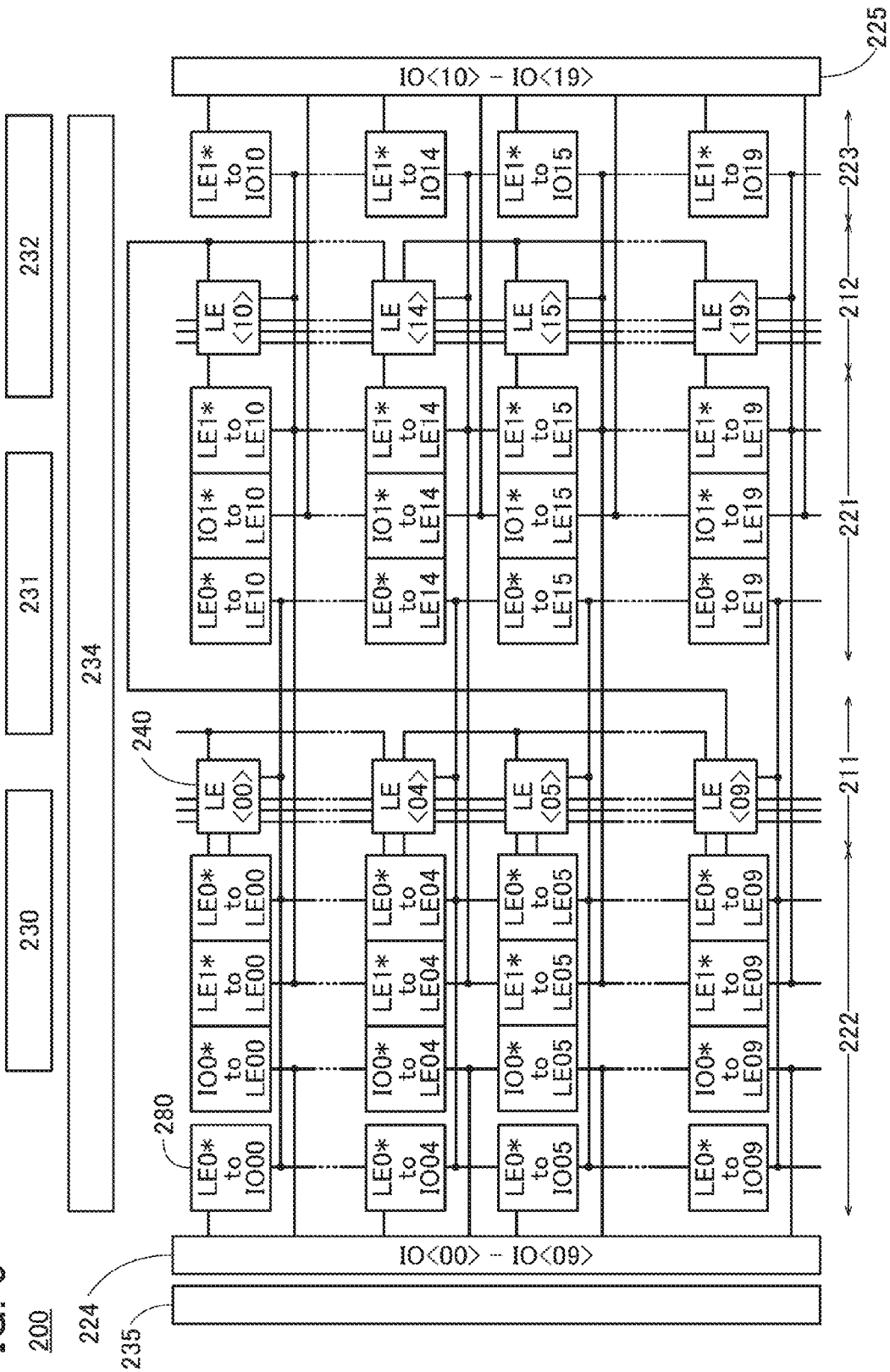
FIG. 9 illustrates a structure example of a PLD.

FIG. 9 illustrates a structure of a 200. The 200 can be used as the PLD 30 of Embodiment 1. A multi-context method can be applied to the 200.

The 200 includes a logic unit, an input/output unit, and a peripheral circuit unit. The logic unit includes logic arrays (LAs) 211 and 212 and switch arrays (SWAs) 221 to 223. The input/output unit includes input/output arrays (IOAs) 224 and 225. The peripheral circuit unit includes circuits having a function of driving the logic unit and the input/output unit. For example, the peripheral circuit unit includes a clock signal generator 230, a configuration controller 231, a context controller 232, a column driver circuit 234, and a row driver circuit 235.

The LAs 211 and 212 each include a plurality of LEs 240. In the example of FIG. 9, the LA 211 includes 10 LEs 240 (LE <00> to LE <09>), and the LA 212 includes 10 LEs 240 (LE <10> to LE <19>); however, the number of LEs 240 can be determined freely. The IOAs 224 and 225 have a function of controlling input and output of signals between external terminals of the 200 and the LAs 211 and 212.

The IOAs 224 and 225 each include a plurality of input/output circuits (IOs). In the example of FIG. 9, the IOA 224 includes 10 input/output circuits (IO <00> to IO <09>), and the IOA 225 includes 10 input/output circuits (IOs <10> to <19>). The IO <00> to IO <19> are connected to different external terminals from one another.

The SWAs 221 to 223 each include a plurality of RSs 280. The expressions in the RSs 280 in the drawing represent the functions of the RSs 280. For example, a switch circuit 280 expressed as "LE0* to IO00" has a function of a switch between the output nodes of the LE <00> to LE <09> and the input node of the IO<00>, and determines the electrical connection between the LE <00> to LE <09> and the IO<00> in accordance with configuration data and data for selecting a context (also referred to as context data below).

The clock signal generator 230 has a function of generating one or more clock signals used in the 200. The column driver circuit 234 has a function of generating configuration data. The row driver circuit 235 has a function of generating a signal for selecting a configuration memory. The configuration controller 231 has a function of controlling the column driver circuit 234 and the row driver circuit 235.

The context controller 232 has a function of generating context data.

<Structure Example of LE>

Figure 10:
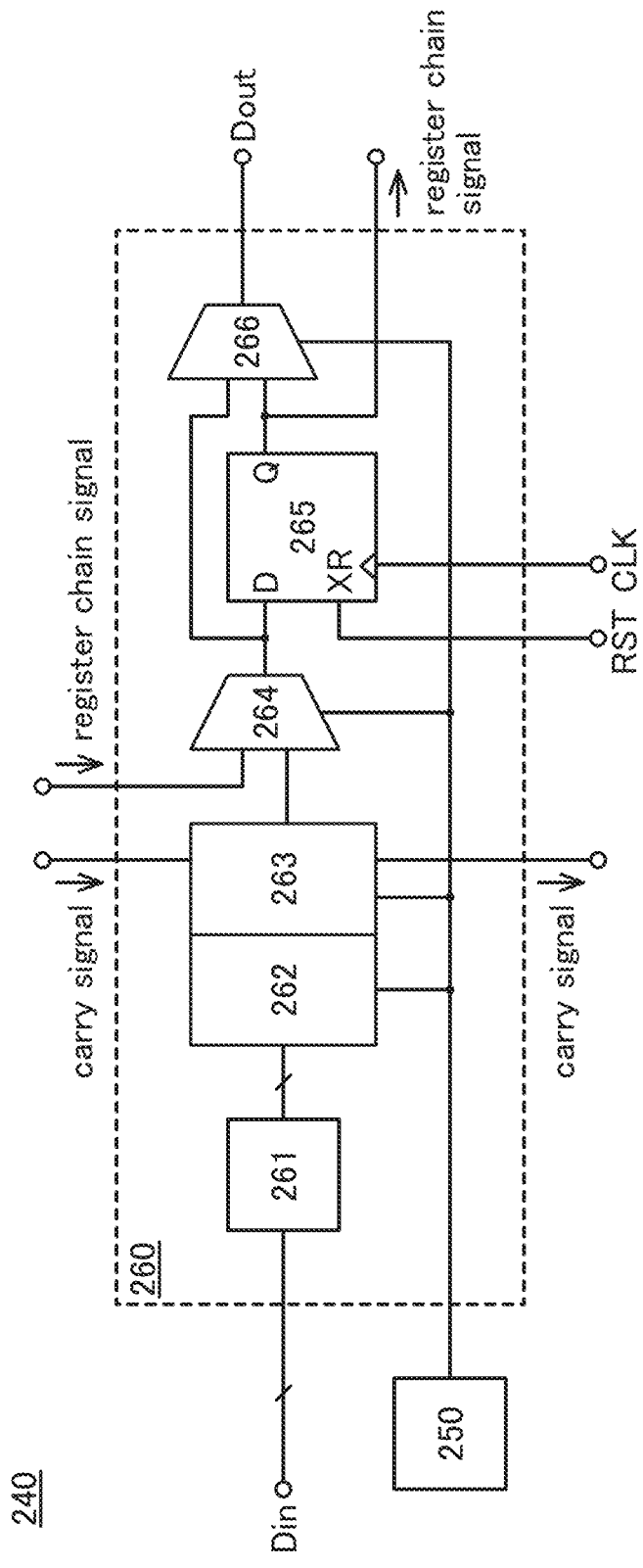
FIG. 10 illustrates a structure example of an LE.

FIG. 10 illustrates a structure example of the LE 240. The LE 240 is a programmable logic circuit and includes a configuration memory unit 250 and a logic cell (LCELL) 260.

The configuration memory unit 250 has a function of storing configuration data. The function of the LE 240 is determined in accordance with configuration data stored in the configuration memory unit 250.

The LE 240 has a function of generating data by subjecting input data Din to a predetermined logical operation and outputting the data as output data Dout. The LE 240 includes an exclusive OR (XOR) circuit group 261, a LUT 262, a carry logic 263, a selector (SEL) 264, a flip-flop circuit (FF) 265, and a selector (SEL) 266. The FF 265 has a function of a register. The FF 265 includes a terminal D to which data is input, a terminal XR to which a reset signal RST is input, a terminal to which a clock signal CLK is input, and a terminal Q from which data is output. The logic function of the LCELL 260 is controlled by the configuration data output from the configuration memory unit 250.

The data Din is input from an RS 280. Furthermore, the data Dout is output to another RS 280. In the case where a carry chain is formed with a plurality of LEs 240, input and output of carry signals are performed between the plurality of LEs 240. In the case where a register chain is formed with a plurality of LEs 240, input and output of register chain signals are performed between the adjacent LEs 240.

<Structure Example of Configuration Memory>

The LEs 240 and the RSs 280 in the 200 each include a configuration memory. Structure examples of a configuration memory that can be used in the LEs 240 or the RSs 280 are described below.

A configuration memory includes a memory circuit having a function of storing configuration data. The memory circuit included in the configuration memory may be volatile or nonvolatile. Examples of the volatile memory circuit include an SRAM. Examples of the nonvolatile memory circuit include a flash memory, a ferroelectric random access memory (FeRAM), a magnetoresistive random access memory (MRAM), a phase change random access memory (PRAM), and a resistive random access memory (ReRAM).

Here, it is particularly preferable to use a circuit which includes a transistor including an oxide semiconductor in a channel formation region (also referred to as an OS transistor below) as the memory circuit. An oxide semiconductor has a wider band gap and a lower carrier density than other semiconductors such as silicon, and thus the off-state current of an OS transistor is extremely low. When such an OS transistor is included in a configuration memory, the configuration memory can retain configuration data for a significantly long period, and in addition, as described below, the area of the configuration memory can be reduced.

[Structure Example 1]

Figure 11A:
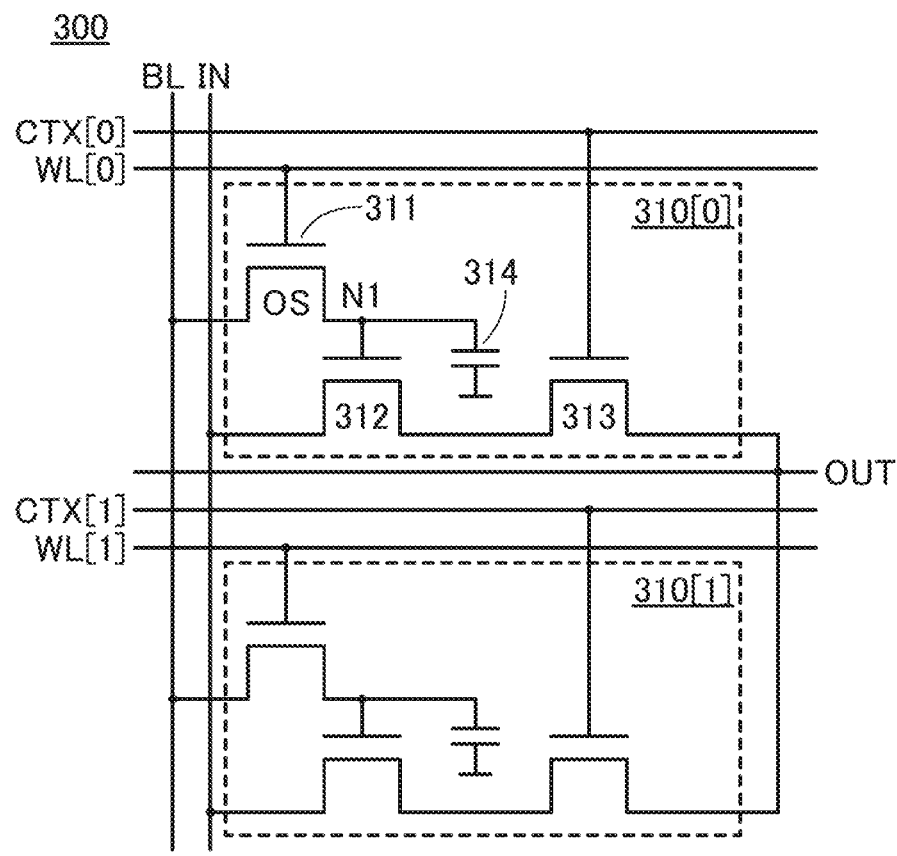
FIGS. 11A and 11B illustrate structure examples of a circuit.

FIG. 11A illustrates a structure example of a memory circuit that can be used as a configuration memory. A memory circuit 300 includes a plurality of circuits 310. Although two circuits 310 (circuits 310[1] and 310[1]) are illustrated in the example illustrated in FIG. 11A, the number of circuits 310 is not limited to two. Predetermined configuration data is stored in the circuit 310; thus, the connection between a wiring IN and a wiring OUT can be controlled. Therefore, the memory circuit 300 can be used as the RS 280.

The circuit 310 includes transistors 311, 312, and 313 and a capacitor 314. Although the transistors 311, 312, and 313 are of an n-channel type here, they may be of a p-channel type. A transistor marked with "OS" is an OS transistor.

A gate of the transistor 311 is connected to a wiring WL, one of a source and a drain of the transistor 311 is connected to a gate of the transistor 312 and one electrode of the capacitor 314, and the other thereof is connected to a wiring BL. One of a source and a drain of the transistor 312 is connected to the wiring IN, and the other thereof is connected to one of a source and a drain of the transistor 313. A gate of the transistor 313 is connected to a wiring CTX, and the other of the source and the drain of the transistor 313 is connected to the wiring OUT. The other electrode of the capacitor 314 is connected to a wiring to which a predetermined potential is supplied. Here, a node which is connected to the one of the source and the drain of the transistor 311, the gate of the transistor 312, and the one electrode of the capacitor 314 is referred to as a node N1.

Next, an operation of the circuit 310 is described. First, the potential of the wiring WL is set to turn on the transistor 311. A potential of the wiring BL is supplied to the node N1 (writing of configuration data). Note that the wiring WL is connected to the row driver circuit 235 (see FIG. 9). The potential of the wiring WL can be controlled by the row driver circuit 235.

Next, the potential of the wiring WL is set to turn off the transistor 311, whereby the node N1 is brought into a floating state and the potential at the node N1 is held (retention of configuration data). Here, the conduction state of the transistor 312 provided between the wiring IN and the wiring OUT is determined by the potential of the node N1. Accordingly, the conduction state between the wiring IN and the wiring OUT can be controlled by the control of the potential of the node N1. Since the memory circuit 300 including such a circuit 310 functions as a switch for controlling the conduction state between wirings, the memory circuit 300 can be used as a configuration memory of the RS 280. In the case where the memory circuit 300 is used as a configuration memory of the RS 280, the wiring IN and the wiring OUT are connected to the IO and the LE 240, respectively.

Note that the memory circuit 300 includes the circuit 310[1] and the circuit 310[1] which share the wiring OUT. By the supply of predetermined potentials to the wirings CTX[0] and CTX[1], one of the circuit 310[1] and the circuit 310[1] can be selected. Thus, the memory circuit 300 can be used as a multi-context configuration memory.

Specifically, when the context [0] is selected, the wiring CTX[0] is set to turn on the transistor 313 of the circuit 310[0]. In addition, the wiring CTX[1] is set to turn off the transistor 313 of the circuit 310[1]. In this way, the conduction state between the wiring IN and the wiring OUT is controlled by the potential of the node N1 in the circuit 310[0]. In the case where the context [1] is selected, the wiring CTX[0] is set to turn off the transistor 313 of circuit 310[1] and the wiring CTX[1] is set to turn on the transistor 313 of the circuit 310[1]. In this way, the conduction state between the wiring IN and the wiring OUT is controlled by the potential of the node N1 in the circuit 310[1]. Thus, the context for controlling the conduction state between the wiring IN and the wiring OUT can be selected by controlling the potentials of the wirings CTX[0] and CTX[1].

Here, the transistor 311 is an OS transistor and has an extremely low off-state current. Therefore, the potential of the node N1 can be kept for a long time in a period when the transistor 311 is in an off state. Consequently, the frequency of updates of configuration data can be drastically reduced, whereby power consumption of the PLD 200 can be reduced. Moreover, even in a period when the power supply to the circuit 310 is stopped, configuration data can be retained for a long time.

Moreover, by using an OS transistor, the circuit 310 can be formed of fewer transistors (three transistors in the circuit 310). Consequently, the area of the PLD 200 can be reduced. Furthermore, an OS transistor can be stacked over another transistor. When the transistor 311 is stacked over the transistor 312 or the transistor 313, the area of the circuit 310 can be reduced; as a result, the area of the 200 can be further reduced.

Moreover, in the case where a multi-context method is used in the PLD 200, configuration data corresponding to a plurality of contexts needs to be stored in a configuration memory, which might cause a significant increase of the area of the configuration memory. However, as described above, usage of the memory circuit 300 including an OS transistor can suppress the increase of the area of the configuration memory. For these reasons, it is particularly preferable to use an OS transistor in the PLD 200 employing the multi-context method.

Note that materials of the transistors other than the OS transistor are not particularly limited in FIG. 11A. For example, a transistor whose channel formation region is formed in part of a substrate including a single crystal semiconductor (the transistor is also referred to as a single crystal transistor below) may be used. As the substrate including a single crystal semiconductor, a single crystal silicon substrate, a single crystal germanium substrate, or the like can be given. Since the single crystal transistor can perform high-speed operation, the use of the single crystal transistor in the memory circuit allows the memory circuit to operate at higher speed. As each of the transistors other than the OS transistor, a transistor whose channel formation region is formed in a film including a semiconductor other than an oxide semiconductor can also be used. Examples of the semiconductor other than an oxide semiconductor include silicon, germanium, silicon germanium, silicon carbide, gallium arsenide, aluminum gallium arsenide, indium phosphide, gallium nitride, and an organic semiconductor. Each of the above semiconductors other than an oxide semiconductor may be a single crystal semiconductor or a non-single-crystal semiconductor such as an amorphous semiconductor, a microcrystalline semiconductor, or a polycrystalline semiconductor. These transistors can be used as the transistors other than the OS transistor described below.

Figure 11B:
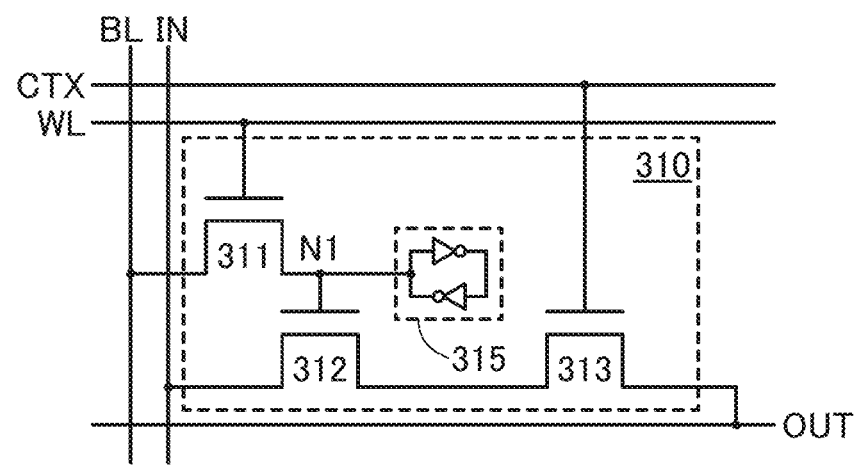

FIG. 11B illustrates another structure example of the circuit 310. The circuit 310 illustrated in FIG. 11B has a structure including a circuit 315 instead of the capacitor 314 of FIG. 11A. The circuit 315 forms an inverter loop. The potential of the node N1 can be kept to be a high-level potential or a low-level potential by the circuit 315. Note that the above-described transistors other than the OS transistor can be used as the transistor 311. In this case, the circuit 310 is volatile.

[Structure example 2]

Figure 12:
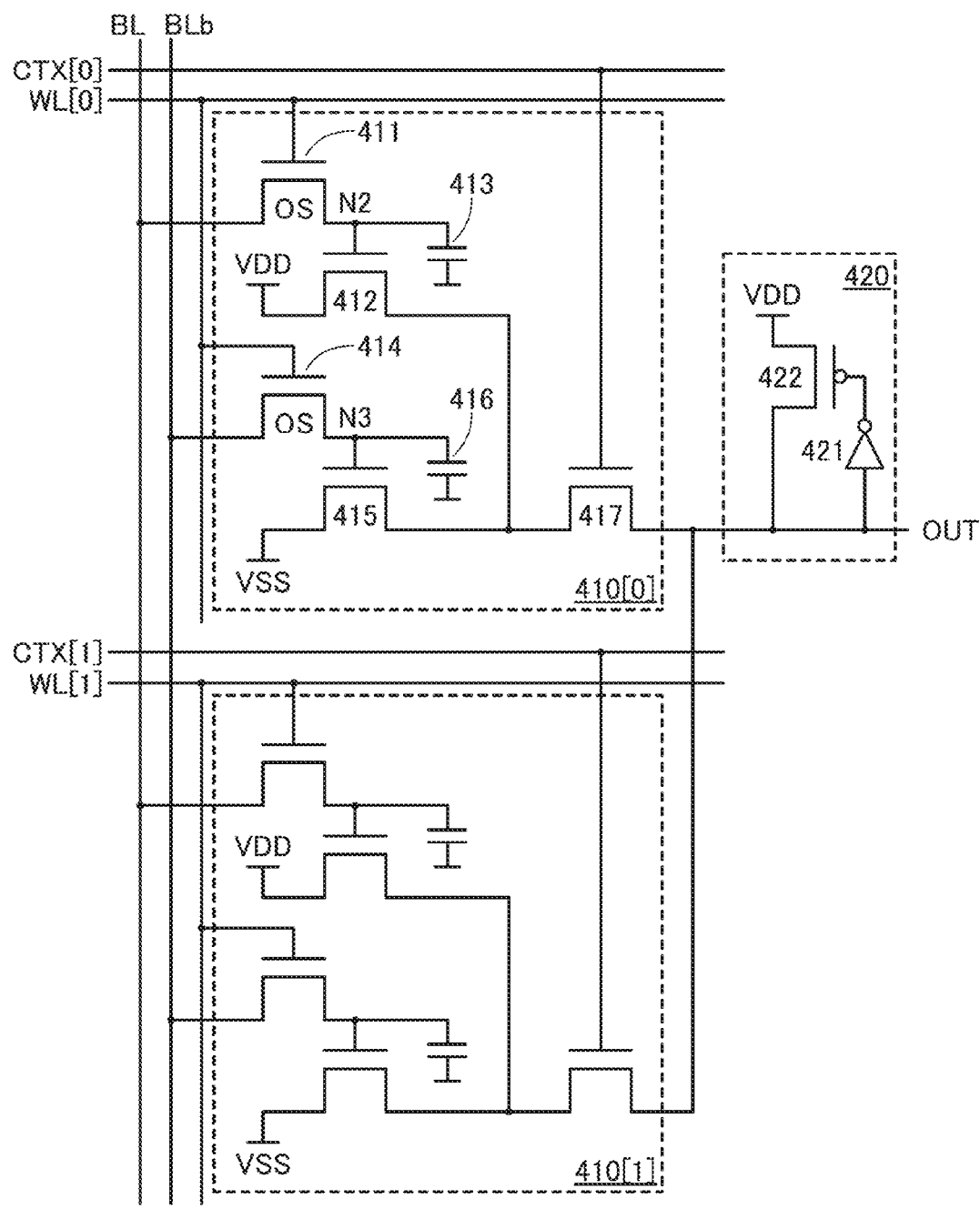
FIG. 12 illustrates a structure example of a circuit.

FIG. 12 illustrates a structure example of another memory circuit that can be used as the configuration memory. A memory circuit 400 includes circuits 410. Although two circuits 410 (circuits 410[1] and 410[1]) are illustrated in the example illustrated in FIG. 12, the number of circuits 410 is not limited to two.

The circuit 410 includes transistors 411 and 412, a capacitor 413, transistors 414 and 415, a capacitor 416, and a transistor 417. Although the transistors 411, 412, 414, 415, and 417 are of an n-channel type here, they may be of a p-channel type.

A gate of the transistor 411 is connected to a wiring WL, one of a source and a drain of the transistor 411 is connected to a gate of the transistor 412 and one electrode of the capacitor 413, and the other thereof is connected to a wiring BL. One of a source and a drain of the transistor 412 is connected to a wiring to which a predetermined potential (here, a high power supply potential VDD) is supplied, and the other thereof is connected to one of a source and a drain of the transistor 417. The other electrode of the capacitor 413 is connected to a wiring to which a predetermined potential is supplied. A gate of the transistor 414 is connected to the wiring WL, one of a source and a drain of the transistor 414 is connected to a gate of the transistor 415 and one electrode of the capacitor 416, and the other of the source and the drain of the transistor 414 is connected to a wiring BLb. One of a source and a drain of the transistor 415 is connected to a wiring to which a predetermined potential (here, a low power supply potential VSS, e.g., a ground potential) is supplied, and the other of the source and the drain of the transistor 415 is connected to one of the source and the drain of the transistor 417. The other electrode of the capacitor 416 is connected to a wiring to which a predetermined potential is supplied. A gate of the transistor 417 is connected to a wiring CTX, and the other of the source and the drain of the transistor 417 is connected to the wiring OUT.

Here, a node which is connected to the one of the source and the drain of the transistor 411, the gate of the transistor 412, and the one electrode of the capacitor 413 is referred to as a node N2. Furthermore, a node which is connected to the one of the source and the drain of the transistor 414, the gate of the transistor 415, and the one electrode of the capacitor 416 is referred to as a node N3. Note that an inversion signal of a signal that is supplied to the wiring BL is supplied to the wiring BLb.

A high-level potential is stored in one of the node N2 and the node N3 as configuration data, and a low-level potential is stored in the other of the node N2 and the node N3 as configuration data. Accordingly, one of the transistors 412 and 415 is on, and the other thereof is off. Thus, a high- or low-level potential can be selectively supplied to the wiring OUT. Since the memory circuit 400 including such a circuit 410 has a function of controlling a logical value output to the wiring OUT, the memory circuit 400 can be used as a configuration memory of the LE 240. In the case where the memory circuit 400 is used as a configuration memory of the LE 240, the wiring OUT is connected to other logic circuits, the RS 280, and the like. Note that storing the configuration data in the node N2 and the node N3 can be performed by an operation similar to the operation of the circuit 310 in FIG. 11A.

Note that the memory circuit 400 includes the circuit 410[1] and the circuit 410[1] which share the wiring OUT. By the supply of predetermined potentials to the wirings CTX[0] and CTX[1], one of the circuit 410[1] and the circuit 410[1] can be selected. Thus, the memory circuit 400 can be used as a multi-context configuration memory.

Specifically, when the context [0] is selected, the wiring CTX[0] is set to turn on the transistor 417 of the circuit 410[0]. In addition, the wiring CTX[1] is set to turn off the transistor 417 of the circuit 410[1]. In this way, the potential of the wiring OUT is controlled by the potentials of the nodes N2 and N3 in the circuit 410[0]. In the case where the context [1] is selected, the wiring CTX[0] is set to turn off the transistor 417 of the circuit 410[1] and the wiring CTX[1] is set to turn on the transistor 417 of the circuit 410[1]. In this way, the potential of the wiring OUT is controlled by the potentials of the nodes N2 and N3 in the circuit 410[1]. Thus, the context for controlling the potential of the wiring OUT can be selected by controlling the potentials of the wirings CTX[0] and CTX[1].

In the circuit 410, OS transistors are used as the transistors 411 and 414. Therefore, power consumption and the area can be reduced in the circuit 410, as in the circuit 310.

Furthermore, the memory circuit 400 may include a circuit 420. The circuit 420 includes an inverter 421 and a transistor 422. An input terminal and an output terminal of the inverter 421 are connected to the wiring OUT and a gate of the transistor 422, respectively. One of a source and a drain of the transistor 422 is connected to the wiring OUT, and the other thereof is connected to a wiring to which a predetermined potential (here, a high power supply potential VDD) is supplied. The circuit 420 has a function of retaining the potential of the wiring OUT, whereby the wiring OUT can be prevented from being floating. Thus, the potential of the wiring OUT can be prevented from being the intermediate potential, and generation of a shoot-through current in a circuit element connected to the output terminal OUT can be avoided.

Figure 13A:
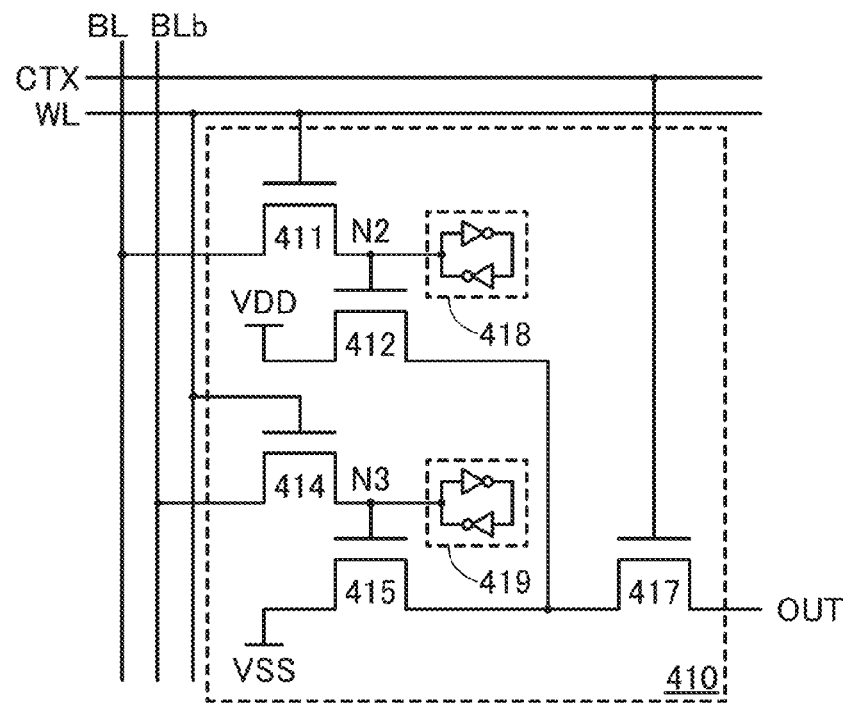
FIGS. 13A and 13B illustrate structure examples of a circuit.
Figure 13B:
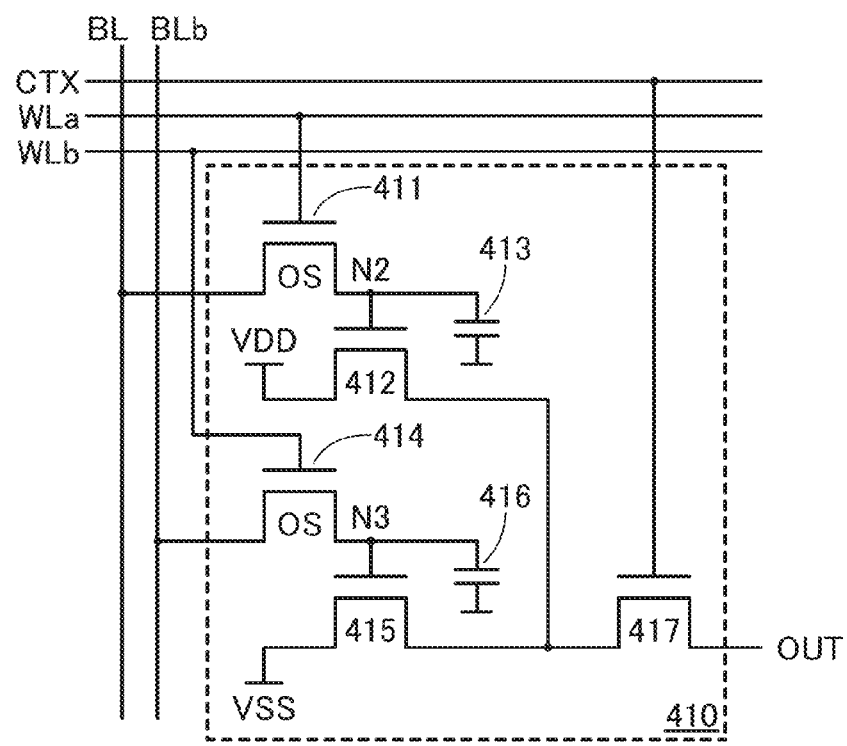

FIGS. 13A and 13B each illustrate another structure example of the circuit 410. The circuit 410 illustrated in FIG. 13A has a structure including circuits 418 and 419 instead of the capacitors 413 and 416 of FIG. 12. The circuits 418 and 419 each form an inverter loop. The potential of the node N2 can be kept to be a high-level potential or a low-level potential by the circuit 418, and the potential of the node N3 can be kept to be a high-level potential or a low-level potential by the circuit 419. Note that the above-described transistors other than the OS transistor can be used as the transistors 411 and 414. In this case, the circuit 410 is volatile.

Although the gate of the transistor 411 and the gate of the transistor 414 are connected to the same wiring WL in FIG. 12 and FIG. 13A, they may be connected to different wirings. FIG. 13B illustrates a structure in which the gate of the transistor 411 is connected to a wiring WLa and the gate of the transistor 414 is connected to a wiring WLb.

[Structure Example 3]

Figure 14:
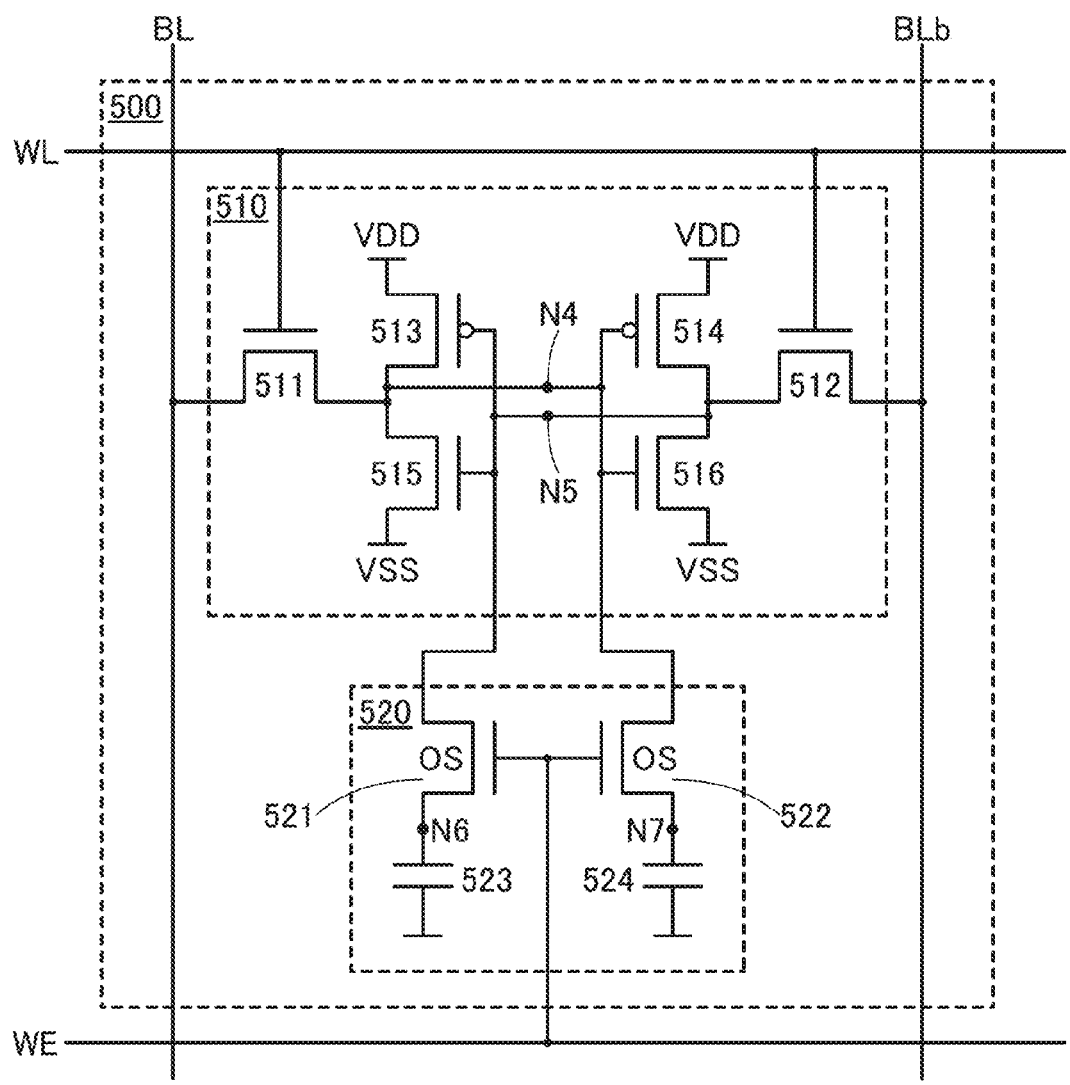
FIG. 14 illustrates a structure example of a circuit.

A circuit in which a nonvolatile memory and an OS transistor are combined can be used as the configuration memory. FIG. 14 illustrates a structure example of such a memory circuit. A structure example of a memory circuit 500 is illustrated. The memory circuit 500 includes a circuit 510 and a circuit 520. Note that the memory circuit 500 can be used as the transistor 311 and the circuit 315 in FIG. 11B, the transistor 411 and the circuit 418 in FIG. 13A, or the transistor 414 and the circuit 419 in FIG. 13A, for example.

The circuit 510 includes transistors 511 to 516. The transistors 511, 512, 515, and 516 are of an n-channel type, and the transistors 513 and 514 are of a p-channel type. Note that the transistors 511 and 512 may each be either an n-channel transistor or a p-channel transistor.

A gate of the transistor 511 is connected to a wiring WL. One of a source and a drain of the transistor 511 is connected to one of a source and a drain of the transistor 513, one of a source and a drain of the transistor 515, a gate of the transistor 514, and a gate of the transistor 516. The other of the source and the drain of the transistor 511 is connected to a wiring BL. A gate of the transistor 512 is connected to the wiring WL. One of a source and a drain of the transistor 512 is connected to one of a source and a drain of the transistor 514, one of a source and a drain of the transistor 516, a gate of the transistor 513, and a gate of the transistor 515. The other of the source and the drain of the transistor 512 is connected to a wiring BLb. The other of the source and the drain of the transistor 513 and the other of the source and the drain of the transistor 514 are each connected to a wiring to which a predetermined potential (here, a high power supply potential VDD) is supplied. The other of the source and the drain of the transistor 515 and the other of the source and the drain of the transistor 516 are each connected to a wiring to which a predetermined potential (here, a low power supply potential VSS) is supplied. A node which is connected to the gate of the transistor 513 and the gate of the transistor 515 is referred to as a node N5, and a node which is connected to the gate of the transistor 514 and the gate of the transistor 516 is referred to as a node N4.

In this manner, the circuit 510 has the structure of an SRAM cell, which is a volatile memory. The node N4 and the node N5 correspond to the nodes where configuration data is retained.

The circuit 520 includes transistors 521 and 522 and capacitors 523 and 524. Here, the transistors 521 and 522 are OS transistors.

A gate of the transistor 521 is connected to a wiring WE, one of a source and a drain of the transistor 521 is connected to one electrode of the capacitor 523, and the other of the source and the drain of the transistor 521 is connected to the node N5. A gate of the transistor 522 is connected to the wiring WE, one of a source and a drain of the transistor 522 is connected to one electrode of the capacitor 524, and the other of the source and the drain of the transistor 522 is connected to the node N4. The other electrode of the capacitor 523 and the other electrode of the capacitor 524 are each connected to a wiring to which a predetermined potential is supplied. The wiring to which a predetermined potential is supplied may be either a high-potential power supply line or a low-potential power supply line (e.g., a ground line). Alternatively, a wiring whose potential can be changed may be used. A node which is connected to the one of the source and the drain of the transistor 521 and the one electrode of the capacitor 523 is referred to as a node N6, and a node which is connected to the one of the source and the drain of the transistor 522 and the one electrode of the capacitor 524 is referred to as a node N7.

In the memory circuit 500, the node N4 corresponding to the node at which data is retained is connected to the node N7 through the transistor 522 which is the OS transistor. Similarly, in the memory circuit 500, the node N5 corresponding to the node at which data is retained is connected to the node N6 through the transistor 521 which is an OS transistor. Thus, the data retained in the circuit 510, which has the structure of an SRAM cell, can be backed up to the node N6 and the node N7. Furthermore, the data that has been backed up can be restored to the circuit 510.

Specifically, in a period where no data is written to or read from the circuit 510, the potential of the wiring WE is set to the high level to turn on the transistors 521 and 522, whereby the data retained at the node N4 and the data retained at the node N5 can be backed up to the node N7 and the node N6, respectively. After that, the potential of the wiring WE is set to the low level to turn off the transistors 521 and 522, whereby the potentials of the nodes N6 and N7 are retained. Then, the potential of the wiring WE is set to the high level again to turn on the transistors 521 and 522, whereby the data that have been backed up to the nodes N6 and N7 can be restored to the nodes N4 and N5. By making the high power supply potential VDD high at the time of data backup and low at the time of data restoration, data backup and restoration can be performed more stably.

Here, the transistors 521 and 522 are OS transistors and have extremely low off-state current. Therefore, when the transistors 521 and 522 are in the off state, the potential of the node N6 and the potential of the node N7 can be retained for a long time. Therefore, by backing up the data retained at the nodes N4 and N5 to the nodes N6 and N7 immediately before power supply to the memory circuit 500 is stopped, the data stored in the memory circuit 500 can be retained even when the power supply to the memory circuit 500 is stopped. After the power supply to the memory circuit 500 is restarted, the data retained at the nodes N6 and N7 can be restored to the nodes N4 and N5.

Since the memory circuit 500 has the structure of an SRAM cell, the transistors 511 to 516 are required to operate at high speed. Therefore, transistors including silicon in their channel formation regions (also referred to as Si transistors below) or the like are preferably used as the transistors 511 to 516.

In addition, in a period when power is supplied to the memory circuit 500 and the circuit 510 operates as an SRAM cell, the transistors 521 and 522 are preferably in the off state. This can prevent a hindrance to a high-speed operation of the circuit 510.

Although FIG. 14 illustrates an example in which the circuit 520 includes the transistors 521 and 522 and the capacitors 523 and 524, the transistor 521 and the capacitor 523 may be omitted, or the transistor 522 and the capacitor 524 may be omitted.

In FIG. 14, an SRAM cell including six transistors, which is a volatile memory cell, is used as the circuit 510; however, the structure is not limited thereto, and a different volatile memory cell may be used as the circuit 510. Also in the case where a different volatile memory cell is used, an OS transistor and a capacitor which are connected to the volatile memory cell as in FIG. 14 make it possible to back up and restore data.

In the above-described manner, in the memory circuit 500, data stored in the circuit 510 is backed up to and retained by the circuit 520; thus, the data can be retained even in a period where power is not supplied to the memory circuit 500. Furthermore, after the power supply is restarted, the data retained by the circuit 520 can be restored to the circuit 510. Accordingly, the power supply to the memory circuit 500 can be stopped in the data retention period, which can reduce the power consumption.

Moreover, an OS transistor can be stacked over a Si transistor. Therefore, the circuit 520 can be stacked over the circuit 510. Accordingly, an increase in the area of the memory circuit 500 can be suppressed.

[Structure Example 4]

Figure 15A:
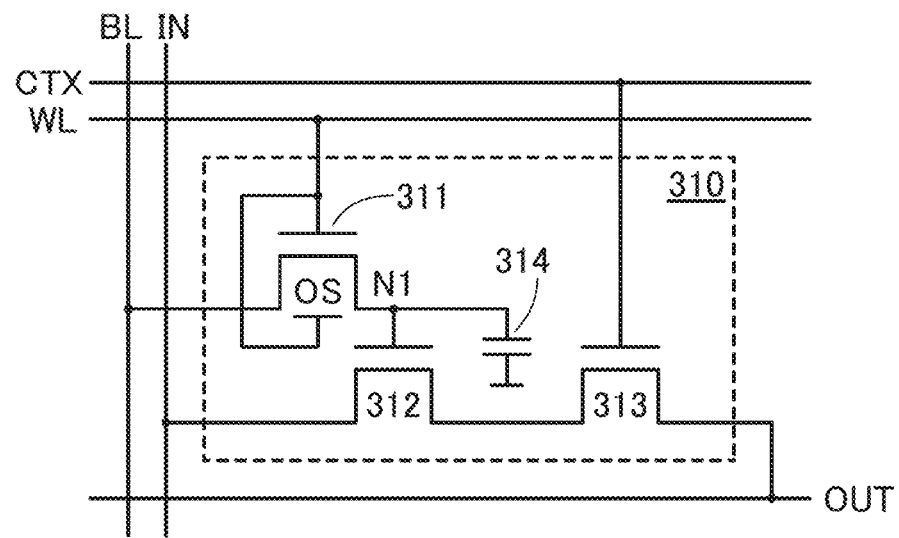
FIGS. 15A and 15B illustrate structure examples of a circuit.
Figure 15B:
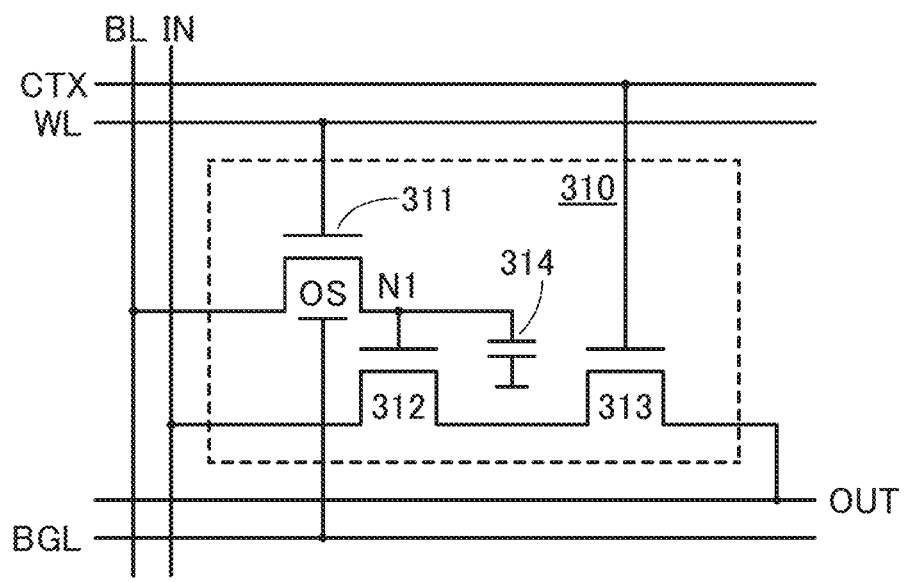

The OS transistor described in this embodiment may include a pair of gates. Taking the circuit 310 illustrated in FIG. 11A as an example, the structures in which the OS transistor is provided with a pair of gates is illustrated in FIGS. 15A and 15B. Note that one of a pair of gates in a transistor can be referred to as a front gate or, simply, a gate, and the other thereof can be referred to as a backgate.

The transistor 311 illustrated in FIG. 15A includes a backgate which is connected to the front gate. In this case, the potential of the front gate is equal to the potential of the backgate.

The transistor 311 illustrated in FIG. 15B includes a backgate connected to a wiring BGL. The wiring BGL has a function of supplying a predetermined potential to the backgate. The threshold voltage of the transistor 311 can be controlled by controlling the potential of the wiring BGL. The wiring BGL can be connected to the row driver circuit 235 (see FIG. 9). The potential of the wiring BGL can be controlled by the row driver circuit 235. Furthermore, the wiring BGL is shared by the circuits 310 in the same row.

Figure 16A:
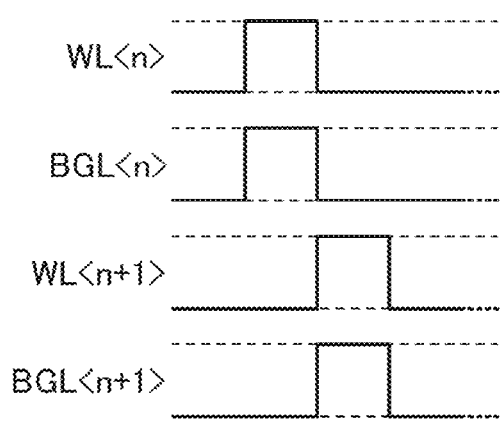
FIGS. 16A and 16B illustrate an operation example of a circuit.
Figure 16B:
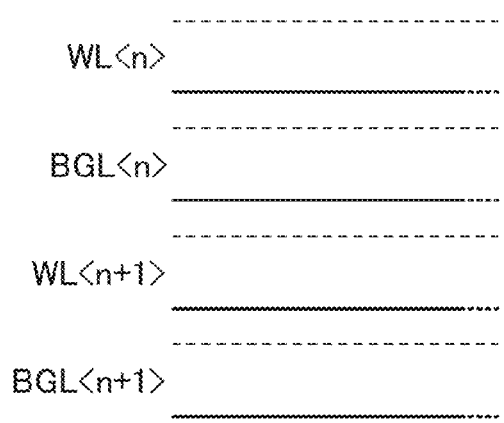

FIGS. 16A and 16B are timing charts for explaining an operation example of the transistor 311 provided with a backgate. FIG. 16A shows an operation of writing configuration data to the circuits 310 illustrated in FIG. 15B, and FIG. 16B shows an operation of retaining configuration data in the circuits 310. Note that the wiring BGL<n> represents the wiring BGL in the n-th row (n is a natural number), and the wiring BGL<n+1> represents the wiring BGL in the (n+1)-th row.

At the time of writing configuration data to the circuits 310, scanning of the wirings WL is performed, and the potentials of the wirings WL<n> and WL<n+1> are brought to the high level in order as shown in FIG. 16A. The potentials of the wirings BGL<n> and BGL<n+1> are also brought to the high level in order, in synchronization with the wirings WL<n> and WL<n+1>. Here, when the potential of the wiring WL is brought to the high level to turn on the transistor 311, the potential of the wiring BGL in the same row is also brought to the high level. This can shift the threshold voltage of the transistor 311 in the negative direction at the time of writing configuration data and increase the current value in the on state of the transistor 311.

In a period in which the configuration data stored in the circuits 310 is retained, the potentials of the wirings WL are brought to the low level to turn off the transistors 311, as shown in FIG. 16B. At this time, the potentials of the wirings BGL in the same rows are also brought to the low level. This can shift the threshold voltage of the transistors 311 in the positive direction and decrease the off-state current of the transistors 311, in a period in which configuration data is retained.

The operation shown in FIGS. 16A and 16B can also be performed in the circuit 310 illustrated in FIG. 15A. However, in the circuit 310 illustrated in FIG. 15A, an opening portion for connecting the front gate and the backgate of the transistor 311 needs to be provided inside the circuit 310, which might increase the area of the circuit 310. In contrast, in the case where the potentials of the pair of gates of the transistor 311 are controlled by different wirings as illustrated in FIG. 15B, such an opening portion does not need to be provided inside the circuit 310; accordingly, an increase in the area of the circuit 310 can be suppressed.

Although the examples in which the backgate is provided in the transistor 311 of the circuit 310 are illustrated in FIGS. 15A and 15B, any of the OS transistors in this embodiment can similarly be provided with a backgate.

As described above, using an OS transistor in a configuration memory in one embodiment of the present invention enables reductions in the area and power consumption of the PLD.

This embodiment can be combined with any of the other embodiments as appropriate.

Embodiment 3

In this embodiment, a computer including the semiconductor device of one embodiment of the present invention is described.

Figure 17:
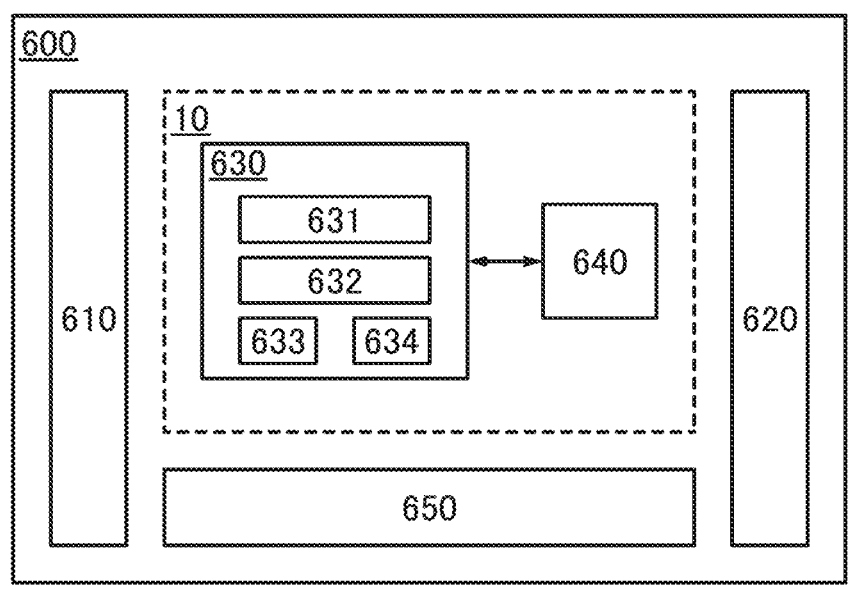
FIG. 17 illustrates a structure example of a computer.

FIG. 17 is a block diagram illustrating a structure example of the computer including the semiconductor device. A computer 600 includes an input device 610, an output device 620, a CPU 630, a PLD 640, and a memory device 650. A device including the CPU 630 and the PLD 640 corresponds to the semiconductor device 10 of the above embodiment.

The input device 610 has a function of receiving data input from the outside of the computer 600. The output device 620 has a function of outputting data to the outside of the computer 600.

The CPU 630 includes a control device 631, an arithmetic device 632, a memory device 633, and a memory device 634. The CPU 630 corresponds to the CPU 20 of the above embodiment.

The control device 631 has a function of outputting control signals to the input device 610, the output device 620, and the memory device 650 for controlling these devices. The arithmetic device 632 has a function of performing a computation using input data. The memory device 633 has a function of holding data that the arithmetic device 632 uses for a computation. The memory device 633 has a function of a register. The memory device 634 has a function of a cache memory.

The PLD 640 corresponds to the PLD 30 of the above-described embodiment. The CPU 630 has a function of controlling the PLD 640, and part of the processing performed in the CPU 630 can be executed in the PLD 640. The memory device 650 has a function of a main memory device.

The memory device 634 is capable of higher-speed access than the memory device 650. Thus, providing the memory device 634 can increase the processing speed of the CPU 630. As the memory device 634, the memory circuit 60 illustrated in FIG. 5 can be used, for example. In other words, the memory circuit 60 can be used as a cache memory.

The memory device 650 can be provided inside the semiconductor device 10. In this case, the memory circuit 60 illustrated in FIG. 5 can be used as the memory device 650, for example. In other words, the memory circuit 60 can be used as a main memory device.

This embodiment can be combined with any of the other embodiments as appropriate.

Embodiment 4

In this embodiment, a structure example of an OS transistor that can be used in the semiconductor devices or the like described in the above embodiments will be described.

<Structure Example 1 of Transistor>

Figure 18A:
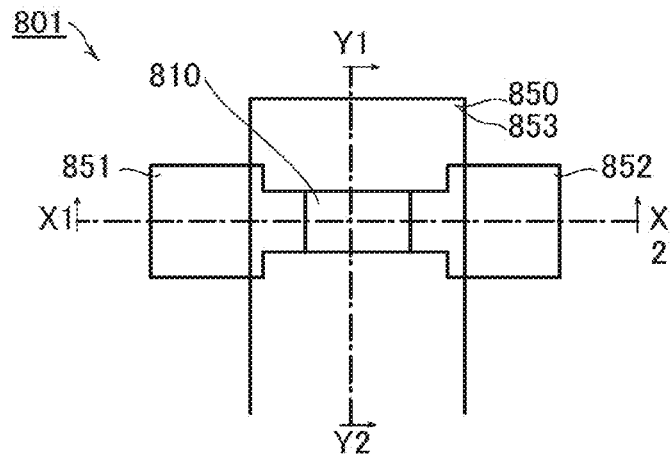
FIGS. 18A to 18C illustrate a structure example of a transistor.
Figure 18B:
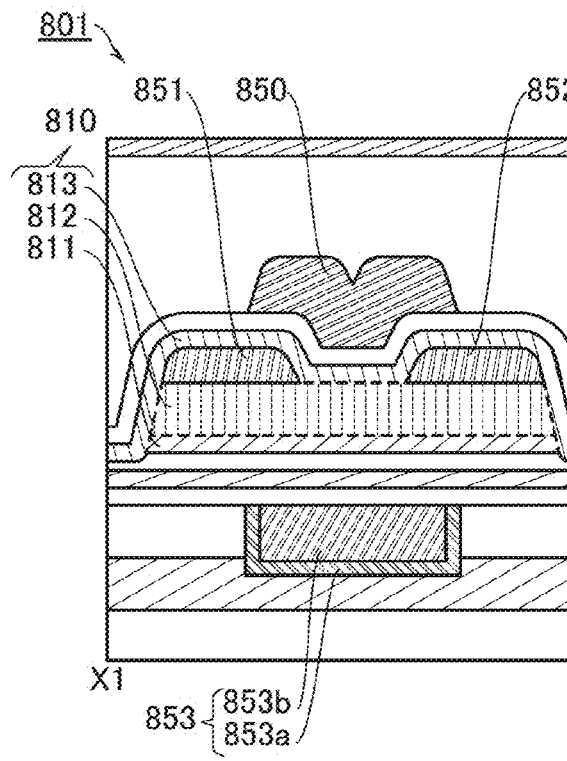
Figure 18C:
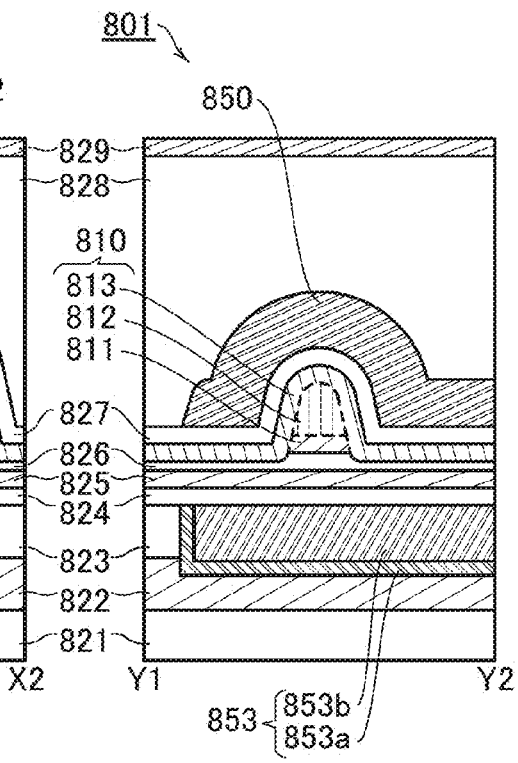

FIG. 18A is a top view illustrating a structure example of an OS transistor. FIG. 18B is a cross-sectional view taken along line X1-X2 in FIG. 18A. FIG. 18C is a cross-sectional view taken along line Y1-Y2 in FIG. 18A. In some cases, the direction of line X1-X2 is referred to as a channel length direction, and the direction of line Y1-Y2 is referred to as a channel width direction. Accordingly, FIG. 18B illustrates a cross-sectional structure of the OS transistor in the channel length direction, and FIG. 18C illustrates a cross-sectional structure of the OS transistor in the channel width direction. Note that to clarify the device structure, FIG. 18A does not illustrate some components.

An OS transistor 801 is formed over an insulating surface, here, over an insulating layer 821. The OS transistor 801 is covered with insulating layers 828 and 829. The OS transistor 801 includes insulating layers 822 to 827, metal oxide layers 811 to 813, and conductive layers 850 to 853.

The metal oxide layers 811 to 813 are collectively referred to as an oxide layer 810. As illustrated in FIGS. 18B and 18C, the oxide layer 810 includes a portion where the metal oxide layer 811, the metal oxide layer 812, and the metal oxide layer 813 are stacked in that order. When the OS transistor 801 is on, a channel is mainly formed in the metal oxide layer 812 of the oxide layer 810.

A gate electrode of the OS transistor 801 is formed using the conductive layer 850. A pair of electrodes that functions as a source electrode and a drain electrode of the OS transistor 801 is formed using the conductive layers 851 and 852. A back gate electrode of the OS transistor 801 is formed using the conductive layer 853. The conductive layer 853 includes conductive layers 853*a* and 853*b*. Note that the OS transistor 801 does not necessarily include a back gate electrode. The same applies to OS transistors 802 to 807 to be described later.

A gate insulating layer on a gate (front gate) side is formed using the insulating layer 827. A gate insulating layer on a back gate side is formed using a stack of the insulating layers 824 to 826. The insulating layer 828 is an interlayer insulating layer. The insulating layer 829 is a barrier layer.

The metal oxide layer 813 covers a stack of the metal oxide layers 811 and 812 and the conductive layers 851 and 852. The insulating layer 827 covers the metal oxide layer 813. The conductive layers 851 and 852 each include a region that overlaps with the conductive layer 850 with the metal oxide layer 813 and the insulating layer 827 positioned therebetween.

The conductive layers 851 and 852 are formed using a hard mask used for forming the stack of the metal oxide layers 811 and 812. For example, the metal oxide layers 811 and 812 and the conductive layers 851 and 852 can be formed through the following steps. A two-layer metal oxide film is formed. A conductive film is formed over the metal oxide film. This conductive film is etched, so that a hard mask is formed. With the use of this hard mask, the two-layer metal oxide film is etched to form the stack of the metal oxide layers 811 and 812. Then, the hard mask is etched to form the conductive layers 851 and 852. Since the conductive layers 851 and 852 are formed through these steps, the conductive layers 851 and 852 do not include regions that are in contact with side surfaces of the metal oxide layers 811 and 812.

[Conductive Layer]

Examples of a conductive material used for the conductive layers 850 to 853 include a semiconductor typified by polycrystalline silicon doped with an impurity element such as phosphorus; silicide such as nickel silicide; a metal such as molybdenum, titanium, tantalum, tungsten, aluminum, copper, chromium, neodymium, or scandium; and a metal nitride containing any of the above metals as its component (tantalum nitride, titanium nitride, molybdenum nitride, or tungsten nitride). A conductive material such as indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon oxide is added can be used.

With the use of a conductive material with a high work function for the conductive layer 850, it is possible to increase Vt of the OS transistor 801 and reduce cutoff current. For the conductive layer 850, a conductive material whose work function is preferably higher than or equal to 4.8 eV, further preferably higher than or equal to 5.0 eV, still further preferably higher than or equal to 5.2 eV, yet further preferably higher than or equal to 5.4 eV, still further preferably higher than or equal to 5.6 eV can be used. Examples of the conductive material with a high work function include molybdenum, molybdenum oxide, Pt, Pt silicide, Ni silicide, indium tin oxide, and an In—Ga—Zn oxide to which nitrogen is added.

Note that the cutoff current refers to drain current at gate-source voltage=0 V.

For example, the conductive layer 850 is a single layer of tantalum nitride or tungsten. Alternatively, in the case where the conductive layer 850 has a two-layer structure or a three-layer structure, the following combinations can be used: aluminum and titanium; titanium nitride and titanium; titanium nitride and tungsten; tantalum nitride and tungsten; tungsten nitride and tungsten; titanium, aluminum, and titanium; titanium nitride, aluminum, and titanium; and titanium nitride, aluminum, and titanium nitride. The conductor written first is used for a layer on the insulating layer 827 side.

The conductive layers 851 and 852 have the same layer structure. For example, in the case where the conductive layer 851 is a single layer, any of metals such as aluminum, titanium, chromium, nickel, copper, yttrium, zirconium, molybdenum, silver, tantalum, and tungsten, or an alloy containing any of these metals as its main component may be used. Alternatively, in the case where the conductive layer 851 has a two-layer structure or a three-layer structure layer, the following combinations can be used: titanium and aluminum; tungsten and aluminum; tungsten and copper; a copper-magnesium-aluminum alloy and copper; a titanium film and copper; titanium or titanium nitride, aluminum or copper, and titanium or titanium nitride; and molybdenum or molybdenum nitride, aluminum or copper, and molybdenum or molybdenum nitride. The conductor written first is used for a layer on the insulating layer 827 side.

For example, it is preferable that the conductive layer 853*a* be a conductive layer that has a hydrogen barrier property (e.g., a tantalum nitride layer) and that the conductive layer 853*b* be a conductive layer that has higher conductivity than the conductive layer 853*a* (e.g., tungsten). With such a structure, the conductive layer 853 functions as a wiring and has a function of suppressing diffusion of hydrogen into the oxide layer 810.

[Insulator]

Examples of insulating materials used for the insulating layers 821 to 829 include aluminum nitride, aluminum oxide, aluminum nitride oxide, aluminum oxynitride, magnesium oxide, silicon nitride, silicon oxide, silicon nitride oxide, silicon oxynitride, gallium oxide, germanium oxide, yttrium oxide, zirconium oxide, lanthanum oxide, neodymium oxide, hafnium oxide, tantalum oxide, and aluminum silicate. The insulating layers 821 to 829 are formed using a single-layer structure or a layered structure of these insulating materials. The layers used for the insulating layers 821 to 829 may include a plurality of insulating materials.

Note that in this specification and the like, an oxynitride refers to a compound that contains more oxygen than nitrogen, and a nitride oxide refers to a compound that contains more nitrogen than oxygen.

In order to suppress the increase in oxygen vacancies in the oxide layer 810, the insulating layers 826 to 828 preferably include oxygen. Further preferably, at least one of the insulating layers 826 to 828 is formed using an insulating film from which oxygen is released by heating (hereinafter such an insulating film is referred to as an insulating film containing excess oxygen). When oxygen is supplied from the insulating film containing excess oxygen to the oxide layer 810, the oxygen vacancies in the oxide layer 810 can be compensated. Thus, reliability and electrical characteristics of the OS transistor 801 can be improved.

The insulating film containing excess oxygen is a film from which oxygen molecules at more than or equal to $1.0 \times 10^{18}$ molecules/cm$^3$ are released in thermal desorption spectroscopy (TDS) at a surface temperature of the film of higher than or equal to 100° C. and lower than or equal to 700° C., or higher than or equal to 100° C. and lower than or equal to 500° C. The amount of released oxygen molecules is preferably more than or equal to $3.0 \times 10^{20}$ atoms/cm$^3$.

The insulating film containing excess oxygen can be formed by performing treatment for adding oxygen to an insulating film. The treatment for adding oxygen can be performed by heat treatment in an oxygen atmosphere, ion implantation, ion doping, plasma immersion ion implantation, plasma treatment, or the like. As a gas for adding oxygen, an oxygen gas of $^{16}O_2$, $^{18}O_2$, or the like, a nitrous oxide gas, an ozone gas, or the like can be used.

The concentration of hydrogen in the insulating layers 821 to 829 is preferably low in order to prevent the increase in the concentration of hydrogen in the oxide layer 810. In particular, the concentration of hydrogen in the insulating layers 823 to 828 is preferably low. Specifically, the concentration of hydrogen is lower than or equal to $2 \times 10^{20}$ atoms/cm$^3$, preferably lower than or equal to $5 \times 10^{19}$ atoms/cm$^3$, further preferably lower than or equal to $1 \times 10^{19}$ atoms/cm$^3$, still further preferably lower than or equal to $5 \times 10^{18}$ atoms/cm$^3$.

The concentration of nitrogen in the insulating layers 823 to 828 is preferably low in order to prevent the increase in the concentration of nitrogen in the oxide layer 810. Specifically, the concentration of nitrogen is lower than $5 \times 10^{19}$ atoms/cm$^3$, preferably lower than or equal to $5 \times 10^{18}$ atoms/cm$^3$, further preferably lower than or equal to $1 \times 10^{18}$ atoms/cm$^3$, still further preferably lower than or equal to $5 \times 10^{17}$ atoms/cm$^3$.

The hydrogen concentration and the nitrogen concentration are measured by secondary ion mass spectrometry (SIMS).

In the OS transistor 801, the oxide layer 810 is preferably surrounded by an insulating layer with oxygen and hydrogen barrier properties (hereinafter such an insulating layer is referred to as a barrier layer). With such a structure, it is possible to suppress the release of oxygen from the oxide layer 810 and entry of hydrogen into the oxide layer 810; thus, the reliability and electrical characteristics of the OS transistor 801 can be improved.

For example, the insulating layer 829 functions as a barrier layer and at least one of the insulating layers 821, 822, and 824 functions as a barrier layer. The barrier layer can be formed using a material such as aluminum oxide, aluminum oxynitride, gallium oxide, gallium oxynitride, yttrium oxide, yttrium oxynitride, hafnium oxide, hafnium oxynitride, or silicon nitride.

In addition, a barrier layer may be provided between the oxide layer 810 and the conductive layer 850. Alternatively, a metal oxide layer that has oxygen and hydrogen barrier properties may be provided as the metal oxide layer 813.

The film thicknesses of the insulating layer 824, the insulating layer 825, and the insulating layer 826 are preferably reduced so that the threshold voltage of the OS transistor can be easily controlled with the voltage of the conductive layer 850. For example, the film thicknesses of the insulating layers 824 to 826 are each smaller than or equal to 50 nm. The film thicknesses of the insulating layers 824 to 826 are each preferably smaller than or equal to 30 nm, further preferably smaller than or equal to 10 nm, still further preferably smaller than or equal to 5 nm.

A structure example of the insulating layers 821 to 829 is described. In this example, each of the insulating layers 821, 822, 825, and 829 functions as a barrier layer. The insulating layers 826 to 828 are oxide layers containing excess oxygen. The insulating layer 821 is formed using silicon nitride. The insulating layer 822 is formed using aluminum oxide. The insulating layer 823 is formed using silicon oxynitride. The gate insulating layers (824 to 826) on the back gate side are formed using a stack of silicon oxide, aluminum oxide, and silicon oxide. The gate insulating layer (827) on the front gate side is formed using silicon oxynitride. The interlayer insulating layer (828) is formed using silicon oxide. The insulating layer 829 is formed using aluminum oxide.

[Metal Oxide Layer]

The thickness of each of the metal oxide layers 811 to 813 is larger than or equal to 3 nm and smaller than or equal to 500 nm, preferably larger than or equal to 3 nm and smaller than or equal to 100 nm, further preferably larger than or equal to 3 nm and smaller than or equal to 60 nm.

In order to reduce the off-state current of the OS transistor 801, for example, the energy gap of the metal oxide layer 812 is preferably large. The energy gap of the metal oxide layer 812 is greater than or equal to 2.5 eV and less than or equal to 4.2 eV, preferably greater than or equal to 2.8 eV and less than or equal to 3.8 eV, further preferably greater than or equal to 3 eV and less than or equal to 3.5 eV.

The oxide layer 810 is preferably a crystalline metal oxide layer, where at least the metal oxide layer 812 is preferably a crystalline metal oxide layer. In this case, the OS transistor 801 can have high reliability and favorable electrical characteristics.

As the oxide of the metal oxide layer 812, typically, an In—Ga oxide, an In—Zn oxide, or an In-M-Zn oxide (M is Al, Ga, Y, or Sn) can be used. The metal oxide layer 812 is not limited to the oxide layer containing indium. The metal oxide layer 812 can be formed using a Zn—Sn oxide, a Ga—Sn oxide, or a Zn—Mg oxide, for example. The metal oxide layers 811 and 813 can be formed using an oxide that is similar to the oxide of the metal oxide layer 812. The metal oxide layers 811 and 813 can be formed using a Ga oxide. In that case, the metal oxide layer 812 is preferably a metal oxide layer containing Ga.

When an interface level is formed at an interface between the metal oxide layer 812 and the metal oxide layer 811, a channel region is also formed in a region close to the interface; thus, the threshold voltage of the OS transistor 801 varies. It is preferable that the metal oxide layer 811 contain at least one of the metal elements contained in the metal oxide layer 812. Accordingly, an interface state is hardly formed at the interface between the metal oxide layer 812 and the metal oxide layer 813, and variations in the electrical characteristics of the OS transistor 801, such as the threshold voltage, can be reduced.

The metal oxide layer 813 preferably contains at least one of the metal elements contained in the metal oxide layer 812 because interface scattering is unlikely to occur at the interface between the metal oxide layer 812 and the metal oxide layer 813, and carrier transfer is not inhibited. Thus, the field-effect mobility of the OS transistor 801 can be increased.

It is preferable that the metal oxide layer 812 have the highest carrier mobility among the metal oxide layers 811 to 813. Accordingly, a channel can be formed in the metal oxide layer 812 that is apart from the insulating layers 826 and 827.

For example, in a metal oxide containing In such as an In-M-Zn oxide, carrier mobility can be increased by an increase in the In content. In the In-M-Zn oxide, the s orbital of heavy metal mainly contributes to carrier transfer, and when the indium content is increased, overlaps of the s orbitals of In atoms are increased; therefore, an oxide having a high content of indium has higher mobility than an oxide having a low content of indium. Therefore, an oxide having a high content of indium is used as an oxide semiconductor film, so that carrier mobility can be increased.

For example, the metal oxide layer 812 is formed using an In—Ga—Zn oxide, and the metal oxide layers 811 and 813 are formed using a Ga oxide. For example, in the case where the metal oxide layers 811 to 813 are formed using an In-M-Zn oxide, the metal oxide layer 811 is formed to have the highest In content among the metal oxide layers 811 to 813. In the case where the In-M-Zn oxide is formed by sputtering, the In content can be changed by a change in the atomic ratio of metal elements of a target.

For example, it is preferable that the atomic ratio of metal elements of a target used for depositing the metal oxide layer 812 be In:M:Zn=1:1:1, 3:1:2, or 4:2:4.1. For example, it is preferable that the atomic ratio of metal elements of a target used for depositing the metal oxide layers 811 and 813 be In:M:Zn=1:3:2 or 1:3:4. The atomic ratio of an In-M-Zn oxide deposited using a target of In:M:Zn=4:2:4.1 is approximately In:M:Zn=4:2:3.

In order that the OS transistor 801 have stable electrical characteristics, it is preferable to reduce the concentration of impurities in the oxide layer 810. In the metal oxide, hydrogen, nitrogen, carbon, silicon, and a metal element other than a main component are impurities. For example, hydrogen and nitrogen form donor levels to increase the carrier density, and silicon and carbon form impurity levels in the oxide semiconductor. The impurity levels serve as traps and might cause deterioration in the electric characteristics of the transistor.

For example, the oxide layer 810 includes a region where the concentration of silicon is lower than or equal to $2 \times 10^{18}$ atoms/cm$^3$, preferably lower than or equal to $2 \times 10^{17}$ atoms/cm$^3$. The same applies to the concentration of carbon in the oxide layer 810.

The oxide layer 810 includes a region where the concentration of alkali metal is lower than or equal to $1 \times 10^{18}$ atoms/cm$^3$, preferably lower than or equal to $2 \times 10^{16}$ atoms/cm$^3$. The same applies to the concentration of alkaline earth metal.

The oxide layer 810 includes a region where the concentration of nitrogen is lower than $5 \times 10^{19}$ atoms/cm$^3$, preferably lower than or equal to $5 \times 10^{18}$ atoms/cm$^3$, further preferably lower than or equal to $1 \times 10^{18}$ atoms/cm$^3$, still further preferably lower than or equal to $5 \times 10^{17}$ atoms/cm$^3$.

The oxide layer 810 includes a region where the concentration of hydrogen is lower than $1 \times 10^{20}$ atoms/cm$^3$, preferably lower than $1 \times 10^{19}$ atoms/cm$^3$, further preferably lower than $5 \times 10^{18}$ atoms/cm$^3$, still further preferably lower than $1 \times 10^{18}$ atoms/cm$^3$.

The above-described concentrations of the impurities in the oxide layer 810 are measured by SIMS.

In the case where the metal oxide layer 812 contains oxygen vacancies, donor levels are formed by entry of hydrogen into sites of oxygen vacancies in some cases. As a result, the on-state current of the OS transistor 801 is decreased. Sites of oxygen vacancies become more stable by entry of oxygen than by entry of hydrogen. Thus, by decreasing oxygen vacancies in metal oxide layer 812, the on-state current of the OS transistor 801 can be increased in some cases. Consequently, preventing entry of hydrogen into sites of oxygen vacancies by a reduction in hydrogen in the metal oxide layer 812 is effective in improving on-state current characteristics.

Hydrogen contained in a metal oxide reacts with oxygen bonded to a metal atom to be water, and thus causes an oxygen vacancy, in some cases. Due to entry of hydrogen into the oxygen vacancy, an electron serving as a carrier is generated in some cases. Furthermore, in some cases, bonding of part of hydrogen to oxygen bonded to a metal atom causes generation of an electron serving as a carrier. Thus, the OS transistor 801 is likely to be normally-on when the metal oxide layer 812 contains hydrogen because the metal oxide layer 812 includes a channel formation region. Accordingly, it is preferable that hydrogen in the metal oxide layer 812 be reduced as much as possible.

FIGS. 18A to 18C illustrate examples in which the oxide layer 810 has a three-layer structure; however, one embodiment of the present invention is not limited thereto. For example, the oxide layer 810 may have a two-layer structure without the metal oxide layer 811 or 813. Alternatively, the oxide layer 810 may have a four-layer structure in which any one of the oxide semiconductor layers described as the metal oxide layers 811 to 813 is provided below or over the metal oxide layer 811 or below or over the metal oxide layer 813. Alternatively, the oxide layer 810 may include one or more metal oxide layers that are similar to the metal oxide layers 811 to 813 at two or more of the following positions: between given layers in the oxide layer 810, over the oxide layer 810, and below the oxide layer 810.

[Energy Band Structure]

Figure 25:
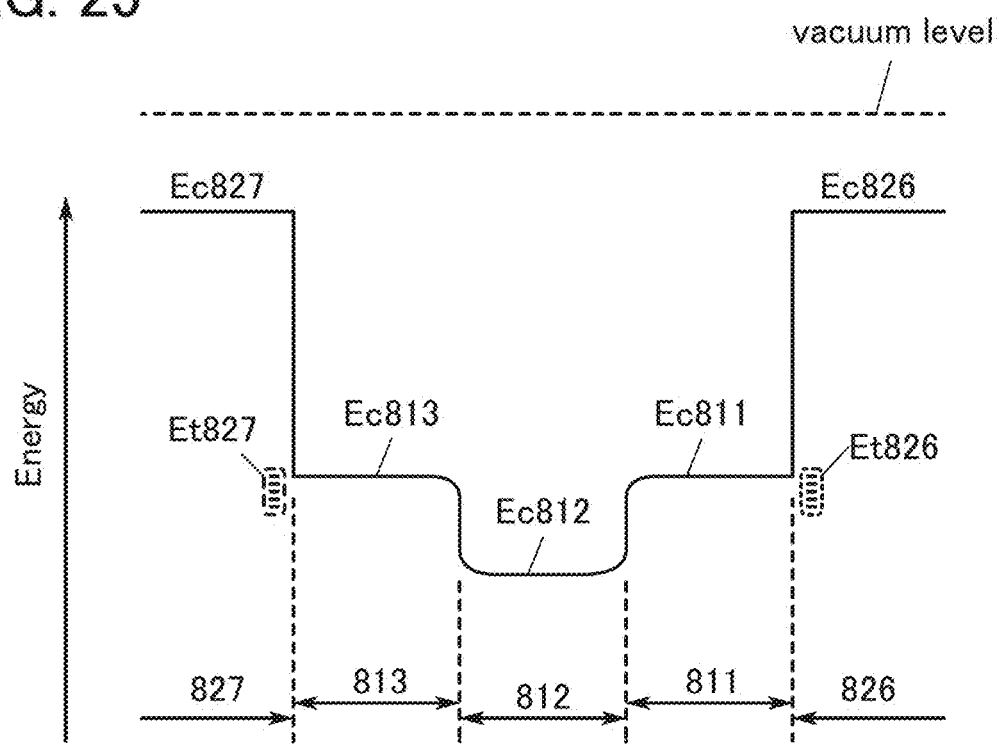
FIG. 25 is an energy band diagram.

Effects of the stack of the metal oxide layers 811 to 813 are described with reference to FIG. 25. FIG. 25 is a schematic diagram showing the energy band structure of a channel formation region of the OS transistor 801. Although the OS transistor 801 is described here as an example, effects of the stack of the metal oxide layers 811 to 813 in the OS transistors 802 and 803 to be described later are similar to those in the OS transistor 801.

Here, Ec826, Ec811, Ec812, Ec813, and Ec827 indicate the energy at the conduction band minimum of the insulating layer 826, the metal oxide layer 811, the metal oxide layer 812, the metal oxide layer 813, and the insulating layer 827, respectively.

Here, a difference in energy between the vacuum level and the conduction band minimum (the difference is also referred to as electron affinity) corresponds to a value obtained by subtracting an energy gap from a difference in energy between the vacuum level and the valence band maximum (the difference is also referred to as an ionization potential). The energy gap can be measured using a spectroscopic ellipsometer (UT-300 manufactured by HORIBA JOBIN YVON S.A.S.). The difference in energy between the vacuum level and the valence band maximum can be measured using an ultraviolet photoelectron spectroscopy (UPS) device (VersaProbe manufactured by ULVAC-PHI, Inc.).

Since the insulating layers 826 and 827 are insulators, Ec826 and Ec827 are closer to the vacuum level than Ec811, Ec812, and Ec813 (i.e., the insulating layers 826 and 827 have lower electron affinities than the metal oxide layers 811 to 813).

The metal oxide layer 812 has a higher electron affinity than the metal oxide layers 811 and 813. For example, the difference in electron affinity between the metal oxide layers 811 and 812 and the difference in electron affinity between the metal oxide layers 812 and 813 are each greater than or equal to 0.07 eV and less than or equal to 1.3 eV. The difference in electron affinity between the metal oxide layers 811 and 812 and the difference in electron affinity between the metal oxide layers 812 and 813 are each preferably greater than or equal to 0.1 eV and less than or equal to 0.7 eV, further preferably greater than or equal to 0.15 eV and less than or equal to 0.4 eV. Note that the electron affinity is a difference in energy between the vacuum level and the conduction band minimum.

When voltage is applied to the gate electrode (the conductive layer 850) of the OS transistor 801, a channel is mainly formed in the metal oxide layer 812 having the highest electron affinity among the metal oxide layers 811 to 813.

An indium gallium oxide has low electron affinity and a high oxygen-blocking property. Therefore, the metal oxide layer 813 preferably includes an indium gallium oxide. The gallium atomic ratio [Ga/(In+Ga)] is, for example, higher than or equal to 70%, preferably higher than or equal to 80%, further preferably higher than or equal to 90%.

In some cases, there is a mixed region of the metal oxide layers 811 and 812 between the metal oxide layers 811 and 812. Furthermore, in some cases, there is a mixed region of the metal oxide layers 812 and 813 between the metal oxide layers 812 and 813. Because the mixed region has low interface state density, a stack of the metal oxide layers 811 to 813 (the oxide layer 810) has a band structure where energy at each interface and in the vicinity of the interface is changed continuously (continuous junction).

Electrons transfer mainly through the metal oxide layer 812 in the oxide layer 810 having such an energy band structure. Therefore, even when an interface state exists at an interface between the metal oxide layer 811 and the insulating layer 826 or an interface between the metal oxide layer 813 and the insulating layer 827, electron movement in the oxide layer 810 is less likely to be inhibited and the on-state current of the OS transistor 801 can be increased.

Although trap states Et826 and Et827 due to impurities or defects might be formed in the vicinity of the interface between the metal oxide layer 811 and the insulating layer 826 and the vicinity of the interface between the metal oxide layer 813 and the insulating layer 827 as illustrated in FIG. 25, the metal oxide layer 812 can be separated from the trap states Et826 and Et827 owing to the existence of the metal oxide layers 811 and 813.

Note that when a difference in energy between Ec811 and Ec812 is small, an electron in the metal oxide layer 812 might reach the trap state Et826 by passing over the difference in energy. Since the electron is trapped at the trap state Et826, negative fixed charge is generated at the interface with the insulating film, causing the threshold voltage of the transistor to be shifted in a positive direction. The same applies to the case where a difference in energy between Ec812 and Ec813 is small.

Each of the difference in energy between Ec811 and Ec812 and the difference in energy between Ec812 and Ec813 is preferably greater than or equal to 0.1 eV, further preferably greater than or equal to 0.15 eV so that a change in the threshold voltage of the OS transistor 801 can be reduced and the OS transistor 801 can have favorable electrical characteristics.

<Structure Example 2 of Transistor>

The OS transistor 802 in FIGS. 19A to 19C is a modification example of the OS transistor 801. The conductive layer 850 of the OS transistor 802 includes a conductive layer 850*a*, a conductive layer 850*b*, and a conductive layer 850*c*.

The conductive layer 850*a* is preferably formed by thermal CVD, MOCVD, or ALD. In particular, the conductive layer 850*a* is preferably formed by atomic layer deposition (ALD). When the conductive layer 850*a* is formed by ALD or the like, plasma damage to the insulating layer 827 can be reduced or coverage can be improved. Therefore, the OS transistor 802 can be highly reliable.

The conductive layer 850*b* is formed using a material that has high conductivity, such as tantalum, tungsten, copper, or aluminum. The conductive layer 850*c* formed over the conductive layer 850*b* is preferably formed using a conductor that is unlikely to be oxidized, such as tungsten nitride. In the case where an oxide material from which oxygen is released is used for the insulating layer 828, the conductive layer 850 can be prevented from being oxidized by released oxygen. Thus, it is possible to suppress oxidation of the conductive layer 850 and efficiently supply oxygen released from the insulating layer 828 to the oxide layer 810.

When a conductor that is unlikely to be oxidized is used for the conductive layer 850*c* having a large contact area with the insulating layer 828 including an excess oxygen region, it is possible to suppress absorption of excess oxygen in the insulating layer 828 by the conductive layer 850. In addition, when a conductor with high conductivity is used for the conductive layer 850*b*, it is possible to provide the OS transistor 802 with low power consumption.

<Structure Example 3 of Transistor>

Figure 20A:
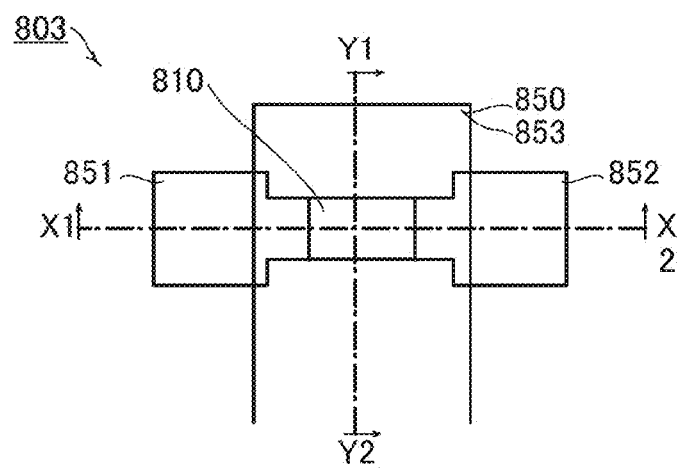
FIGS. 20A to 20C illustrate a structure example of a transistor.
Figure 20B:
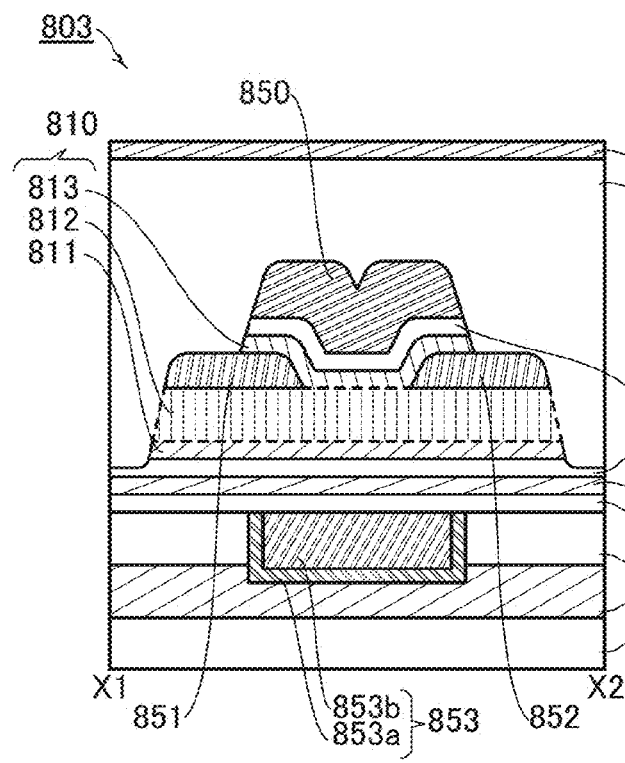
Figure 20C:
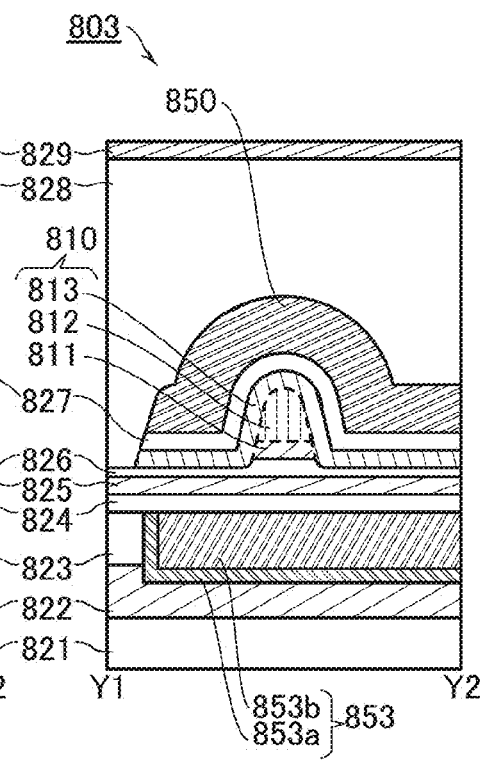

The OS transistor 803 in FIGS. 20A to 20C is a modification example of the OS transistor 801. In the OS transistor 803, the conductive layer 850 is used as an etching mask to etch the metal oxide layer 813 and the insulating layer 827.

<Structure Example 4 of Transistor>

The OS transistor 804 in FIGS. 21A to 21C is a modification example of the OS transistor 801.

The conductive layer 850 has a two-layer structure of the conductive layer 850*a* and the conductive layer 850*b*. The conductive layer 850 is covered with an insulating layer 830.

For example, the insulating layer 830 has an oxygen barrier property. Thus, oxygen released from the insulating layer 828 or the like can suppress oxidation of the conductive layer 850. In that case, a metal oxide such as aluminum oxide can be used for the insulating layer 830. The thickness of the insulating layer 830 is not limited to a certain thickness as long as oxidation of the conductive layer 850 can be prevented. For example, the thickness of the insulating layer 830 is greater than or equal to 1 nm and less than or equal to 10 nm, preferably greater than or equal to 3 nm and less than or equal to 7 nm.

Note that as in the case of the OS transistor 803, the metal oxide layer 813 and the insulating layer 827 in the OS transistor 804 may be partly removed so that upper surfaces of the conductive layers 851 and 852 are partly exposed. Alternatively, only the insulating layer 827 may be partly removed.

<Structure Example 5 of Transistor>

The OS transistor 805 in FIGS. 22A to 22C is a modification example of the OS transistor 801.

The conductive layer 851 has a two-layer structure of a conductive layer 851a and a conductive layer 851b, and the conductive layer 852 has a two-layer structure of a conductive layer 852a and a conductive layer 852b.

In the conductive layer 851, the conductive layers 851a and 852a are preferably formed using a conductive film that has high adhesion to the metal oxide layer 812. This conductive film is preferably formed by ALD because coverage thereof can be improved. The conductive layers 851b and 852b are preferably formed using a conductor that has higher conductivity than the conductive layers 851a and 852a. The use of the conductive layers 851a and 852a reduces restrictions on a conductive material that can be used for the conductive layers 851b and 852b. When a material that has high conductivity, such as tantalum, tungsten, copper, or aluminum, is used for the conductive layers 851a and 852a, power consumption of a circuit including the OS transistor 805 can be reduced.

<Structure example 6 of Transistor>

The OS transistor 806 in FIGS. 23A to 23C is a modification example of the OS transistor 801. The OS transistor 806 differs from the OS transistor 801 mainly in the structure of the gate electrode.

The metal oxide layer 813, the insulating layer 827, and the conductive layer 850 are provided in an opening portion formed in the insulating layer 828. In other words, a gate electrode can be formed in a self-aligning manner by using the opening portion of the insulating layer 828. Thus, in the OS transistor 806, a gate electrode (840) does not include a region that overlaps with a source electrode or a drain electrode (841 or 842) with a gate insulating layer (817) positioned therebetween. Accordingly, gate-source parasitic capacitance and gate-drain parasitic capacitance can be reduced and frequency characteristics can be improved. Furthermore, the gate electrode width can be controlled by the opening portion of the insulating layer 828; thus, it is easy to fabricate an OS transistor with a short channel length.

<Structure Example 7 of Transistor>

Figure 24A:
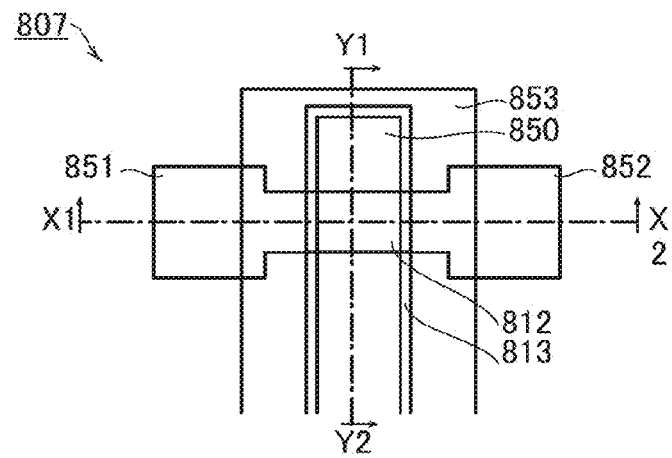
FIGS. 24A to 24C illustrate a structure example of a transistor.
Figures 24B, 24C:
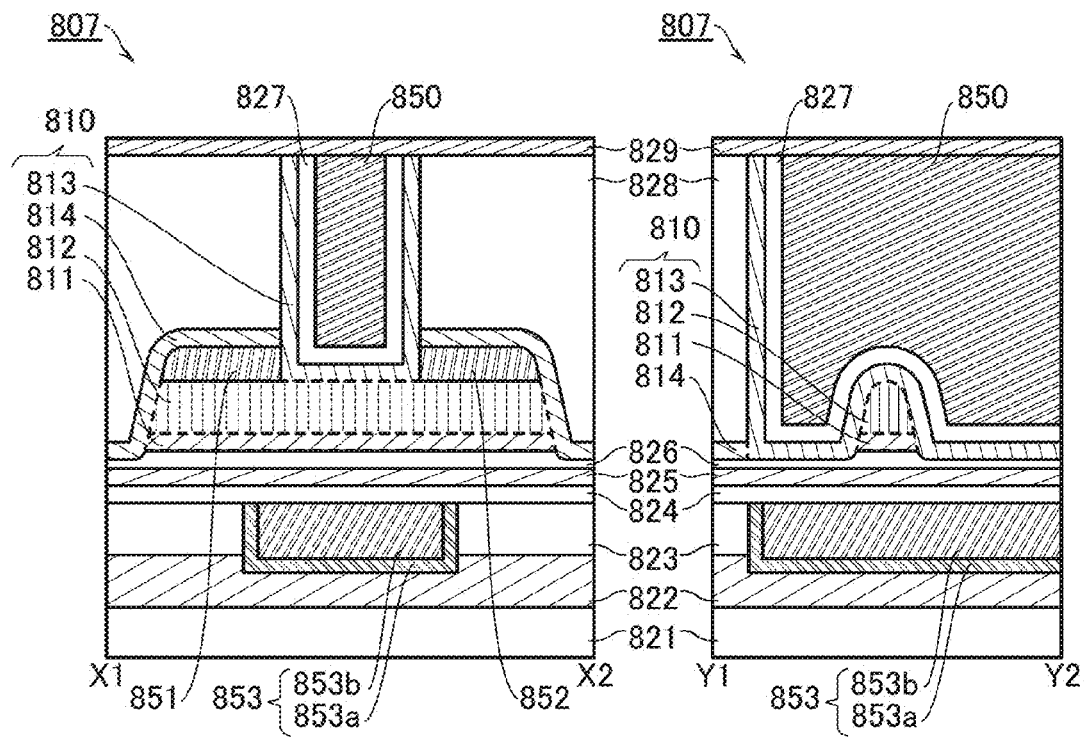

The OS transistor 807 in FIGS. 24A to 24C is a modification example of the OS transistor 806.

The oxide layer 810 further includes a metal oxide layer 814. The metal oxide layer 814 covers the metal oxide layers 811 and 812 and the conductive layers 851 and 852.

The metal oxide layer 812 is separated from the insulating layer 828 by the metal oxide layer 814. In the oxide layer 810, a channel is mainly formed in the metal oxide layer 812; thus, generation of a shallow level in the vicinity of the channel can be suppressed when there is no region where the metal oxide layer 812 is in contact with the insulating layer 828. Thus, reliability of the OS transistor 807 can be improved.

<Structure Example of Semiconductor Device>

Next, a structure example of a semiconductor device including an OS transistor and a Si transistor is described.

Figure 26:
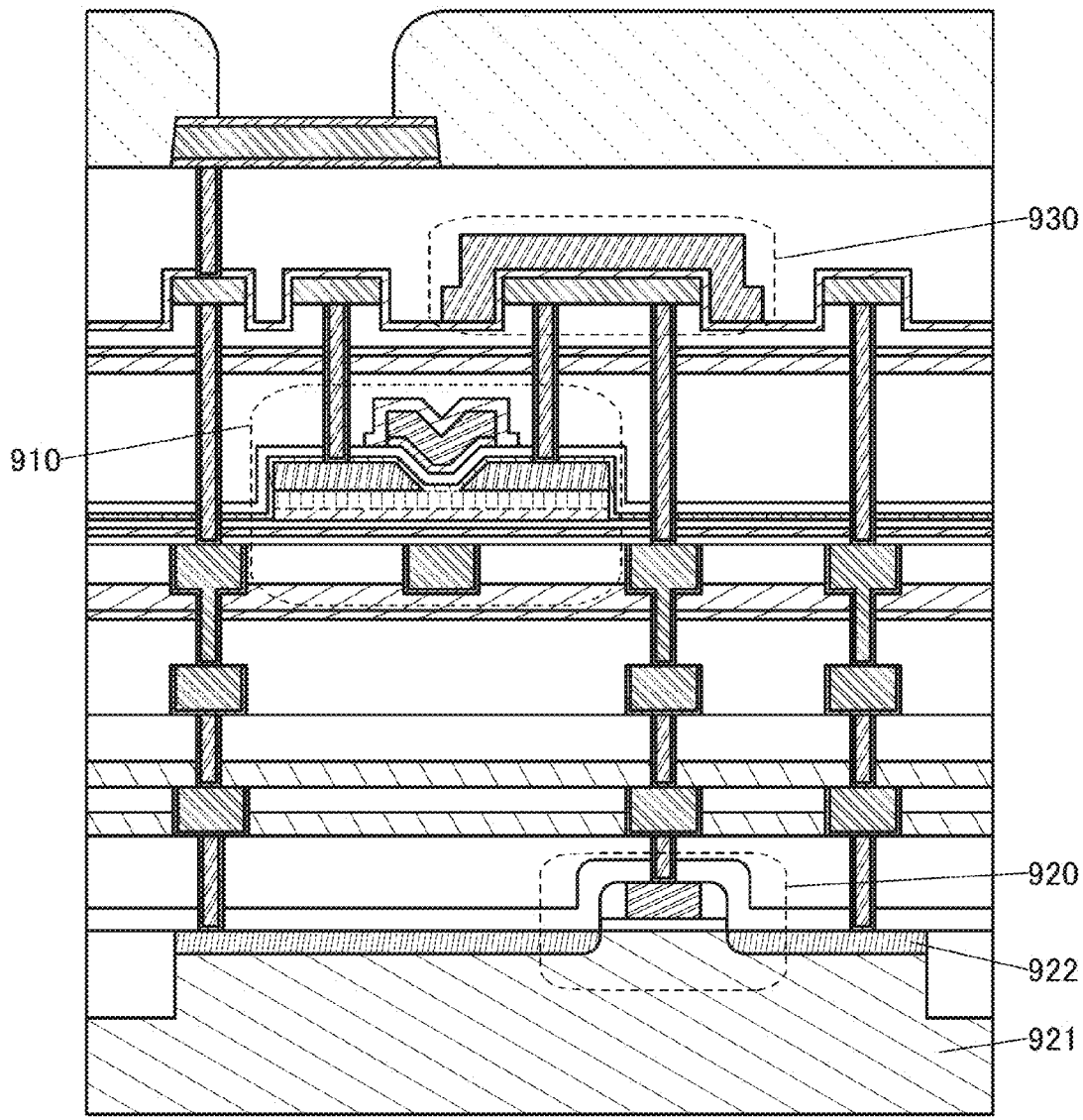
FIG. 26 illustrates a structure example of a semiconductor device.

FIG. 26 illustrates a structure example of a semiconductor device 900 including a transistor 910, a transistor 920, and a capacitor 930.

The transistor 910 is an OS transistor. As the transistor 910, an OS transistor described in this embodiment can be used.

The transistor 920 is a transistor whose channel formation region is formed in a semiconductor substrate 921. Specifically, a single crystal silicon substrate is used as the semiconductor substrate 921 here; accordingly, the transistor 920 is a Si transistor. The transistor 920 includes impurity regions 922 serving as a source region and a drain region.

The transistor 910 is stacked over the transistor 920. With this structure, the area of the semiconductor device 900 can be reduced.

One electrode of the capacitor 930 is connected to one of a source and a drain of the transistor 910 and a gate of the transistor 920. Furthermore, the capacitor 930 is stacked over the transistor 910. With this structure, the area of the semiconductor device 900 can be reduced.

The structure of the semiconductor device 900 can be applied to the semiconductor device described in the above embodiment, specifically to the circuits illustrated in FIGS. 11A and 11B to FIGS. 15A and 15B. For example, the transistor 910, the transistor 920, and the capacitor 930 can be used as the transistor 311, the transistor 312, and the capacitor 314, respectively, in FIG. 11A. Thus, the area of the configuration memory can be reduced.

This embodiment can be combined with any of the other embodiments as appropriate.

Embodiment 5

In this embodiment, an oxide semiconductor that can be used in an OS transistor described in the above embodiments is described.

<Crystal Structure of Oxide Semiconductor>

An oxide semiconductor is classified into a single crystal oxide semiconductor and a non-single-crystal oxide semiconductor. Examples of a non-single-crystal oxide semiconductor include a CAAC-OS, a polycrystalline oxide semiconductor, a nanocrystalline oxide semiconductor (nc-OS), an amorphous-like oxide semiconductor (a-like OS), and an amorphous oxide semiconductor.

From another perspective, an oxide semiconductor is classified into an amorphous oxide semiconductor and a crystalline oxide semiconductor. Examples of a crystalline oxide semiconductor include a single crystal oxide semiconductor, a CAAC-OS, a polycrystalline oxide semiconductor, and an nc-OS.

An amorphous structure is generally thought to be isotropic and have no non-uniform structure, to be metastable and not have fixed positions of atoms, to have a flexible bond angle, and to have a short-range order but have no long-range order, for example.

This means that a stable oxide semiconductor cannot be regarded as a completely amorphous oxide semiconductor. Moreover, an oxide semiconductor that is not isotropic (e.g., an oxide semiconductor that has a periodic structure in a microscopic region) cannot be regarded as a completely amorphous oxide semiconductor. In contrast, an a-like OS, which is not isotropic, has an unstable structure that contains a void. Because of its instability, an a-like OS is close to an amorphous oxide semiconductor in terms of physical properties.

In the following description, the term "parallel" indicates that the angle formed between two straight lines is greater than or equal to −10° and less than or equal to 10°, and accordingly also include the case where the angle is greater than or equal to −5° and less than or equal to 5°. In addition, the term "substantially parallel" indicates that the angle formed between two straight lines is greater than or equal to −30° and less than or equal to 30°. The term "perpendicular" indicates that the angle formed between two straight lines is greater than or equal to 80° and less than or equal to 100°, and accordingly also include the case where the angle is greater than or equal to 85° and less than or equal to 95°. In addition, the term "substantially perpendicular" indicates that the angle formed between two straight lines is greater than or equal to 60° and less than or equal to 120°. In this specification, trigonal and rhombohedral crystal systems are included in a hexagonal crystal system.

[CAAC-OS]

First, a CAAC-OS is described.

A CAAC-OS is one of oxide semiconductors having a plurality of c-axis aligned crystal parts (also referred to as pellets).

Figure 29A:
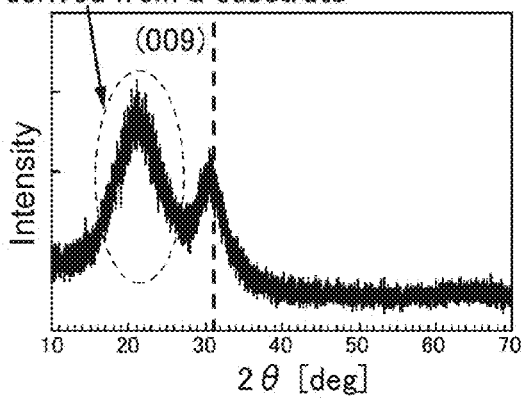
FIGS. 29A to 29E show structural analysis of a CAAC-OS and a single crystal oxide semiconductor by XRD and selected-area electron diffraction patterns of a CAAC-OS.

Analysis of a CAAC-OS by X-ray diffraction (XRD) is described. For example, when the structure of a CAAC-OS including an $InGaZnO_4$ crystal that is classified into the space group R-3m is analyzed by an out-of-plane method, a peak appears at a diffraction angle (2θ) of around 31° as shown in FIG. 29A. This peak is derived from the (009) plane of the $InGaZnO_4$ crystal, which indicates that crystals in the CAAC-OS have c-axis alignment, and that the c-axes are aligned in a direction substantially perpendicular to a surface over which the CAAC-OS film is formed (also referred to as a formation surface) or the top surface of the CAAC-OS film. Note that a peak sometimes appears at a 2θ of around 36° in addition to the peak at a 2θ of around 31°. The peak at a 2θ of around 36° is derived from a crystal structure that is classified into the space group Fd-3m; thus, this peak is preferably not exhibited in a CAAC-OS.

Figure 29B:
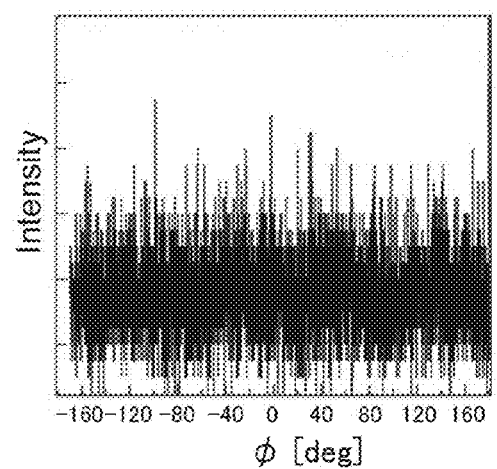
Figure 29C:
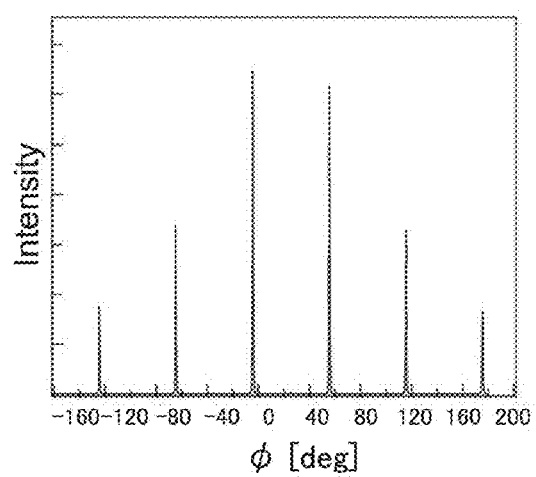

On the other hand, in structural analysis of the CAAC-OS by an in-plane method in which an X-ray is incident on the CAAC-OS in a direction parallel to the formation surface, a peak appears at a 2θ of around 56°. This peak is attributed to the (110) plane of the $InGaZnO_4$ crystal. When analysis (φ scan) is performed with 2θ fixed at around 56° and with the sample rotated using a normal vector to the sample surface as an axis (φ axis), as shown in FIG. 29B, a peak is not clearly observed. In contrast, in the case where single crystal $InGaZnO_4$ is subjected to φ scan with 2θ fixed at around 56°, as shown in FIG. 29C, six peaks that are derived from crystal planes equivalent to the (110) plane are observed. Accordingly, the structural analysis using XRD shows that the directions of a-axes and b-axes are irregularly oriented in the CAAC-OS.

Figure 29D:
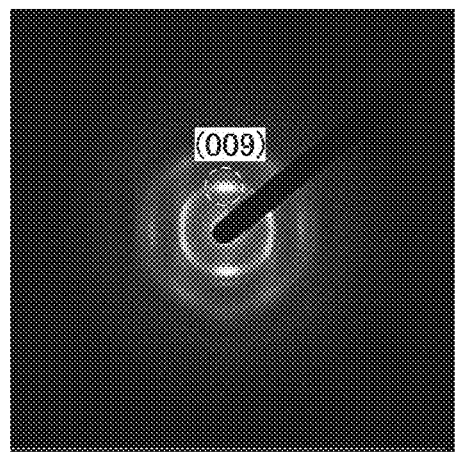
Figure 29E:
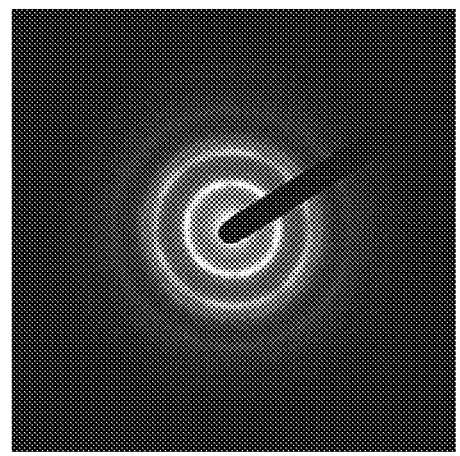

Next, a CAAC-OS analyzed by electron diffraction is described. For example, when an electron beam with a probe diameter of 300 nm is incident on a CAAC-OS including an $InGaZnO_4$ crystal in a direction parallel to the formation surface of the CAAC-OS, a diffraction pattern (also referred to as a selected-area electron diffraction pattern) shown in FIG. 29D can be obtained. In this diffraction pattern, spots derived from the (009) plane of an $InGaZnO_4$ crystal are included. Thus, the electron diffraction also indicates that pellets included in the CAAC-OS have c-axis alignment and that the c-axes are aligned in a direction substantially perpendicular to the formation surface or the top surface of the CAAC-OS. Meanwhile, FIG. 29E shows a diffraction pattern obtained in such a manner that an electron beam with a probe diameter of 300 nm is incident on the same sample in a direction perpendicular to the sample surface. As shown in FIG. 29E, a ring-like diffraction pattern is observed. Thus, the electron diffraction using an electron beam with a probe diameter of 300 nm also indicates that the a-axes and b-axes of the pellets included in the CAAC-OS do not have regular orientation. The first ring in FIG. 29E is considered to be derived from the (010) plane, the (100) plane, and the like of the $InGaZnO_4$ crystal. The second ring in FIG. 29E is considered to be derived from the (110) plane and the like.

In a combined analysis image (also referred to as a high-resolution TEM image) of a bright-field image and a diffraction pattern of a CAAC-OS, which is obtained using a transmission electron microscope (TEM), a plurality of pellets can be observed. However, even in the high-resolution TEM image, a boundary between pellets, that is, a grain boundary is not clearly observed in some cases. Thus, in the CAAC-OS, a reduction in electron mobility due to the grain boundary is less likely to occur.

FIG. 30A shows a high-resolution TEM image of a cross section of the CAAC-OS that is observed from a direction substantially parallel to the sample surface.

The high-resolution TEM image is obtained with a spherical aberration corrector function. The high-resolution TEM image obtained with a spherical aberration corrector function is particularly referred to as a Cs-corrected high-resolution TEM image. The Cs-corrected high-resolution TEM image can be observed with, for example, an atomic resolution analytical electron microscope JEM-ARM200F manufactured by JEOL Ltd.

FIG. 30A shows pellets in which metal atoms are arranged in a layered manner. FIG. 30A proves that the size of a pellet is greater than or equal to 1 nm or greater than or equal to 3 nm. Therefore, the pellet can also be referred to as a nanocrystal (nc). Furthermore, the CAAC-OS can also be referred to as an oxide semiconductor including c-axis aligned nanocrystals (CANC). A pellet reflects unevenness of a formation surface or a top surface of the CAAC-OS, and is parallel to the formation surface or the top surface of the CAAC-OS.

FIGS. 30B and 30C show Cs-corrected high-resolution TEM images of a plane of the CAAC-OS observed from a direction substantially perpendicular to the sample surface. FIGS. 30D and 30E are images obtained through image processing of FIGS. 30B and 30C. The method of image processing is as follows. The image in FIG. 30B is subjected to fast Fourier transform (FFT), so that FFT images are obtained. Then, mask processing is performed such that a range of from 2.8 $nm^{-1}$ to 5.0 $nm^{-1}$ from the origin point in the obtained FFT images remains. After the mask processing, the FFT images are processed by inverse fast Fourier transform (IFFT) to obtain processed images. The images obtained in this manner are called FFT filtering images. An FFT filtering image is a Cs-corrected high-resolution TEM image from which a periodic component is extracted, and shows a lattice arrangement.

In FIG. 30D, a portion where a lattice arrangement is broken is denoted with a dashed line. A region surrounded by a dashed line is one pellet. The portion denoted with the dashed line is a junction of pellets. The dashed line draws a hexagon, which means that the pellet has a hexagonal shape. Note that the shape of the pellet is not always a regular hexagon but is a non-regular hexagon in many cases.

In FIG. 30E, a dotted line denotes a portion where the direction of a lattice arrangement is changed between a region with a regular lattice arrangement and another region with a regular lattice arrangement, and a dashed line denotes the change in the direction of the lattice arrangement. A clear crystal grain boundary cannot be observed even in the vicinity of the dotted line. When a lattice point in the vicinity of the dotted line is regarded as a center and surrounding lattice points are joined, a distorted hexagon, pentagon, and/or heptagon can be formed. That is, a lattice arrangement is distorted so that formation of a crystal grain boundary is inhibited. This is probably because the CAAC-OS can tolerate distortion owing to a low density of the atomic arrangement in an a-b plane direction, the interatomic bond distance changed by substitution of a metal element, and the like.

As described above, the CAAC-OS has c-axis alignment, its pellets (nanocrystals) are connected in an a-b plane direction, and the crystal structure has distortion. For this reason, the CAAC-OS can also be referred to as an oxide semiconductor including a c-axis-aligned a-b-plane-anchored (CAA) crystal.

The CAAC-OS is an oxide semiconductor with high crystallinity. Entry of impurities, formation of defects, or the like might decrease the crystallinity of an oxide semiconductor. This means that the CAAC-OS has small amounts of impurities and defects (e.g., oxygen vacancies).

Note that the impurity means an element other than the main components of the oxide semiconductor, such as hydrogen, carbon, silicon, or a transition metal element. For example, an element (specifically, silicon or the like) having higher strength of bonding to oxygen than a metal element included in an oxide semiconductor extracts oxygen from the oxide semiconductor, which results in disorder of the atomic arrangement and reduced crystallinity of the oxide semiconductor. A heavy metal such as iron or nickel, argon, carbon dioxide, or the like has a large atomic radius (or molecular radius), and thus disturbs the atomic arrangement of the oxide semiconductor and decreases crystallinity.

[nc-OS]

Next, an nc-OS is described.

Analysis of an nc-OS by XRD is described. When the structure of an nc-OS is analyzed by an out-of-plane method, a peak indicating orientation does not appear. That is, a crystal of an nc-OS does not have orientation.

Figure 31A:
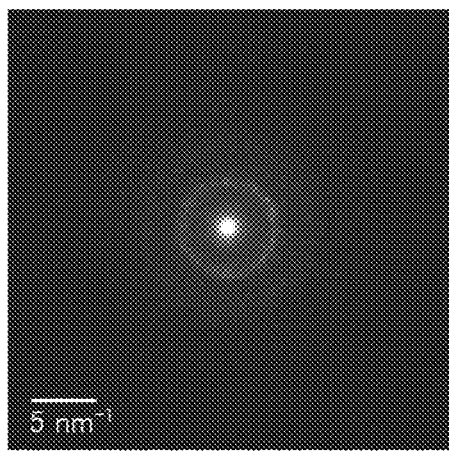
FIGS. 31A to 31D show electron diffraction patterns and a cross-sectional TEM image of an nc-OS.
Figure 31B:
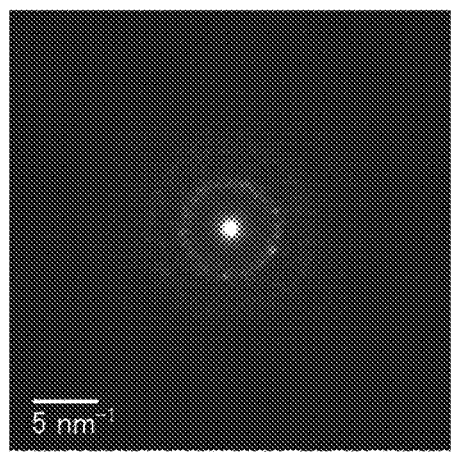

For example, when an electron beam with a probe diameter of 50 nm is incident on a 34-nm-thick region of thinned nc-OS including an $InGaZnO_4$ crystal in a direction parallel to the formation surface, a ring-shaped diffraction pattern (a nanobeam electron diffraction pattern) shown in FIG. 31A is observed. FIG. 31B shows a diffraction pattern obtained when an electron beam with a probe diameter of 1 nm is incident on the same sample. As shown in FIG. 31B, a plurality of spots are observed in a ring-like region. In other words, ordering in an nc-OS is not observed with an electron beam with a probe diameter of 50 nm but is observed with an electron beam with a probe diameter of 1 nm.

Figure 31C:
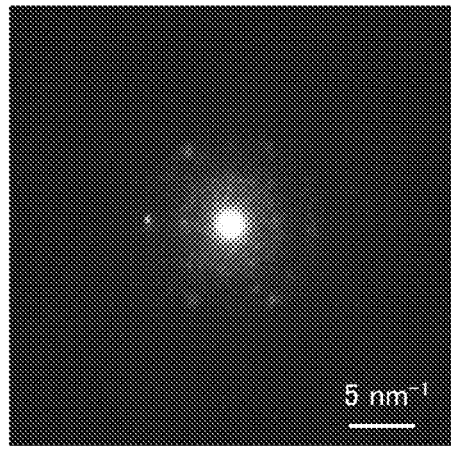

Furthermore, an electron diffraction pattern in which spots are arranged in an approximately regular hexagonal shape is observed in some cases as shown in FIG. 31C when an electron beam having a probe diameter of 1 nm is incident on a region with a thickness of less than 10 nm. This means that an nc-OS has a well-ordered region, i.e., a crystal, in the range of less than 10 nm in thickness. Note that an electron diffraction pattern having regularity is not observed in some regions because crystals are aligned in various directions.

Figure 31D:
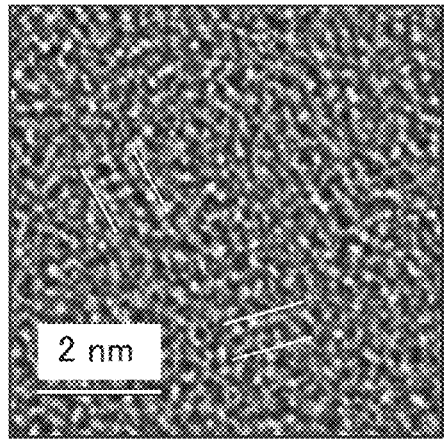

FIG. 31D shows a Cs-corrected high-resolution TEM image of a cross section of an nc-OS observed from the direction substantially parallel to the formation surface. In a high-resolution TEM image, an nc-OS has a region in which a crystal part is observed, such as the part indicated by additional lines in FIG. 31D, and a region in which a crystal part is not clearly observed. In most cases, the size of a crystal part included in the nc-OS is greater than or equal to 1 nm and less than or equal to 10 nm, or specifically, greater than or equal to 1 nm and less than or equal to 3 nm. Note that an oxide semiconductor including a crystal part whose size is greater than 10 nm and less than or equal to 100 nm is sometimes referred to as a microcrystalline oxide semiconductor. In a high-resolution TEM image of the nc-OS, for example, a grain boundary is not clearly observed in some cases. Note that there is a possibility that the origin of the nanocrystal is the same as that of a pellet in a CAAC-OS. Therefore, a crystal part of the nc-OS may be referred to as a pellet in the following description.

As described above, in the nc-OS, a microscopic region (for example, a region with a size greater than or equal to 1 nm and less than or equal to 10 nm, in particular, a region with a size greater than or equal to 1 nm and less than or equal to 3 nm) has a periodic atomic arrangement. There is no regularity of crystal orientation between different pellets in the nc-OS. Thus, the orientation of the whole film is not ordered. Accordingly, the nc-OS cannot be distinguished from an a-like OS or an amorphous oxide semiconductor, depending on an analysis method.

Since there is no regularity of crystal orientation between the pellets (nanocrystals) as mentioned above, the nc-OS can also be referred to as an oxide semiconductor including random aligned nanocrystals (RANC) or an oxide semiconductor including non-aligned nanocrystals (NANC).

The nc-OS is an oxide semiconductor that has high regularity as compared with an amorphous oxide semiconductor. Therefore, the nc-OS is likely to have a lower density of defect states than an a-like OS and an amorphous oxide semiconductor. Note that there is no regularity of crystal orientation between different pellets in the nc-OS. Therefore, the nc-OS has a higher density of defect states than the CAAC-OS.

[a-like OS]

An a-like OS has a structure between those of the nc-OS and the amorphous oxide semiconductor.

Figure 32A:
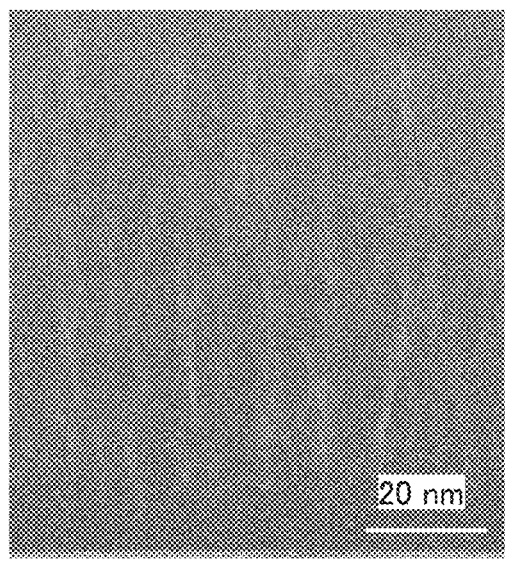
FIGS. 32A and 32B show cross-sectional TEM images of an a-like OS.
Figure 32B:
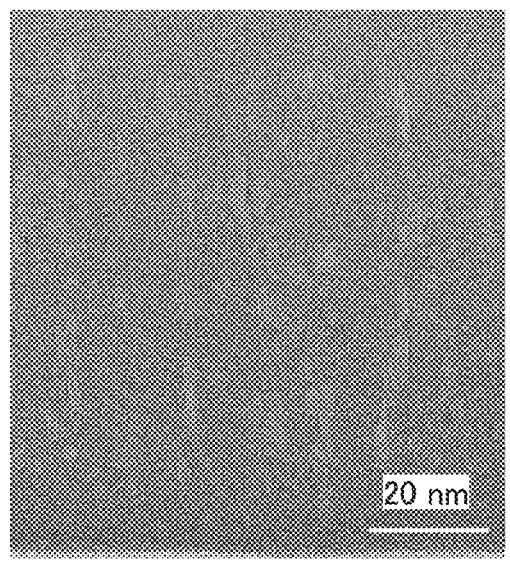

FIGS. 32A and 32B are high-resolution cross-sectional TEM images of an a-like OS. FIG. 32A is the high-resolution cross-sectional TEM image of the a-like OS at the start of the electron irradiation. FIG. 32B is the high-resolution cross-sectional TEM image of a-like OS after the electron ($e^-$) irradiation at $4.3 \times 10^8$ $e^-/nm^2$. FIGS. 32A and 32B show that stripe-like bright regions extending vertically are observed in the a-like OS from the start of the electron irradiation. It can be also found that the shape of the bright region changes after the electron irradiation. Note that the bright region is presumably a void or a low-density region.

The a-like OS has an unstable structure because it contains a void. To verify that an a-like OS has an unstable structure as compared with a CAAC-OS and an nc-OS, a change in structure caused by electron irradiation is described below.

An a-like OS, an nc-OS, and a CAAC-OS are prepared as samples. Each of the samples is an In—Ga—Zn oxide.

First, a high-resolution cross-sectional TEM image of each sample is obtained. The high-resolution cross-sectional TEM images show that all the samples have crystal parts.

It is known that a unit cell of an $InGaZnO_4$ crystal has a structure in which nine layers including three In—O layers and six Ga—Zn—O layers are stacked in the c-axis direction. The distance between the adjacent layers is equivalent to the lattice spacing on the (009) plane (also referred to as d value). The value is calculated to be 0.29 nm from crystal structural analysis. Accordingly, a portion where the spacing between lattice fringes is greater than or equal to 0.28 nm and less than or equal to 0.30 nm is regarded as a crystal part of InGaZnO$_4$ in the following description. Each of lattice fringes corresponds to the a-b plane of the InGaZnO$_4$ crystal.

Figure 33:
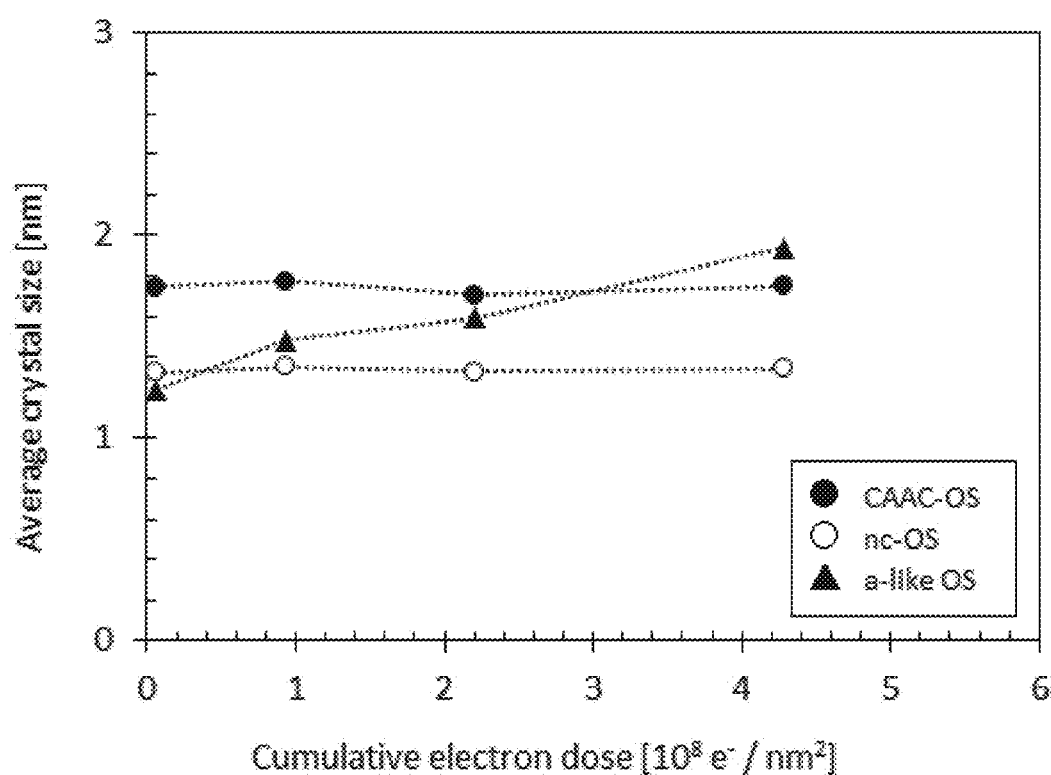
FIG. 33 shows a change in crystal part of an In—Ga—Zn oxide induced by electron irradiation.

FIG. 33 shows a change in the average size of crystal parts (at 22 points to 30 points) in each sample. Note that the crystal part size corresponds to the length of a lattice fringe. FIG. 33 indicates that the crystal part size in the a-like OS increases with an increase in the cumulative electron dose in obtaining TEM images, for example. As shown in FIG. 33, a crystal part of approximately 1.2 nm (also referred to as an initial nucleus) at the start of TEM observation grows to a size of approximately 1.9 nm at a cumulative electron (e$^-$) dose of $4.2\times10^8$ e$^-$/nm$^2$. In contrast, the crystal part size in the nc-OS and the CAAC-OS shows little change from the start of electron irradiation to a cumulative electron dose of $4.2\times10^8$ e$^-$/nm$^2$. As shown in FIG. 33, the crystal part sizes in an nc-OS and a CAAC-OS are approximately 1.3 nm and approximately 1.8 nm, respectively, regardless of the cumulative electron dose. For the electron beam irradiation and TEM observation, a Hitachi H-9000NAR transmission electron microscope was used. The conditions of electron beam irradiation were as follows: the accelerating voltage was 300 kV; the current density was $6.7\times10^5$ e$^-$/(nm$^2$·s); and the diameter of irradiation region was 230 nm.

In this manner, growth of the crystal part in the a-like OS is sometimes induced by electron irradiation. In contrast, in the nc-OS and the CAAC-OS, growth of the crystal part is hardly induced by electron irradiation. Therefore, the a-like OS has an unstable structure as compared with the nc-OS and the CAAC-OS.

The a-like OS has a lower density than the nc-OS and the CAAC-OS because it contains a void. Specifically, the density of the a-like OS is higher than or equal to 78.6% and lower than 92.3% of the density of the single crystal oxide semiconductor having the same composition. The density of each of the nc-OS and the CAAC-OS is higher than or equal to 92.3% and lower than 100% of the density of the single crystal oxide semiconductor having the same composition. Note that it is difficult to deposit an oxide semiconductor having a density of lower than 78% of the density of the single crystal oxide semiconductor.

For example, in the case of an oxide semiconductor having an atomic ratio of In:Ga:Zn=1:1:1, the density of single crystal InGaZnO$_4$ with a rhombohedral crystal structure is 6.357 g/cm$^3$. Accordingly, in the case of the oxide semiconductor having an atomic ratio of In:Ga:Zn=1:1:1, the density of the a-like OS is higher than or equal to 5.0 g/cm$^3$ and lower than 5.9 g/cm$^3$. For example, in the case of the oxide semiconductor having an atomic ratio of In:Ga:Zn=1:1:1, the density of each of the nc-OS and the CAAC-OS is higher than or equal to 5.9 g/cm$^3$ and lower than 6.3 g/cm$^3$.

Note that in the case where an oxide semiconductor having a certain composition does not exist in a single crystal structure, single crystal oxide semiconductors with different compositions are combined at an adequate ratio, which makes it possible to calculate density equivalent to that of a single crystal oxide semiconductor with the desired composition. The density of a single crystal oxide semiconductor having the desired composition can be calculated using a weighted average according to the combination ratio of the single crystal oxide semiconductors with different compositions. Note that it is preferable to use as few kinds of single crystal oxide semiconductors as possible to calculate the density.

As described above, oxide semiconductors have various structures and various properties. Note that an oxide semiconductor may be a stacked layer including two or more films of an amorphous oxide semiconductor, an a-like OS, an nc-OS, and a CAAC-OS, for example.

<Carrier Density of Oxide Semiconductor>

Next, the carrier density of an oxide semiconductor will be described below.

Examples of a factor affecting the carrier density of an oxide semiconductor include oxygen vacancies (V$_O$) and impurities in the oxide semiconductor.

As the amount of oxygen vacancies in the oxide semiconductor increases, the density of defect states increases when hydrogen is bonded to the oxygen vacancies (this state is also referred to as V$_O$H). The density of defect states also increases with an increase in the amount of impurities in the oxide semiconductor. Hence, the carrier density of an oxide semiconductor can be controlled by controlling the density of defect states in the oxide semiconductor.

A transistor using the oxide semiconductor in a channel region is described below.

The carrier density of the oxide semiconductor is preferably reduced in order to inhibit the negative shift of the threshold voltage of the transistor or reduce the off-state current of the transistor. In order to reduce the carrier density of the oxide semiconductor, the impurity concentration in the oxide semiconductor is reduced so that the density of defect states can be reduced. In this specification and the like, a state with a low impurity concentration and a low density of defect states is referred to as a highly purified intrinsic or substantially highly purified intrinsic state. The carrier density of a highly purified intrinsic oxide semiconductor is lower than $8\times10^{15}$ cm$^{-3}$, preferably lower than $1\times10^{11}$ cm$^{-3}$, and further preferably lower than $1\times10^{10}$ cm$^{-3}$ and is higher than or equal to $1\times10^{-9}$ cm$^{-3}$.

In contrast, the carrier density of the oxide semiconductor is preferably increased in order to improve the on-state current of the transistor or improve the field-effect mobility of the transistor. In order to increase the carrier density of the oxide semiconductor, the impurity concentration or the density of defect states in the oxide semiconductor is slightly increased. Alternatively, the bandgap of the oxide semiconductor is preferably narrowed. For example, an oxide semiconductor that has a slightly high impurity concentration or a slightly high density of defect states in the range where a favorable on/off ratio is obtained in the $I_d$-$V_g$ characteristics of the transistor can be regarded as substantially intrinsic. Furthermore, an oxide semiconductor that has a high electron affinity and thus has a narrow bandgap so as to increase the density of thermally excited electrons (carriers) can be regarded as substantially intrinsic. Note that a transistor using an oxide semiconductor with higher electron affinity has a lower threshold voltage.

The oxide semiconductor with an increased carrier density has somewhat n-type conductivity; thus, it can be referred to as a "slightly-n" oxide semiconductor.

The carrier density of a substantially intrinsic oxide semiconductor is preferably higher than or equal to $1\times10^5$ cm$^{-3}$ and lower than $1\times10^{18}$ cm$^{-3}$, further preferably higher than or equal to $1\times10^7$ cm$^{-3}$ and lower than or equal to $1\times10^{17}$ cm$^{-3}$, still further preferably higher than or equal to $1\times10^9$ cm$^{-3}$ and lower than or equal to $5\times10^{16}$ cm$^{-3}$, yet further preferably higher than or equal to $1\times10^{10}$ cm$^{-3}$ and lower than or equal to $1\times10^{16}$ cm$^{-3}$, and yet still preferably higher than or equal to $1\times10^{11}$ cm$^{-3}$ and lower than or equal to $1\times10^{15}$ cm$^{-3}$.

Figure 34:
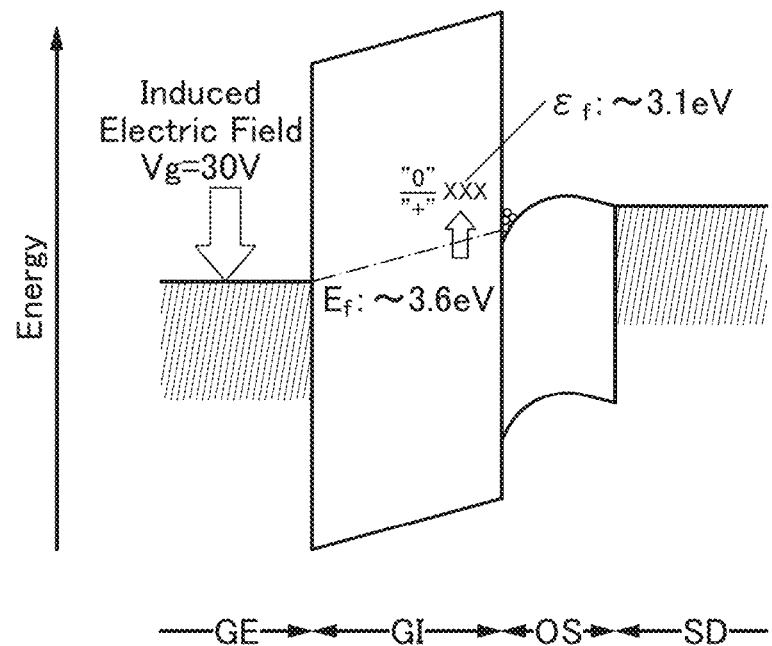
FIG. 34 is an energy band diagram of a transistor including an oxide semiconductor in a channel region.

The use of the substantially intrinsic oxide semiconductor may improve the reliability of a transistor. Here, the reason for the improvement in the reliability of a transistor which uses the oxide semiconductor in its channel region is described with reference to FIG. 34. FIG. 34 is an energy band diagram of a transistor which uses the oxide semiconductor in its channel region.

In FIG. 34, GE, GI, OS, and SD refer to a gate electrode, a gate insulating film, an oxide semiconductor, and a source/drain electrode, respectively. In other words, FIG. 34 shows an example of energy bands of the gate electrode, the gate insulating film, the oxide semiconductor, and the source/drain electrode in contact with the oxide semiconductor.

In FIG. 34, a silicon oxide film and an In—Ga—Zn oxide are used as the gate insulating film and the oxide semiconductor, respectively. The transition level ($\epsilon f$) of a defect that might be formed in the silicon oxide film is assumed to be formed at a position approximately 3.1 eV away from the conduction band minimum of the gate insulating film. Furthermore, the Fermi level (Ef) of the silicon oxide film at the interface between the oxide semiconductor and the silicon oxide film when the gate voltage (Vg) is 30 V is assumed to be formed at a position approximately 3.6 eV away from the conduction band minimum of the gate insulating film. Note that the Fermi level of the silicon oxide film changes depending on the gate voltage. For example, the Fermi level (Ef) of the silicon oxide film at the interface between the oxide semiconductor and the silicon oxide film is lowered as the gate voltage is increased. A white circle and x in FIG. 34 represent an electron (carrier) and a defect state in the silicon oxide film, respectively.

As shown in FIG. 34, when thermal excitation of carriers occurs during the application of a gate voltage, the carriers are trapped by the defect states (x in the diagram) and the charge state of the defect states is changed from positive ("+") to neutral ("0"). In other words, when the value obtained by adding the thermal excitation energy to the Fermi level (Ef) of the silicon oxide film becomes greater than the transition level ($\epsilon f$) of the defect, the charge state of the defect states in the silicon oxide film is changed from positive to neutral, so that the threshold voltage of the transistor shifts in the positive direction.

When an oxide semiconductor with a different electron affinity is used, the Fermi level of the interface between the gate insulating film and the oxide semiconductor might be changed. When an oxide semiconductor with a higher electron affinity is used, the conduction band minimum of the gate insulating film becomes relatively high at the interface between the gate insulating film and the oxide semiconductor or in the vicinity of the interface. In that case, the defect state (x in FIG. 34) which might be formed in the gate insulating film also becomes relatively high, so that the energy difference between the Fermi level of the gate insulating film and the Fermi level of the oxide semiconductor is increased. The increase in energy difference leads to a reduction in the amount of charge trapped in the gate insulating film. For example, a change in the charge state of the defect states which might be formed in the silicon oxide film becomes smaller, so that a change in the threshold voltage of the transistor by gate bias temperature (GBT) stress can be reduced.

This embodiment can be combined with any of the other embodiments as appropriate.

Embodiment 6

In this embodiment, examples of methods for forming the films described in the above embodiments are described.

The conductive layers such as the electrodes, the insulating layers, and the semiconductor layer in the above embodiments can be formed by a CVD method, an evaporation method, a sputtering method, or the like. The CVD method can be generally classified into a plasma CVD (PECVD) method using plasma, a thermal CVD (TCVD) method using heat, and the like. In addition, there is an atmospheric-pressure CVD (APCVD) method for performing deposition under an atmospheric pressure. Furthermore, the CVD method can be classified into a metal CVD (MCVD) method and a metal organic CVD (MOCVD) method according to a source gas.

Furthermore, the evaporation method can be typically classified into a resistance heating evaporation method, an electron beam evaporation method, a molecular beam epitaxy (MBE) method, a pulsed laser deposition (PLD) method, an ion beam assisted deposition (IAD) method, an atomic layer deposition (ALD) method, and the like.

By using the PECVD method, a high-quality film can be formed at a relatively low temperature. By using a deposition method that does not use plasma for deposition, such as the MOCVD method or the evaporation method, a film can be formed with few defects because damage is not easily caused on a surface on which the film is deposited.

A sputtering method is typically classified into a DC sputtering method, a magnetron sputtering method, an RF sputtering method, an ion beam sputtering method, an electron cyclotron resonance (ECR) sputtering method, a facing-target sputtering method, and the like.

In the facing-target sputtering method, plasma is confined between the targets; thus, plasma damage to a substrate can be reduced. Further, step coverage can be improved because an incident angle of a sputtered particle to the substrate can be made smaller depending on the inclination of the target.

Unlike in a deposition method in which particles released from a target or the like are deposited, in a CVD method and an ALD method, a film is formed by a reaction at a surface of an object. Thus, a CVD method and an ALD method enable favorable step coverage almost regardless of the shape of an object. In particular, an ALD method enables excellent step coverage and excellent thickness uniformity and can be favorably used to cover a surface of an opening with a high aspect ratio, for example. However, an ALD method has a relatively low deposition rate; thus, it is sometimes preferable to combine an ALD method with another deposition method with a high deposition rate, such as a CVD method.

When a CVD method or an ALD method is used, composition of a film to be formed can be controlled with a flow rate ratio of the source gases. For example, by the CVD method or the ALD method, a film with a desired composition can be formed by adjusting the flow ratio of a source gas. Moreover, with a CVD method or an ALD method, by changing the flow rate ratio of the source gases while forming the film, a film whose composition is continuously changed can be formed. In the case where the film is formed while changing the flow rate ratio of the source gases, as compared with the case where the film is formed using a plurality of deposition chambers, time taken for the deposition can be reduced because time taken for transfer and pressure adjustment is omitted. Thus, transistors or semiconductor devices can be manufactured with improved productivity.

This embodiment can be combined with any of the other embodiments as appropriate.

Embodiment 7

In this embodiment, application examples of the semiconductor device described in the foregoing embodiment to an electronic component and to an electronic device including the electronic component are described with reference to FIGS. 27A and 27B and FIGS. 28A to 28F.

<Electronic Component>

Figure 27A:
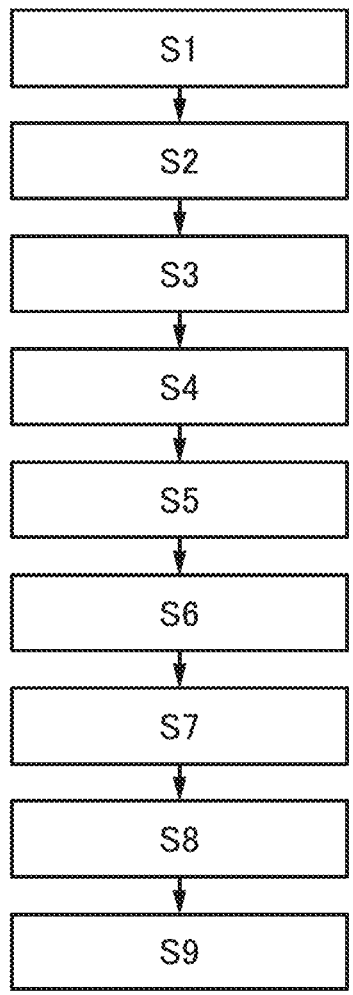
FIG. 27A is a flow chart illustrating an electronic component.

FIG. 27A shows an example where the semiconductor device described in the foregoing embodiment is used to make an electronic component. Note that an electronic component is also referred to as semiconductor package or IC package. This electronic component has various standards and names depending on the direction and the shape of terminals. Therefore, an example of the electronic component is described in this embodiment.

A semiconductor device including the transistors in the foregoing embodiment is completed by integrating detachable components on a printed circuit board through an assembly process (post-process).

The post-process can be completed through steps shown in FIG. 27A. Specifically, after an element substrate obtained in the preceding process is completed (Step S1), a back surface of the substrate is ground (Step S2). The substrate is thinned in this step to reduce warpage or the like of the substrate in the preceding process and to reduce the size of the component itself.

After the back surface of the substrate is ground, a dicing step is performed to divide the substrate into a plurality of chips is performed. Then, a die bonding step of individually picking up separate chips to be mounted on and bonded to a lead frame is performed (Step S3). In this die bonding step, the chip is bonded to the lead frame by an appropriate method depending on a product, for example, bonding with a resin or a tape. Note that in the die bonding step, the chip may be mounted on and bonded to an interposer.

Note that in this embodiment, when an element is formed on one surface of a substrate, the other surface is referred to as a back surface (a surface on which the element is not formed).

Next, wire bonding for electrically connecting a lead of the lead frame and an electrode on the chip through a metal wire is performed (Step S4). As the metal wire, a silver wire or a gold wire can be used. For wire bonding, ball bonding or wedge bonding can be employed.

A molding step is performed to seal the wire-bonded chip with an epoxy resin or the like (Step S5). With the molding step, the inside of the electronic component is filled with a resin, thereby reducing damage to the circuit portion and the wire embedded in the component caused by external mechanical force as well as reducing deterioration of characteristics due to moisture or dust.

Subsequently, the lead of the lead frame is plated. After being plated, the lead of the lead frame is cut and processed into a predetermined shape (Step S6). The plating process prevents rust of the lead and facilitates soldering at the time of mounting on a printed circuit board in a later step.

Printing (marking) is performed on the package surface (Step S7). After a final testing step (Step S8), the electronic component is completed (Step S9).

Since the electronic component described above can include the semiconductor device described in the foregoing embodiment, it is possible to improve the reliability of the electronic component.

Figure 27B:
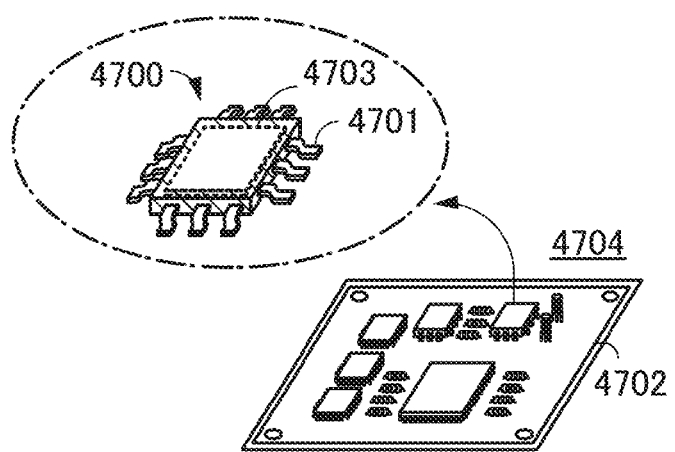
FIG. 27B is a perspective view of the electronic component.

FIG. 27B is a perspective schematic diagram of a completed electronic component. FIG. 27B shows a perspective schematic diagram of a quad flat package (QFP) as an example of the electronic component. An electronic component 4700 in FIG. 27B includes a lead 4701 and a circuit portion 4703. The electronic component 4700 in FIG. 27B is, for example, mounted on a printed circuit board 4702. A plurality of electronic components 4700 which are combined and electrically connected to each other over the printed circuit board 4702 can be mounted on an electronic device. A completed circuit board 4704 is provided in an electronic device or the like.

<Electronic Device>

Described next are electronic devices including the aforementioned electronic component.

The semiconductor device of one embodiment of the present invention can be used for display devices, personal computers, or image reproducing devices provided with recording media (typically, devices which reproduce the content of recording media such as digital versatile discs (DVDs) and have displays for displaying the reproduced images). Other examples of electronic devices that can be equipped with the semiconductor device of one embodiment of the present invention are cellular phones, game machines including portable game machines, portable information terminals, e-book readers, cameras such as video cameras and digital still cameras, goggle-type displays (head mounted displays), navigation systems, audio reproducing devices (e.g., car audio players and digital audio players), copiers, facsimiles, printers, multifunction printers, automated teller machines (ATM), vending machines, and medical devices. FIGS. 28A to 28F illustrate specific examples of these electronic devices.

Figure 28A:
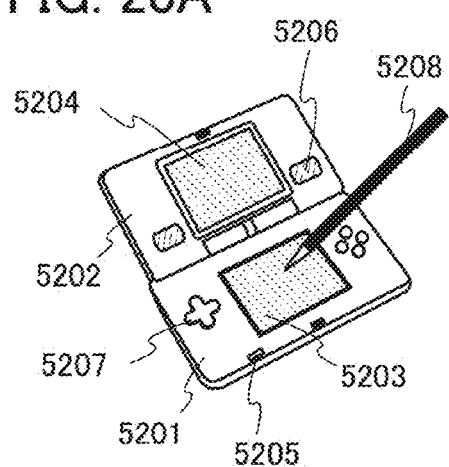
FIGS. 28A to 28F illustrate structural examples of an electronic device.

FIG. 28A illustrates a portable game machine, which includes a housing 5201, a housing 5202, a display portion 5203, a display portion 5204, a microphone 5205, a speaker 5206, an operation key 5207, a stylus 5208, and the like. The semiconductor device of one embodiment of the present invention can be used for a variety of integrated circuits included in portable game machines. Although the portable game machine in FIG. 28A has the two display portions 5203 and 5204, the number of display portions included in a portable game machine is not limited to this.

Figure 28B:
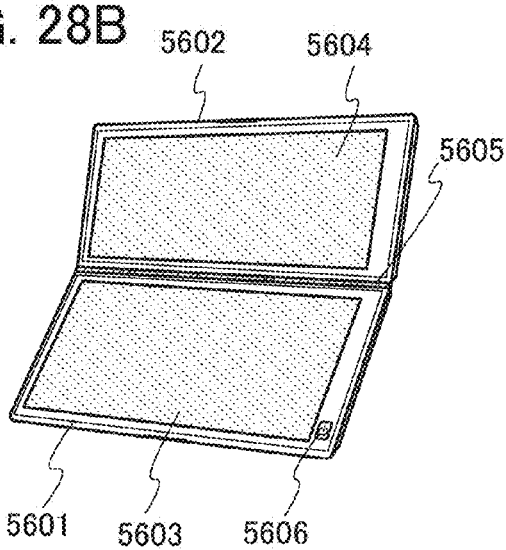

FIG. 28B illustrates a portable information terminal, which includes a first housing 5601, a second housing 5602, a first display portion 5603, a second display portion 5604, a joint 5605, an operation key 5606, and the like. The semiconductor device of one embodiment of the present invention can be used for a variety of integrated circuits included in portable information terminals. The first display portion 5603 is provided in the first housing 5601, and the second display portion 5604 is provided in the second housing 5602. The first housing 5601 and the second housing 5602 are connected to each other with the joint 5605, and the angle between the first housing 5601 and the second housing 5602 can be changed with the joint 5605. Images displayed on the first display portion 5603 may be switched in accordance with the angle at the joint 5605 between the first housing 5601 and the second housing 5602. A display device with a position input function may be used as at least one of the first display portion 5603 and the second display portion 5604. Note that the position input function can be added by providing a touch panel in a display device. Alternatively, the position input function can be added by provision of a photoelectric conversion element called a photosensor in a pixel portion of a display device.

Figure 28C:
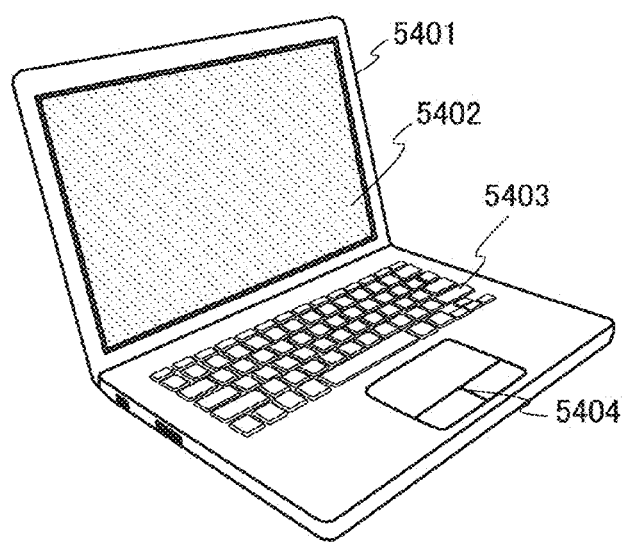

FIG. 28C illustrates a notebook type personal computer, which includes a housing 5401, a display portion 5402, a keyboard 5403, a pointing device 5404, and the like. The semiconductor device of one embodiment of the present invention can be used for a variety of integrated circuits included in notebook type personal computers.

Figure 28D:
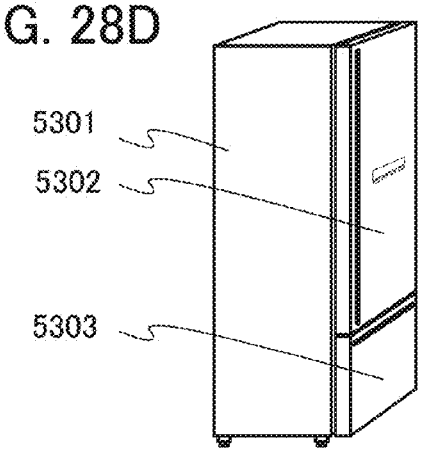

FIG. 28D illustrates an electric refrigerator-freezer, which includes a housing 5301, a refrigerator door 5302, a freezer door 5303, and the like. The semiconductor device of one embodiment of the present invention can be used for a variety of integrated circuits included in electric refrigerator-freezers.

Figure 28E:
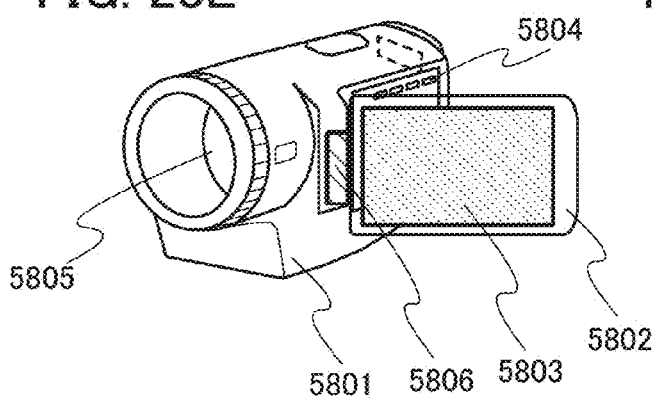

FIG. 28E illustrates a video camera, which includes a first housing 5801, a second housing 5802, a display portion 5803, operation keys 5804, a lens 5805, a joint 5806, and the like. The semiconductor device of one embodiment of the present invention can be used for a variety of integrated circuits included in video cameras. The operation keys 5804 and the lens 5805 are provided in the first housing 5801, and the display portion 5803 is provided in the second housing 5802. The first housing 5801 and the second housing 5802 are connected to each other with the joint 5806, and the angle between the first housing 5801 and the second housing 5802 can be changed with the joint 5806. Images displayed on the display portion 5803 may be switched in accordance with the angle at the joint 5806 between the first housing 5801 and the second housing 5802.

Figure 28F:
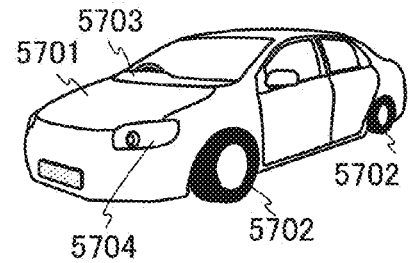

FIG. 28F illustrates a passenger car, which includes a car body 5701, wheels 5702, a dashboard 5703, lights 5704, and the like. The semiconductor device of one embodiment of the present invention can be used for a variety of integrated circuits included in passenger cars.

This embodiment can be combined with any of the other embodiments as appropriate.

Example 1

In this example, the measured results of the characteristics of memory circuits including an OS transistor are described.

A possible error in a memory circuit is a soft error due to the entry of radiation. The soft error is a phenomenon in which a malfunction such as inversion of data stored in a memory is caused by electron-hole pair generation when a transistor is irradiated with a rays emitted from a material of a memory or a package or the like, secondary cosmic ray neutrons generated by nuclear reaction of primary cosmic rays entering the Earth's atmosphere from outer space with nuclei of atoms existing in the atmosphere, or the like. In this example, the soft-error tolerance of a memory circuit including an OS transistor was evaluated with radiation irradiation.

Figure 35A:
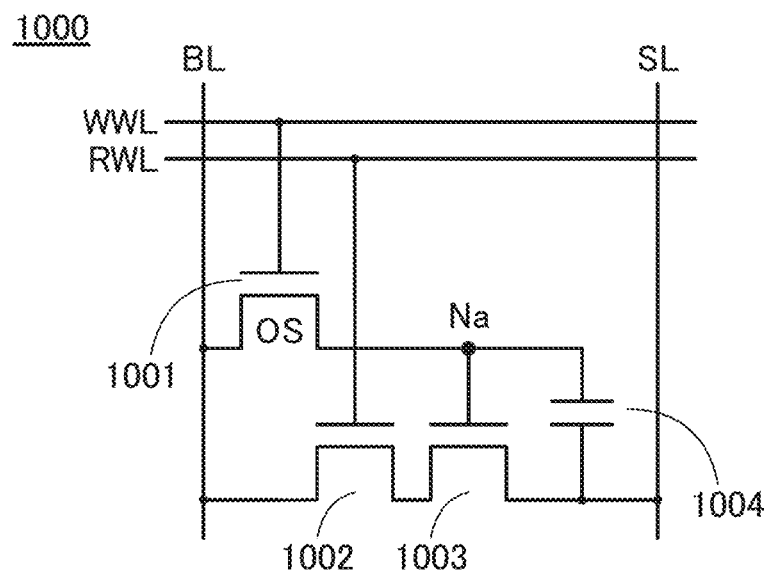
FIGS. 35A and 35B illustrate structure examples of a memory circuit.
Figure 35B:
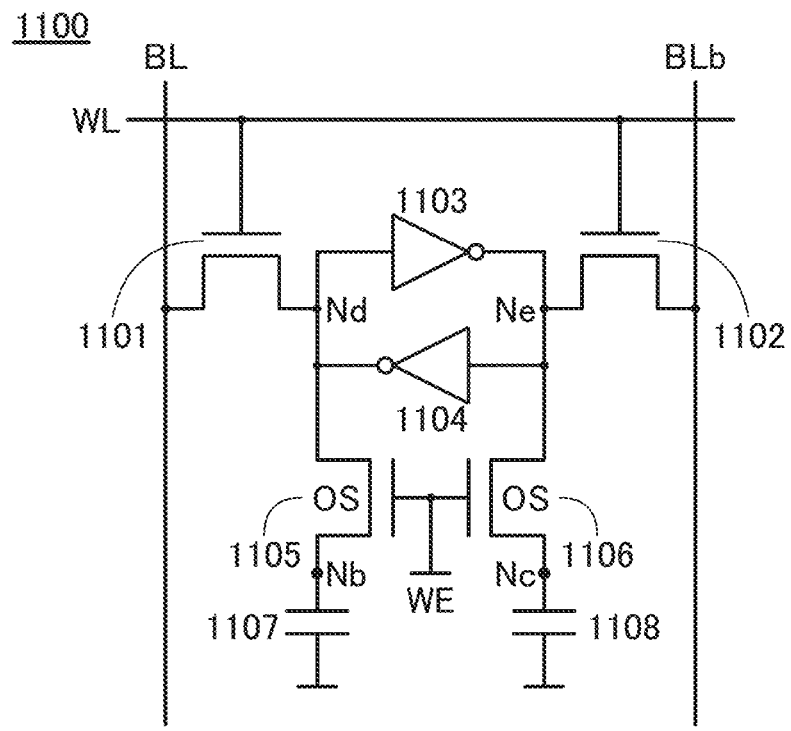

A memory circuit including 8192 circuits 1000 illustrated in FIG. 35A and a memory circuit including 8192 circuits 1100 illustrated in FIG. 35B were used in the measurement.

The circuit 1000 illustrated in FIG. 35A includes transistors 1001, 1002, and 1003 and a capacitor 1004. The circuit 1000 corresponds to a variation of the circuit 310 illustrated in FIG. 11A.

The circuit 1100 illustrated in FIG. 35B includes transistors 1101 and 1102, inverters 1103 and 1104, transistors 1105 and 1106, and capacitors 1107 and 1108. The circuit 1100 corresponds to the memory circuit 500 illustrated in FIG. 14.

In the circuit 1000 illustrated in FIG. 35A, the capacitance of the capacitor 1004 is 6.7 fF, the transistors 1002 and 1003 are Si transistors with a channel length of 0.35 μm, and the transistor 1001 is an OS transistor with a channel length of 0.8 μm. In the circuit 1100 illustrated in FIG. 35B, the capacitance of the capacitors 1107 and 1108 is 30 fF, the transistors 1101 and 1102 and the inverters 1103 and 1104 are Si transistors with a channel length of 0.35 μm, and the transistors 1105 and 1106 are OS transistors with a channel length of 0.8 μm. An SOI substrate was used for the Si transistors.

The soft-error tolerances of memory circuits 1 to 3 including the above-described circuits were evaluated by irradiating the memory circuits with radiation and measuring the data retention characteristics thereof at that time. The memory circuit 1 is in a state where data is retained at a node Na of the circuit 1000 illustrated in FIG. 35A. The memory circuit 2 is in a state where data is retained at nodes Nb and Nc of the circuit 1100 illustrated in FIG. 35B. The memory circuit 3 is in a state where data is retained at nodes Nd and Ne of the circuit 1100 illustrated in FIG. 35B. Two samples (samples A and B) of each of the memory circuits 1 to 3 were subjected to measurement. A radiation source of the radiation for the memory circuits 1 to 3 is an α-ray source using americium (Am) having a mass number of 241, and the distance between the radiation source and the sample was set to 1 mm. In tests, the number of circuits 1000 or 1100 where retained data was varied by radiation irradiation was counted as the number of soft errors. Table 1 shows the test results.

TABLE 1

| | | Test No. | | |
|---|---|---|---|---|
| | | 1 | 2 | 3 |
| Test conditions | Power supply voltage | 2 V | Minimum operating voltage | Minimum operating voltage |
| | Distance to radiation source | 1 mm | 1 mm | 1 mm |
| | Retention time | 5 min | 5 min | 20 min |
| Memory circuit 1 | Number of soft errors (A) | 0 | 0 | — |
| | Number of soft errors (B) | 0 | 0 | — |
| Memory circuit 2 | Number of soft errors (A) | 0 | 0 | 0 |
| | Number of soft errors (B) | 0 | 0 | 0 |
| Memory circuit 3 | Number of soft errors (A) | 0 | 1 | 5 |
| | Number of soft errors (B) | 0 | 1 | 2 |

The tests were conducted under three kinds of conditions (tests 1 to 3). Through the test 1 in which the memory circuits had a power supply voltage of 2 V and retained data for five minutes in the state of being irradiated with radiation, no soft errors occurred in any of the samples.

Next, the test 2 was conducted by changing the operating voltage to the lowest voltage at which the memory circuits can operate (the minimum operating voltage) of less than 2 V. As a result, a soft error was observed in each of the samples A and B of the memory circuit 3. That is, a soft error occurred in the SRAM cell portion in FIG. 35B. Furthermore, no soft errors were observed in the memory circuits 1 and 2 where data was retained with the use of the OS transistor(s).

Next, the test 3 was conducted by extending the data retention time to 20 minutes while keeping the operating voltage at the minimum operating voltage. As a result, the number of soft errors increased in the memory circuit 3. In contrast, in the memory circuit 2 where data was retained with the use of the OS transistors, no soft errors were observed and data was retained correctly even though the retention time was extended and the amount of radiation irradiation was increased.

The results of the tests 1 to 3 show that the circuit 1000 illustrated in FIG. 35A has a high soft-error tolerance. In addition, in the circuit 1100 illustrated in FIG. 35B, the occurrence of soft errors can be reduced when data stored in the nodes Nd and Ne is temporarily stored in the nodes Nb and Nc. That is, the soft-error tolerance of an SRAM cell can be improved by backup using OS transistors.

The above-described results have proved that a memory circuit including an OS transistor has a high soft-error tolerance. Therefore, a highly reliable PLD can be obtained by using an OS transistor in a configuration memory.

Example 2

Next, the results of a different measurement of the memory circuits including an OS transistor are described.

A memory circuit including the circuits 1000 illustrated in FIG. 35A for 8 kbits (32 bits×256 addresses) and a memory circuit including the circuits 1100 illustrated in FIG. 35B for 8 kbits (32 bits×256 addresses) were used in the measurement.

In the circuit 1000 illustrated in FIG. 35A, the capacitance of the capacitor 1004 is 5.34 fF, the transistors 1002 and 1003 are Si transistors with a channel length of 0.35 μm, and the transistor 1001 is an OS transistor with a channel length of 0.8 μm. In the circuit 1100 illustrated in FIG. 35B, the capacitance of the capacitors 1107 and 1108 is 30 fF, the transistors 1101 and 1102 and the inverters 1103 and 1104 are Si transistors with a channel length of 0.35 μm, and the transistors 1105 and 1106 are OS transistors with a channel length of 0.8 μm. An SOI substrate was used for the Si transistors.

The soft-error tolerances of memory circuits 4 to 6 including the above-described circuits were evaluated by irradiating the memory circuits with radiation and measuring the data retention characteristics thereof at that time. The memory circuit 4 is in a state where data is retained at the node Na of the circuit 1000 illustrated in FIG. 35A. The memory circuit 5 is in a state where data is retained at the nodes Nb and Nc of the circuit 1100 illustrated in FIG. 35B. The memory circuit 6 is in a state where data is retained at the nodes Nd and Ne of the circuit 1100 illustrated in FIG. 35B. The power supply voltage of the memory circuits was 1.5 V. A radiation source of the radiation for the memory circuits 4 to 6 is an α-ray source using americium (Am) having a mass number of 241, and the distance between the radiation source and the sample was set to 1 mm. In tests, the number of circuits 1000 or 1100 where retained data was varied by radiation irradiation for 5 minutes, 10 minutes, or 20 minutes was counted as the number of soft errors. Table 2 shows the test results.

TABLE 2

| Retention time | Test No. | Memory circuit 4 | Memory circuit 5 | Memory circuit 6 |
|---|---|---|---|---|
| 5 min | 1 | 0 | 0 | 1 |
|  | 2 | 0 | 0 | 1 |
|  | 3 | 0 | — | 1 |
|  | 4 | — | — | 1 |
| 10 min | 5 | 0 | — | — |
|  | 6 | 0 | — | — |
|  | 7 | 0 | — | — |
| 20 min | 8 | 0 | 0 | 3 |
|  | 9 | — | 0 | 2 |
|  | 10 | — | — | 5 |

In the case where the retention time (the time for radiation irradiation) was 5 minutes, a soft error was observed in the memory circuit 6. That is, a soft error occurred in the SRAM cell portion in FIG. 35B. Furthermore, no soft errors were observed in the memory circuits 4 and 5 where data was retained with the use of the OS transistor(s).

In the case where the retention time was 10 minutes, no soft errors were observed in the memory circuit 4.

In the case where the retention time was 20 minutes, the number of soft errors increased in the memory circuit 6. In contrast, in the memory circuit 5 where data was retained with the use of the OS transistors, no soft errors were observed and data was retained correctly even though the retention time was extended and the amount of radiation irradiation was increased.

Although not shown in Table 2, measurement was also conducted under conditions where the power supply voltage of the memory circuits was 2.0 V and the retention time was 5 minutes. In these conditions, no soft errors were observed in any of the memory circuits 4 to 6.

Figure 36A:
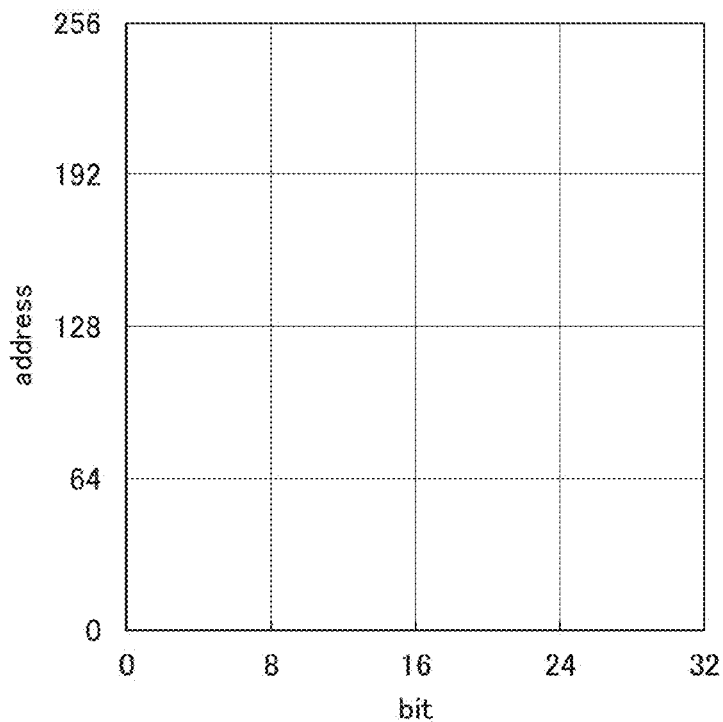
FIGS. 36A and 36B are error maps showing the soft error position.
Figure 36B:
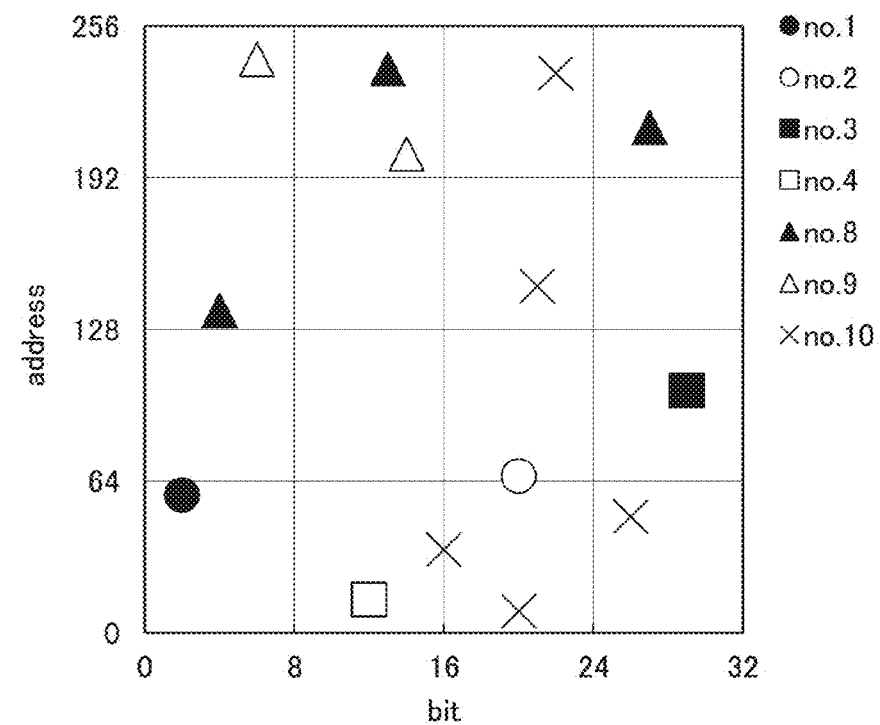

FIGS. 36A and 36B are error maps showing the soft error positions in the memory circuit 4 and the memory circuit 6, respectively.

The results in Table 2 and FIGS. 36A and 36B show that the circuit 1000 illustrated in FIG. 35A has a high soft-error tolerance. In addition, in the circuit 1100 illustrated in FIG. 35B, the occurrence of soft errors can be reduced when data stored in the nodes Nd and Ne is temporarily stored in the nodes Nb and Nc. That is, the soft-error tolerance of an SRAM cell can be improved by backup using OS transistors.

The above-described results have proved that a memory circuit including an OS transistor has a high soft-error tolerance. Therefore, a highly reliable PLD can be obtained by using an OS transistor in a configuration memory.

Figure 37:
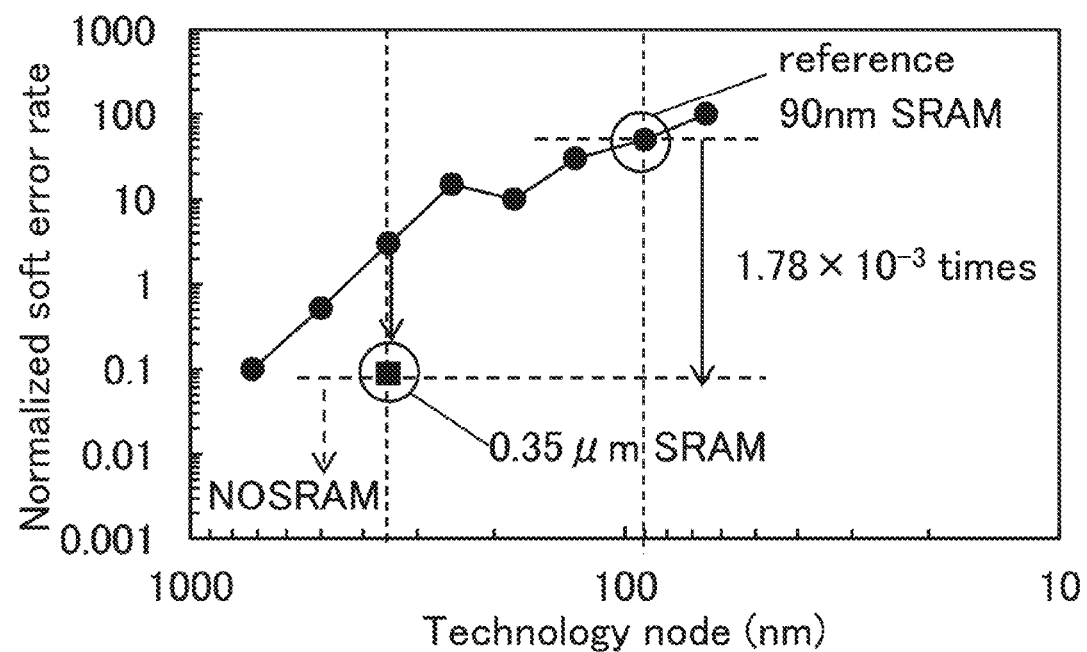
FIG. 37 is a graph showing a relation between the soft error rate (SER) and the technology node.

FIG. 37 shows relationships between the soft error rate (SER) and the technology node of a 16-Mbit SRAM and a 0.35-μm 8-kbit SRAM. The relationships between SER and the technology node of the 16-Mbit SRAM are disclosed in "R. C. Baumann, IEEE Transactions on Device and Materials Reliability, Vol. 5, No. 3, pp. 305-316, 2005". In FIG. 37, "0.35-μm SRAM" corresponds to the memory circuit illustrated in FIG. 35B, and "NOSRAM" corresponds to the memory circuit illustrated in FIG. 35A. SER refers to the value calculated based on the experimental results of the memory circuit 6 shown in Table 2. Note that SER in FIG. 37 is the normalized value.

The reference 90-nm 16-Mbit SRAM has an SER of $7.20 \times 10^8$ bits/Mbit/hour, while the 0.35-μm 8-kbit SRAM has an SER of $1.28 \times 10^6$ bits/Mbit/hour. That is, the SER of the 0.35-μm 8-kbit SRAM is $1.78 \times 10^{-3}$ times that of the 90-nm 16-Mbit SRAM.

Although soft errors were not observed in the circuit 1000 illustrated in FIG. 35A (the memory circuit 4), it is suggested that the SER of the circuit 1000 is lower than the SER of the 0.35-μm 8-kbit SRAM.

The capacitance Cm, the inverted potential Vi, the critical charge Qcrit, and the circuit area A where electron-hole pairs are generated by α-ray collision of the memory circuits 4 and 6 are shown in Table 3. Here, the capacitance Cm represents the capacitance of the node Na or the capacitance of the nodes Nd and Ne. The inverted potential Vi represents the potential of the node Na in the case where the logic of the data held at the node Na is inverted or the potential of the nodes Nd and Ne in the case where the logic of the data held at the nodes Nd and Ne is inverted. The critical charge Qcrit represents the charge necessary for inverting the logic of the data held at the node Na or the charge necessary for inverting the logic of the data held at the nodes Nd and Ne.

TABLE 3

|  | Memory circuit 4 | Memory circuit 6 |
|---|---|---|
| Capacitance Cm (fF) | 5.34 | 5.80 |
| Inverted potential Vi (V) | 0.50 | 0.75 |
| Critical charge Qcrit = Cm × Vi (fC) | 2.67 | 4.35 |
| Circuit area A (cm$^2$) | $1.76 \times 10^{-8}$ | $3.20 \times 10^{-8}$ |

SER can be expressed by the following formula. Here, Qs represents the charge-collection efficiency of the device.

$$SER \propto A \times \exp(-Qcrit/Qs) \quad \text{[Formula 1]}$$

According to FIGS. 36A and 36B, FIG. 37, and Table 3, there seems to be a larger difference in SER between the memory circuit 4 and the memory circuit 6 than the difference in circuit area A or critical charge Qcrit therebetween. It is indicated by the above formula that the charge-collection efficiency Qs of the memory circuit 4 is lower than that of the memory circuit 6.

This application is based on Japanese Patent Application serial no. 2015-257549 filed with Japan Patent Office on Dec. 29, 2015, and Japanese Patent Application serial no. 2016-011245 filed with Japan Patent Office on Jan. 25, 2016, the entire contents of which are hereby incorporated by reference.

What is claimed is:

1. A semiconductor device comprising:
   a first circuit;
   a second circuit; and
   a third circuit,
   wherein the first circuit is configured to perform a computation,
   wherein the second circuit is configured to change a circuit configuration by changing configuration data,
   wherein the third circuit comprises a plurality of memory regions,
   wherein each of the plurality of memory regions is configured to store a set of configuration data to be stored in the second circuit,
   wherein the first circuit is configured to make the set of configuration data stored in any of the plurality of memory regions stored in the second circuit,
   wherein the semiconductor device comprises a plurality of the first circuits and a plurality of the second circuits,
   wherein the plurality of the first circuits are electrically connected to each other through a first link,
   wherein the plurality of the second circuits are electrically connected to each other through a second link, and
   wherein the plurality of the second circuits form a pipeline through the second link.

2. The semiconductor device according to claim 1,
   wherein the second circuit comprises a first context and a second context, and
   wherein the first circuit is configured to reconfigure the second context in a period when the first context executes a task.

3. A computer comprising the semiconductor device according to claim 1,
   wherein the computer comprises an input device and an output device.

4. An electronic device comprising the semiconductor device according to claim 1,
   wherein the electronic device comprises a display portion, a microphone, a speaker, or an operation key.

5. A semiconductor device comprising:
   a first circuit;
   a second circuit;
   a third circuit;
   a fourth circuit; and
   a fifth circuit,
   wherein the first circuit is configured to perform a computation,
   wherein the second circuit is configured to change a circuit configuration by changing configuration data,
   wherein the third circuit comprises a plurality of memory regions,
   wherein each of the plurality of memory regions is configured to store a set of configuration data to be stored in the second circuit,
   wherein the fourth circuit is configured to store data used for processing in the first circuit,
   wherein the fifth circuit is configured to store first data for selecting a context of the second circuit that executes a task and second data for selecting any of the plurality of memory regions, and
   wherein the first circuit is configured to make the set of configuration data stored in any of the plurality of memory regions stored in the second circuit when the second data is stored in the fifth circuit,
   wherein the semiconductor device comprises a plurality of the first circuits and a plurality of the second circuits,
   wherein the plurality of the first circuits are electrically connected to each other through a first link,
   wherein the plurality of the second circuits are electrically connected to each other through a second link, and
   wherein the plurality of the second circuits form a pipeline through the second link.

6. The semiconductor device according to claim 5,
   wherein the second circuit comprises a first context and a second context, and
   wherein the first circuit is configured to reconfigure the second context in a period when the first context executes a task.

7. The semiconductor device according to claim 5,
   wherein the second circuit comprises a first transistor, a second transistor, and a capacitor,
   wherein one of a source and a drain of the first transistor is electrically connected to a gate of the second transistor and the capacitor,
   wherein the first transistor is located over the second transistor, and
   wherein the first transistor comprises an oxide semiconductor in its channel formation region.

8. A computer comprising the semiconductor device according to claim 5,
   wherein the computer comprises an input device and an output device.

9. An electronic device comprising the semiconductor device according to claim 5,
   wherein the electronic device comprises a display portion, a microphone, a speaker, or an operation key.

10. A semiconductor device comprising:
    a first circuit;
    a second circuit; and
    a third circuit,
    wherein the first circuit is configured to perform a computation,
    wherein the second circuit is configured to change a circuit configuration by changing configuration data,
    wherein the third circuit comprises a plurality of memory regions,
    wherein each of the plurality of memory regions is configured to store a set of configuration data to be stored in the second circuit,
    wherein the first circuit is configured to make the set of configuration data stored in any of the plurality of memory regions stored in the second circuit,
    wherein the second circuit comprises a first transistor, a second transistor, and a capacitor, wherein one of a source and a drain of the first transistor is electrically connected to a gate of the second transistor and the capacitor, wherein the first transistor is located over the second transistor, and wherein the first transistor comprises an oxide semiconductor in its channel formation region.

11. The semiconductor device according to claim 10, wherein the second circuit comprises a first context and a second context, and wherein the first circuit is configured to reconfigure the second context in a period when the first context executes a task.

12. A computer comprising the semiconductor device according to claim 10, wherein the computer comprises an input device and an output device.

13. An electronic device comprising the semiconductor device according to claim 10, wherein the electronic device comprises a display portion, a microphone, a speaker, or an operation key.

* * * * *